United States Patent
Joglekar et al.

(10) Patent No.: US 11,952,679 B2
(45) Date of Patent: Apr. 9, 2024

(54) OPTIMIZED GROWTH OF STABLE HYBRID PEROVSKITE MATERIALS FOR ELECTROMAGNETIC AND PARTICLE RADIATION DETECTION

(71) Applicant: THE REGENTS OF THE UNIVERSITY OF MICHIGAN, Ann Arbor, MI (US)

(72) Inventors: Suneel Joglekar, Ann Arbor, MI (US); Lingjie Jay Guo, Ann Arbor, MI (US); Mark David Hammig, Dexter, MI (US)

(73) Assignee: THE REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 883 days.

(21) Appl. No.: 17/006,298

(22) Filed: Aug. 28, 2020

(65) Prior Publication Data
US 2021/0062364 A1 Mar. 4, 2021

Related U.S. Application Data

(60) Provisional application No. 62/894,398, filed on Aug. 30, 2019.

(51) Int. Cl.
| | |
|---|---|
| *C30B 29/54* | (2006.01) |
| *C07F 7/24* | (2006.01) |
| *C30B 7/08* | (2006.01) |
| *C30B 7/14* | (2006.01) |

(Continued)

(52) U.S. Cl.
CPC ............. *C30B 29/54* (2013.01); *C07F 7/24* (2013.01); *C30B 7/08* (2013.01); *C30B 7/14* (2013.01); *H01G 9/2009* (2013.01); *H10K 85/30* (2023.02)

(58) Field of Classification Search
CPC ... C30B 29/54; C30B 7/08; C30B 7/14; C07F 7/24; H10K 85/30; H01G 9/2009
See application file for complete search history.

(56) References Cited

U.S. PATENT DOCUMENTS

| | | | |
|---|---|---|---|
| 10,557,210 B2 * | 2/2020 | Kinlen | C25D 11/08 |
| 10,883,193 B2 * | 1/2021 | Wei | C30B 33/02 |
| 11,572,635 B2 * | 2/2023 | Xu | C30B 25/16 |

OTHER PUBLICATIONS

Aharon, Sigalit et al., "Two Dimensional Organometal Halide Perovskite Nanorods with Tunable Optical Properties," Nano Lett. (2016), 16, 5, pp. 33230-3235; DOI: 10.1021/acs.nanolett.6b00665 (Published online: Apr. 18, 2016).

(Continued)

*Primary Examiner* — Robert M Kunemund
(74) *Attorney, Agent, or Firm* — Harness, Dickey & Pierce, P.L.C.

(57) ABSTRACT

Inverse temperature crystallization processes are provided to produce perovskite single crystals (PSCs), as well as surface passivation techniques for producing stabilizing the PSCs in the bulk region. Stable hybrid perovskite material include a bulk region comprising a single crystal perovskite material having a first bandgap and a smooth perovskite surface layer having a second bandgap greater than the first bandgap. Devices for detection and energy conversion are also contemplated, including for spectroscopic photon and elementary particle detection, such as radiation detectors. Crystallization chambers for forming the PSCs are also provided.

20 Claims, 28 Drawing Sheets

(51) Int. Cl.
H01G 9/20 (2006.01)
H10K 85/30 (2023.01)

(56) References Cited

OTHER PUBLICATIONS

Liu, Yucheng et al., "Two-Inch-Sized Perovskite CH3NH3PbX3 (X=Cl, Br, I) Crystals: Growth and Characterization," Adv. Mater. 27 (2015), pp. 5176-5183; DOI: 10.1002/adma.201502597.
Nazarenko, Olga et al., "Single crystal of caesium formamidinium lead halide perovskites: solution growth and gamma dosimetry," NPG Asia Materials (2017), 9, e373; DOI: 10.1038/am.2017.45 (Published online: Apr. 14, 2017).
Saidaminov, Makhsud I., "High-quality bulk hybrid perovskite single crystals within minutes by inverse temperature crystallization," Nature Communications, 6:7586; (Published: Jul. 6, 2015) DOI: 10.1038/ncomms8586.
Wei, Haotong et al., "Dopant compensation in alloyes CH3NH3PbBr3-xClx perovskite single crystals for gamma-ray spectroscopy," Nature Materials (2017), 16, pp. 826-833; DOI: 10.1038/nmat4927 (Published: Jul. 3, 2017).
Yip, Hin-Lap et al., "Recent advances in solution-processed interfacial materials for efficient and stable polymer solar cells," Energy Environ. Sci., 2012, 5, pp. 5994-6011; DOI: 10.1039/c2ee02806a.

* cited by examiner

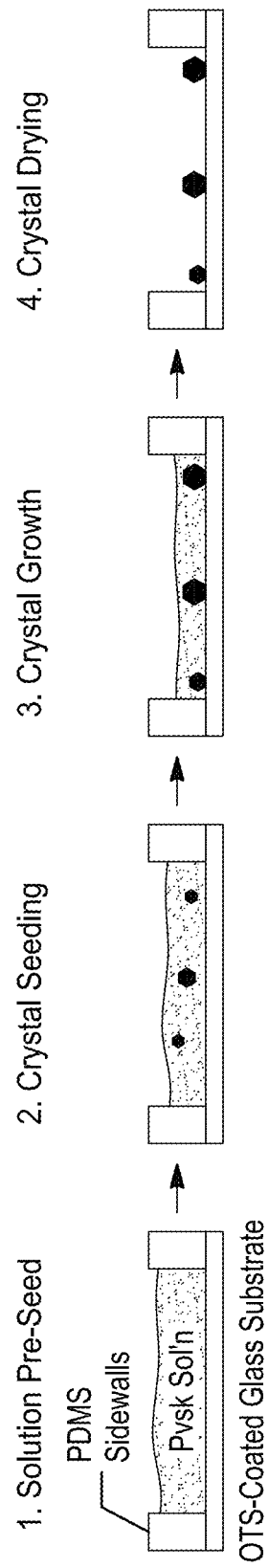
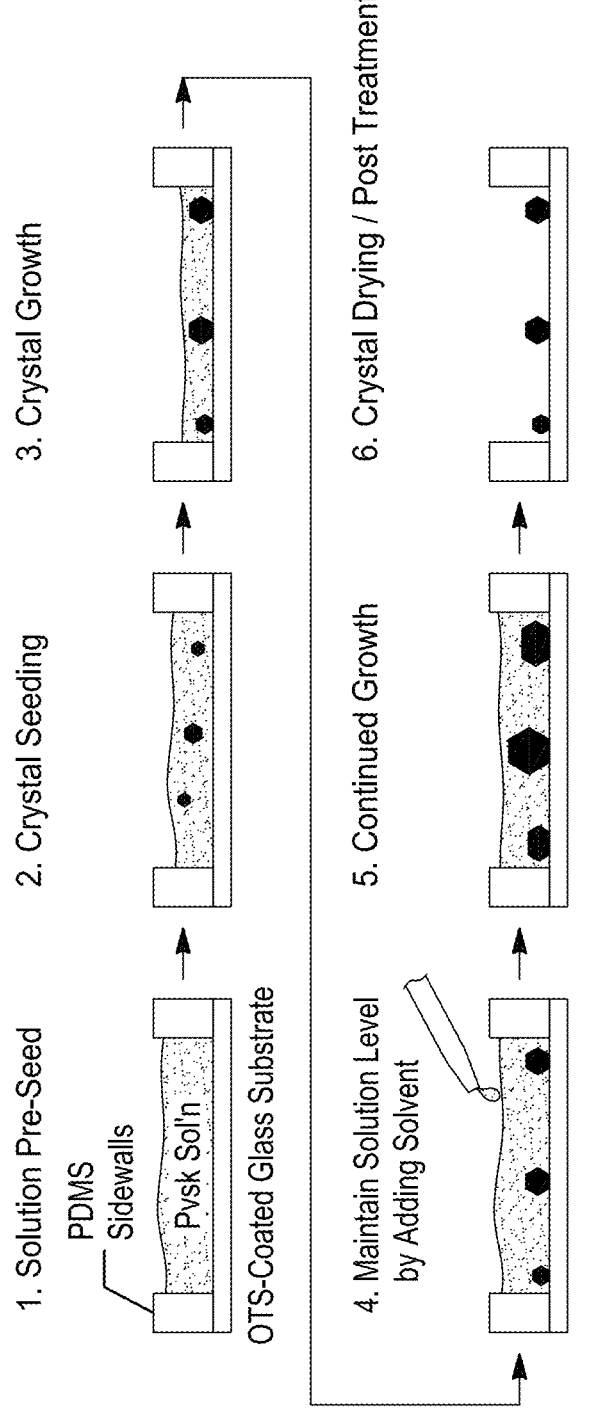

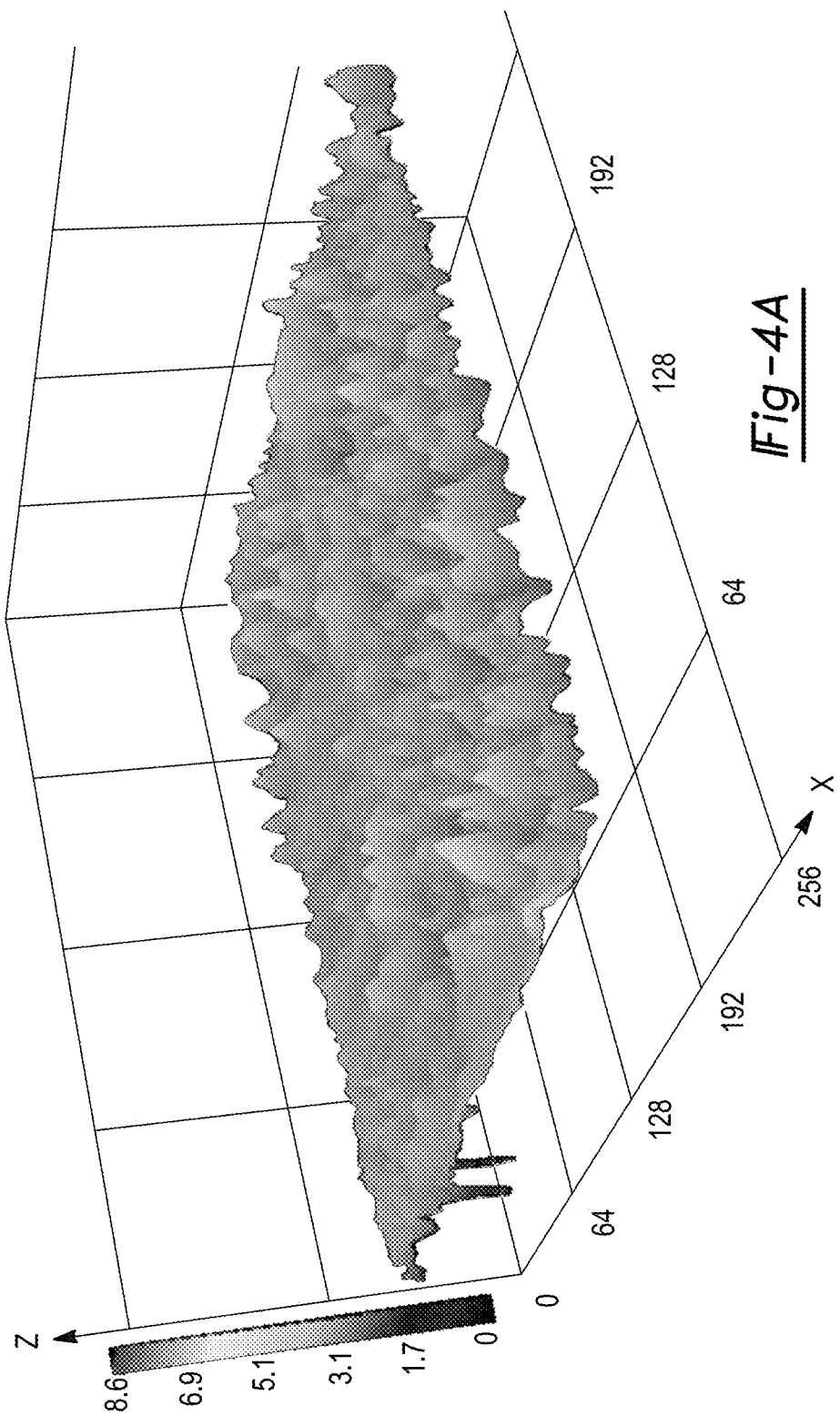

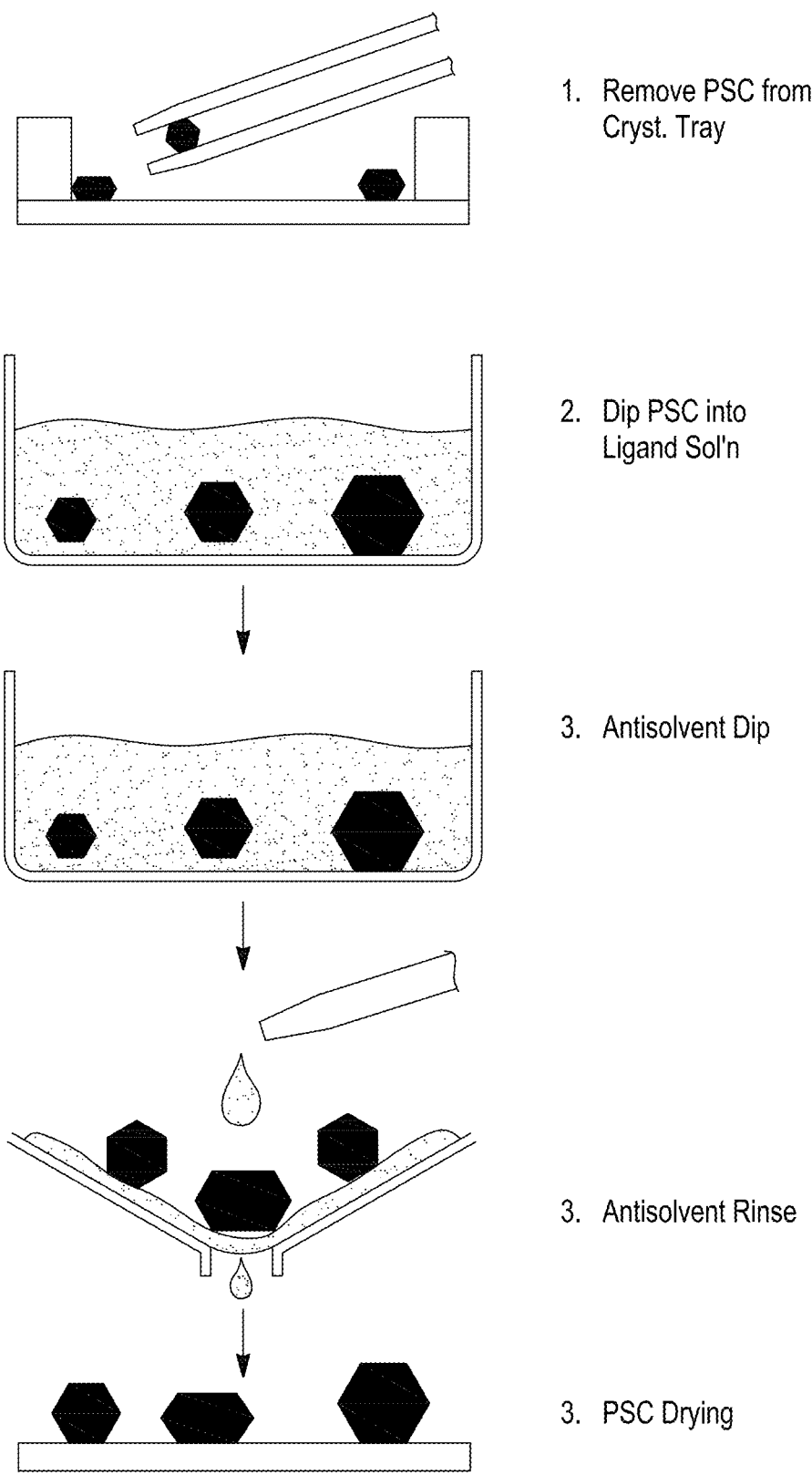

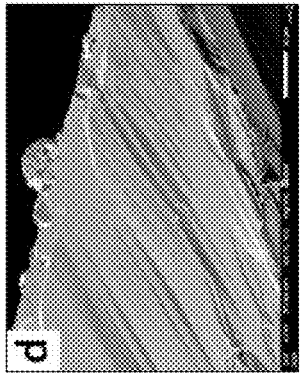
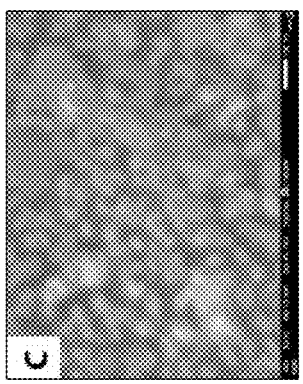
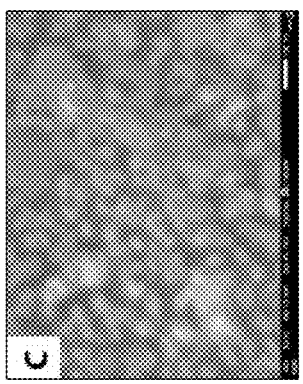

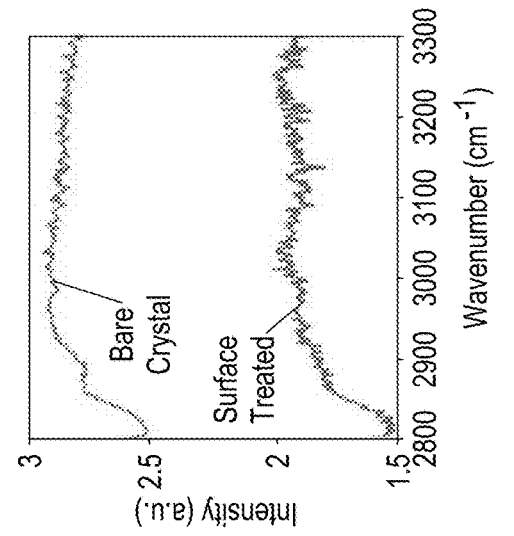
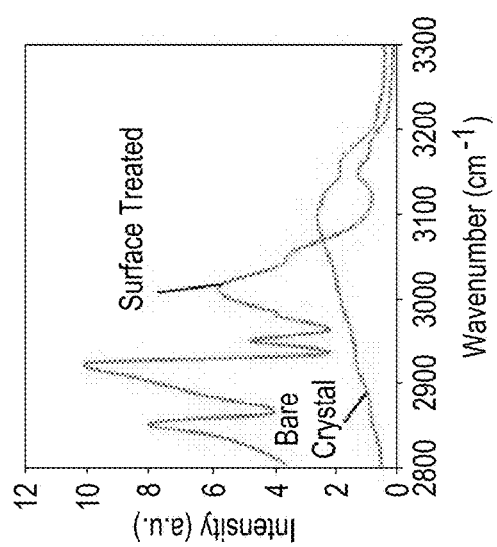
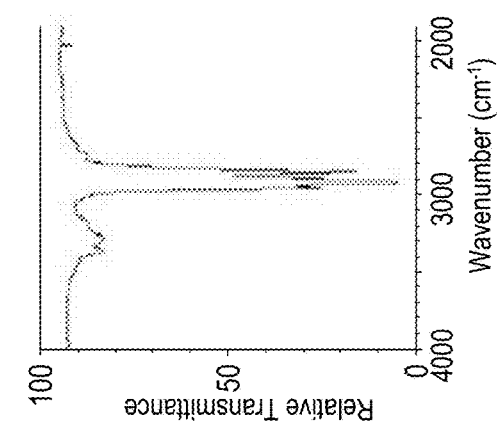
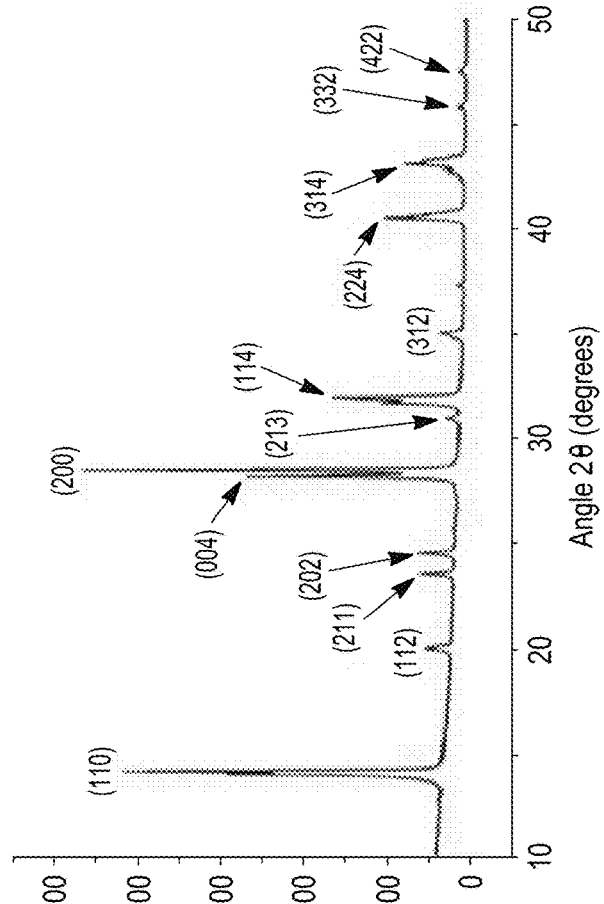

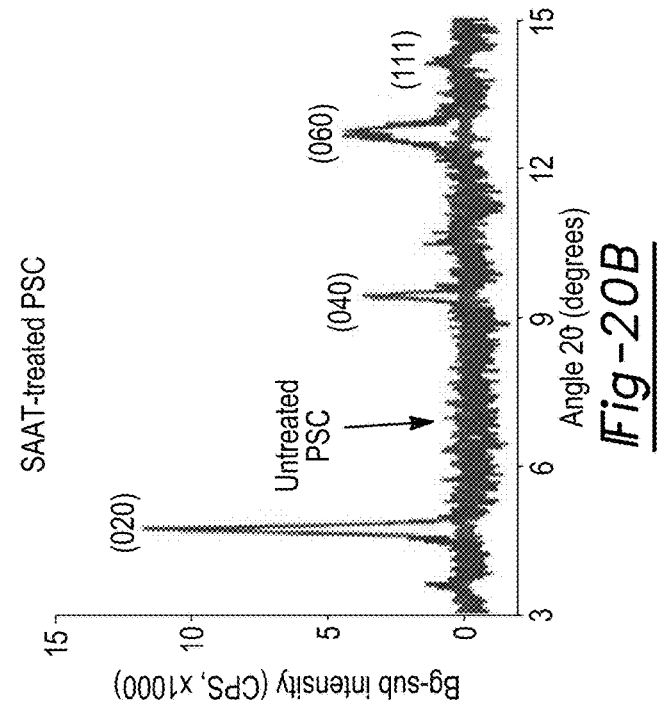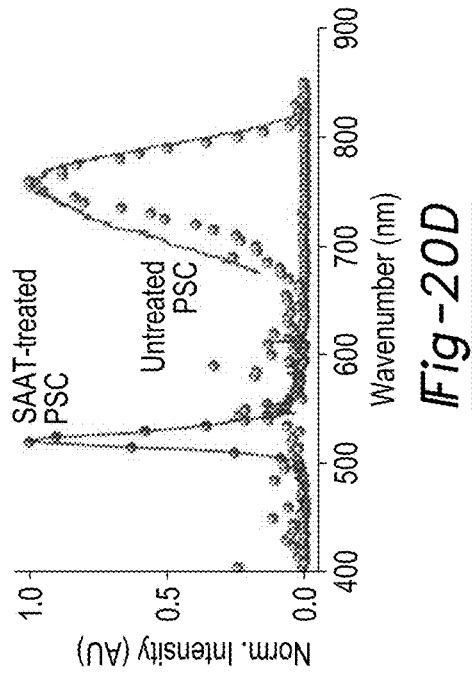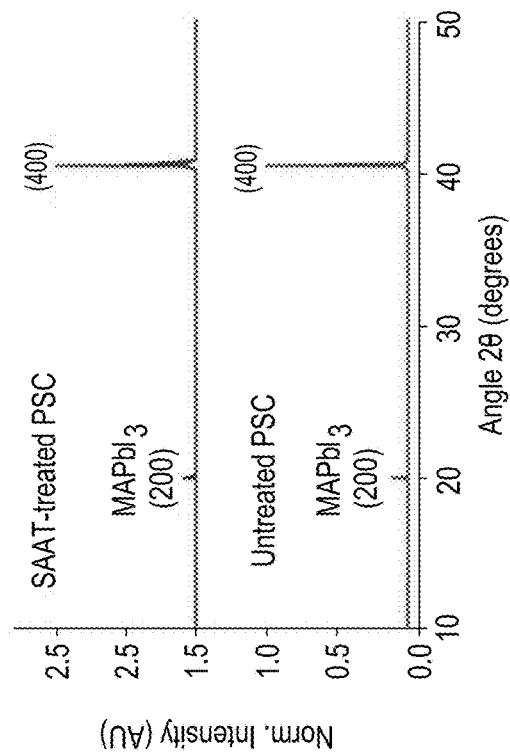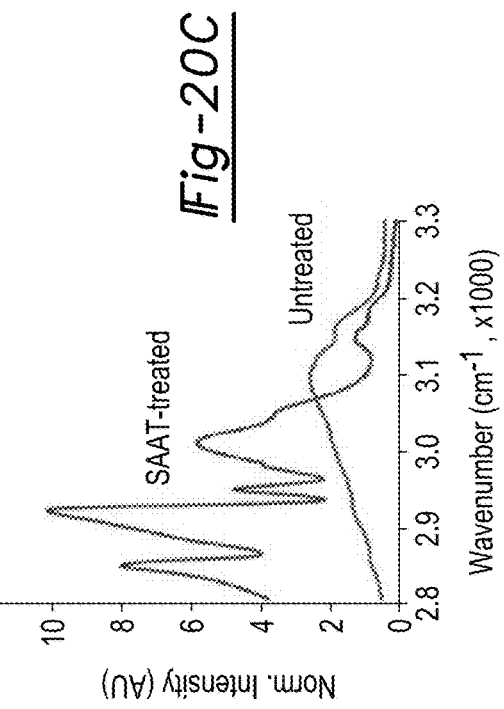

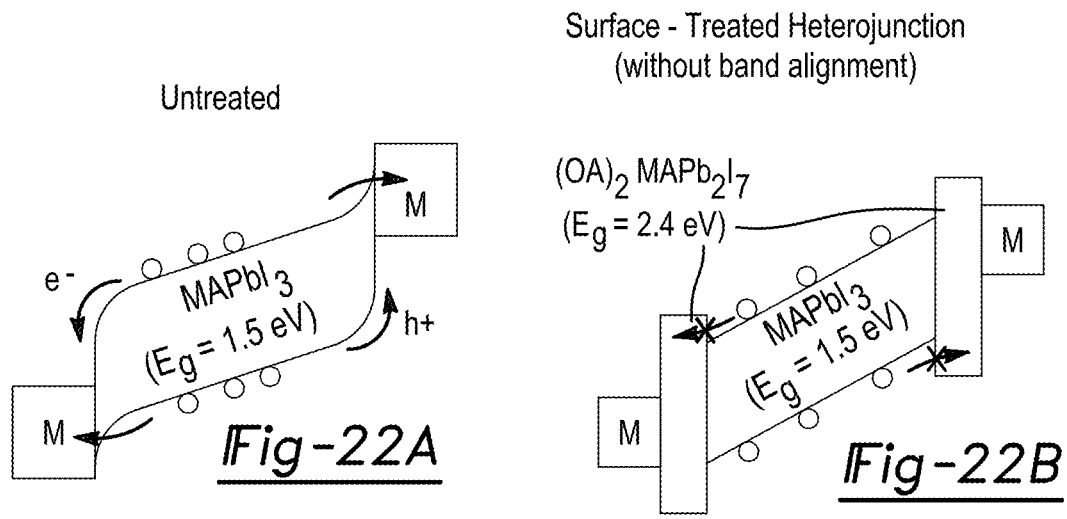
Fig-22A
Fig-22B
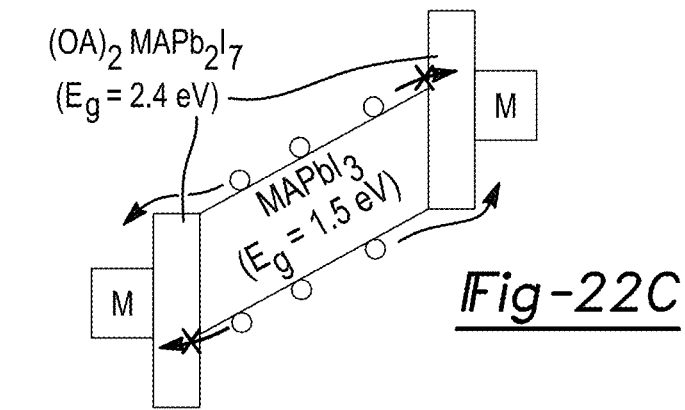
Fig-22C
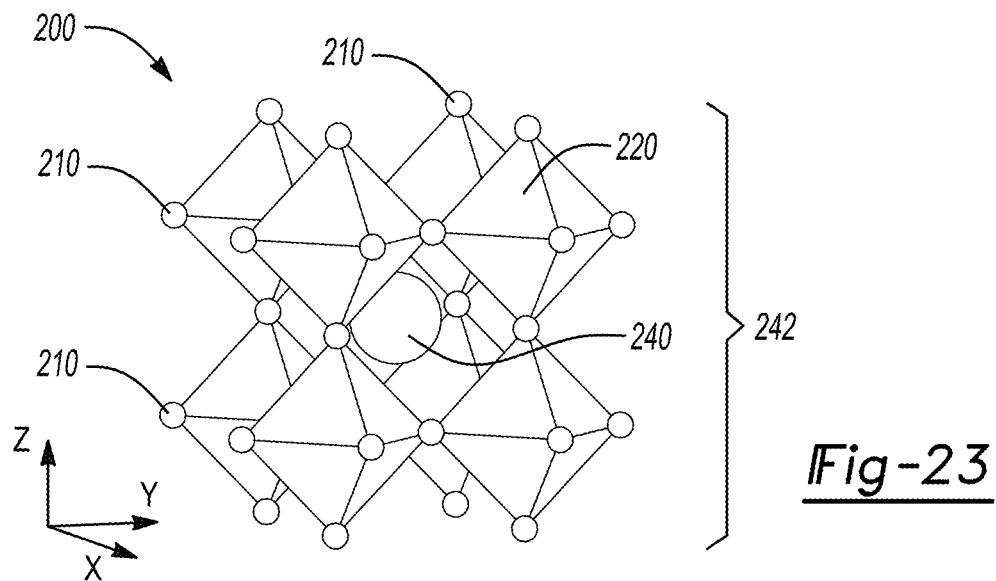
Fig-23

OPTIMIZED GROWTH OF STABLE HYBRID PEROVSKITE MATERIALS FOR ELECTROMAGNETIC AND PARTICLE RADIATION DETECTION

CROSS-REFERENCE TO RELATED APPLICATIONS

This application claims the benefit of U.S. Provisional Application No. 62/894,398, filed on Aug. 30, 2019. The entire disclosure of the above application is incorporated herein by reference.

GOVERNMENT SUPPORT

This invention was made with government support under 15DNARI00015-05-00 and 2015-DN-077-ARI097 awarded by the Department of Homeland Security. The Government has certain rights in the invention.

FIELD

The present disclosure relates to stable hybrid perovskite materials having a bulk region and a smooth perovskite surface layer, as well as methods and devices for forming and using such materials.

BACKGROUND

This section provides background information related to the present disclosure which is not necessarily prior art.

Organolead halide perovskite semiconductor materials have favorable optical and electronic properties and are of commercial interest due to the ease with which single and polycrystalline forms can be fabricated. Organolead halide perovskite semiconductor materials have been used in perovskite-based photovoltaic (PV), photodetectors, as well as in x-ray and gamma ray radiation detectors, among others.

However, an unaddressed issue with all of these perovskite-based devices is the inferior quality and electronic properties of surfaces of perovskite single crystals (PSC). While a density of bulk trap states internally within PSCs is low and near that of monocrystalline silicon (Si), the density of trap states at the surfaces of perovskite crystals is much higher, on the order of $10^{16}$ cm$^{-3}$ when studied theoretically and empirically, inducing band-bending at the perovskite-metal interfaces leading to increased leakage current and reduced bulk field strength. The band-bending can even induce chemical degradation of the bulk perovskite material itself, decreasing the useful device lifetime, and inducing additional constraints on the perovskite device structure. Furthermore, the surfaces of the perovskite crystals are typically very rough, which impedes good electrical conductivity with adjacent structures, such as electrodes.

To address these issues, it would be desirable to form stable perovskite-based materials having a smooth surface with desirable optical, electrical, and electronic properties.

SUMMARY

This section provides a general summary of the disclosure, and is not a comprehensive disclosure of its full scope or all of its features.

In certain aspects, the present disclosure relates to a stable hybrid perovskite material structure comprising a bulk region. The bulk region comprises a single crystal perovskite material having a composition represented by formula $ABX_3$. A is at least one organic or metallic cation having a +1 or +2 charge, B is at least one inorganic cation having a +2 or +4 charge, and X is at least one anion having a −1 or −2 charge, wherein the single crystal perovskite material has a first bandgap. The stable hybrid perovskite material structure also comprises a smooth perovskite surface layer having a second bandgap that is greater than the first bandgap and having a smooth surface with a surface roughness of less than or equal to about 20% of an overall thickness of the perovskite surface layer.

In one aspect, a first thickness of the bulk region is greater than or equal to about 1 mm and has a root mean squared (RMS) surface roughness of less than or equal to about 5 micrometers. Further, a thickness of the smooth perovskite surface layer is greater than or equal to about 1 micrometer and the smooth surface has a root mean squared (RMS) surface roughness that is less than or equal to about 100 nm.

In one aspect, a thickness of the smooth perovskite surface layer is greater than or equal to about 0.5 micrometers and less than or equal to about 10 micrometers.

In one aspect, the single crystal perovskite material is represented by a formula $ABX_3$. A is selected from the group consisting of: methylammonium ($CH_3NH_3^+$), ethylammonium ($C_2H_8N^+$), formamidinium ($NH_2CHNH_2^+$), and combinations thereof. B comprises lead (II) ($Pb^{2+}$), and X is an anion selected from the group consisting of: chloride ($Cl^-$), iodide ($I^-$), bromine (Br—), and combinations thereof.

In one aspect, the smooth perovskite surface layer comprises a Ruddlesden-Popper perovskite represented by $A^1_k A^2_{n+1} B^1_n X^1_{3n+1}$, where $A^1$ and $A^2$ are each at least one organic cation having a +1 or +2 charge. $B^1$ is at least one inorganic cation having a +2 or +4 charge. $X^1$ is at least one anion having a −1 or −2 charge, k ranges from greater than or equal to 1 to less than or equal to 2, and n is an integer.

In one aspect, the single crystal perovskite material comprises methyl ammonium lead iodide ($MAPbI_3$), where the first bandgap is about 1.5 eV. The smooth perovskite surface layer comprises octylamine methylammonium lead iodide (($OA)_2MAPb_2I_7$), where the second bandgap is about 2.4 eV.

In certain other aspects the present disclosure relates to an inverse temperature crystallization process for forming a single crystal perovskite. The process may comprise introducing a precursor solution of a single crystal perovskite material having a composition represented by formula $ABX_3$ into a crystallization chamber. The precursor solution comprises a solvent and one or more compounds comprising atoms that form A, B, and X in the single crystal perovskite material. A is at least one organic cation having a +1 or +2 charge, B is at least one inorganic cation having a +2 or +4 charge, and X is at least one anion having a −1 or −2 charge. The method also comprises heating the precursor solution to a pre-nucleation temperature. The precursor solution is heated to a nucleation temperature that is at least about 2° C. above the pre-nucleation temperature to form a plurality of seed crystals. The method also comprises growing the single crystal perovskite material by lowering a temperature of the precursor solution to a crystal growth temperature below the nucleation temperature. The single crystal perovskite material thus formed has a volume of greater than or equal to about 1 mm$^3$.

In one aspect, the crystal growth temperature is at least about 2° C. to about 5° C. less than the nucleation temperature.

In one aspect, the pre-nucleation temperature may be greater than or equal to about 75° C. to less than or equal to about 90° C. The precursor solution is held at the prenucleation temperature for greater than or equal to about 1 hour to less than or equal to about 5 hours.

In one aspect, the nucleation temperature may be greater than or equal to about 2° C. to less than or equal to about 8° C. above the pre-nucleation temperature.

In one aspect, the method may further comprise introducing additional solvent or additional precursor solution into the crystallization chamber during the growing of the single crystal perovskite material.

In one aspect, the pre-nucleation temperature corresponds to a temperature, a concentration, or both a temperature and a concentration of the precursor solution, so that the precursor solution is at or slightly above a saturation point, but below a spontaneous nucleation point.

In one aspect, the nucleation temperature corresponds to a temperature, a concentration, or both a temperature and a concentration of the precursor solution so that the precursor solution is at or slightly above a point of onset of spontaneous nucleation.

In one aspect, during the growing the single crystal perovskite material, greater than or equal to about 10% by volume of the precursor solution in the crystallization chamber is between (i) a saturation temperature and a spontaneous nucleation temperature, (ii) a saturation concentration and a spontaneous nucleation concentration, or both (i) and (ii).

In one aspect, the method further comprises removing the single crystal perovskite material from the crystallization chamber.

In one aspect, the method further comprises ceasing growth of the single crystal perovskite material by one or more of the following: (i) removing the single crystal perovskite material from the crystallization chamber; (ii) removing greater than or equal to about 40% of precursor solution from the crystallization chamber; and/or (iii) drying the single crystal perovskite material in the crystallization chamber at a temperature of greater than or equal to about 55° C.

In yet other aspects, the present disclosure relates to a crystallization chamber for an inverse temperature crystallization process to form a single crystal perovskite. The crystallization chamber comprises a first plate and a second plate disposed in parallel to one another. The first plate defines an internal surface near which the single crystal perovskite can grow. The crystallization chamber also comprises a spacer disposed between the first plate and the second plate that defines a sealed internal volume between the first plate and the second plate that contains at least one seed crystal of the single crystal perovskite. A reservoir containing a precursor solution of the single crystal perovskite having a composition represented by formula $ABX_3$ into a crystallization chamber is also provided. In certain aspects, the precursor solution comprises a solvent and one or more compounds comprising atoms that form A, B, and X in the single crystal perovskite. A is at least one organic cation having a +1 or +2 charge, B is at least one inorganic cation having a +2 or +4 charge, and X is at least one anion having a -1 or -2 charge. An inlet in fluid communication with the internal volume configured to receive the precursor solution from the reservoir. An outlet is in fluid communication with the internal volume through which the precursor solution can flow. A pump is configured to pump the precursor solution from the inlet across the seed crystal in the internal volume to the outlet. The crystallization chamber also comprises at least one heater for heating the precursor solution to a predetermined temperature for growth of the single crystal perovskite material in the internal volume.

In one aspect, the crystallization chamber further comprises at least one temperature detector that monitors a temperature of the precursor solution in the internal volume.

In one aspect, the crystallization chamber further comprises an optical monitoring device disposed above the internal volume configured to measure a size or a volume of the single crystal perovskite.

In one further aspect, the optical monitoring device comprises a laser and a spectrometer.

In one further aspect, the optical monitoring device comprises a camera.

In certain other aspects, the present disclosure relates to a passivation process for forming a stable hybrid perovskite material. The process comprises contacting a bulk region comprising a single crystal perovskite material with a passivating medium. The single crystal perovskite material has a composition represented by formula $ABX_3$. A is at least one organic cation having a +1 or +2 charge, B is at least one inorganic cation having a +2 or +4 charge, and X is at least one anion having a -1 or -2 charge. The single crystal perovskite material has a first bandgap. The passivating medium comprises a functionalized organic compound or monomer with chemical formula $R-G_n$, where R is an organic group, an organic monomer or an oligomer group capable of polymerization and G is a functional group with a charge corresponding to A, B, or X. The functionalized organic compound or monomer comprises about 8 to about 150 atoms, where at least two atoms of which are carbon, and n ranges from 1 to 25, or a salt thereof. A smooth surface layer comprising a perovskite material is formed having a second bandgap that is greater than the first bandgap. The smooth surface layer together with the bulk region defines the stable hybrid perovskite material.

In one aspect, the perovskite material in the smooth surface layer comprises a Ruddlesden-Popper perovskite represented by $A^1_k A^2_{n+1} B^1_n X^1_{3n+1}$. $A^1$ and $A^2$ are each at least one organic cation having a +1 or +2 charge. $B^1$ is at least one inorganic cation having a +2 or +4 charge. $X^1$ is at least one anion having a -1 or -2 charge, k ranges from greater than or equal to 1 to less than or equal to 2, and n is an integer.

In one aspect, the functionalized organic compound, monomer, or salt is selected from the group consisting of: organoamine, octylamine, octylammonium iodide, 4 (para)-aminobenzoic acid, and combinations thereof.

In one aspect, after the contacting, the method further comprises rinsing the smooth surface layer with a solvent.

In one aspect, the contacting occurs for a duration of greater than or equal to about 10 seconds to less than or equal to about 2 minutes.

In one aspect, after the forming the smooth surface layer, the passivation process further comprises contacting the smooth surface layer with a cleaning solution comprising an antisolvent.

In one aspect, the contacting the smooth surface layer with the cleaning solution occurs for a duration of less than or equal to about 2 minutes.

In one aspect, the method further comprises pre-conditioning the bulk region prior to the contacting by one or more of the following: at least partially drying of the bulk region, wetting of a surface of the bulk region by contacting with a precursor solution of the single crystal perovskite material; and treating a surface of the bulk region with ozone or plasma.

In one aspect, the at least partially drying of the bulk region comprises drying the bulk region in a vacuum oven or by exposing it to a supercritical fluid comprising carbon dioxide.

In one aspect, the method further comprises at least partially drying the stable hybrid perovskite material.

In one aspect, the at least partially drying of the stable hybrid perovskite material comprises drying the bulk region in a vacuum oven or by exposing it to a supercritical fluid comprising carbon dioxide.

In one aspect, the method further comprises conducting one or more of the following processes after the forming the smooth surface layer: ultrasonication of the stable hybrid perovskite material in a cleaning solution and/or curing the smooth surface layer.

In yet other aspects, the present disclosure relates to a device for detection of light or elementary particles or energy conversion. The device may comprise a stable hybrid perovskite material comprising a bulk absorber region comprising a single crystal perovskite material having a composition represented by formula $ABX_3$, wherein A is at least one cation, for example, having a +1 or +2 charge, B is at least one inorganic cation having a +2 or +4 charge, and X is at least one anion having a −1 or −2 charge, wherein the single crystal perovskite material has a first bandgap. The stable hybrid perovskite material may further comprise a smooth perovskite surface layer having a second bandgap that is greater than the first bandgap and having a smooth surface with a surface roughness of less than or equal to about 20% of an overall thickness of the perovskite surface layer. Energy from at least one of photons or elementary particles is converted into an electron/hole pair in the bulk absorber region. The device also includes a first electrical contact in electrical communication with the stable hybrid perovskite material and a second electrical contact in electrical communication with the stable hybrid perovskite material.

In one aspect, the device further comprises at least one charge transport layer.

In one aspect, the charge transport layer comprises an electron selective transport material, a hole selective transport material, or both an electron selective transport material and a hole selective transport material.

In one aspect, the device further comprises at least one charge transport barrier layer.

In one aspect, the bulk absorber region has a largest constituent crystal volume of greater than or equal to about 0.05 μL.

In one aspect, the device is a radiation detector.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 1 shows an example schematic of a stable hybrid perovskite material having a bulk region and a smooth perovskite surface layer prepared in accordance with certain aspects of the present disclosure.

FIGS. 2A-2B show schematics for two distinct inverse temperature crystallization processes for forming perovskite single crystals (PSCs) according to certain aspects of the present disclosure. FIG. 2A shows a first process, where growth of PSCs is controlled by an amount of solvent present in the precursor solution. In FIG. 2B, addition of solvent during the growth process forms significantly larger PSCs.

FIGS. 3A-3C show images of different stages of inverse temperature crystallization for perovskite single crystals in accordance with certain aspects of the present disclosure. FIG. 3A shows perovskite single crystals (PSCs) at a nucleation stage in a flat-dish crystallization chamber. FIG. 3B shows growth of PSCs. FIG. 3C shows drying of PSC after growth has ceased.

FIGS. 4A-4C show optical profilometry surface characterization and bulk material characterization of comparative perovskite single crystals (PSCs). FIG. 4A show optical profilometry of a PSC formed via a conventional inverse temperature crystallization process, while FIG. 4B shows PSC formed via an optimized inverse temperature crystallization process in accordance with certain aspects of the present disclosure. FIG. 4C shows bulk characterization using Powder-mode X-Ray Diffraction (PXRD) showed PSCs with minimal impurities.

FIGS. 5A-5D show cross-sectional scanning electron microscopy (SEM) images of comparative perovskite single crystals (PSCs) formed via a conventional inverse temperature crystallization process versus PSCs formed via an optimized inverse temperature crystallization process in accordance with certain aspects of the present disclosure. The conventional PSCs are shown in low magnification (FIG. 5A) and high magnification (FIG. 5B). PSCs prepared in accordance with certain aspects of the present disclosure are shown in low magnification (FIG. 5C) and high magnification (FIG. 5D).

FIGS. 6A-6C show radiation spectra of perovskite single crystals (PSCs) and other semiconductor detectors with a Ba source. FIG. 6A shows a comparison of 133Ba radiation spectra between PSC formed via a conventional inverse temperature crystallization process versus PSCs formed via an optimized inverse temperature crystallization process in accordance with certain aspects of the present disclosure. A comparison of size-normalized radiation spectra between PSCs "Pvsk" and commercial detection systems, including silicon drift detectors "Si", cadmium zinc telluride "CZT" bare crystals, surface-optimized cadmium telluride "CdTe" detectors, and cesium iodide "CsI" scintillators with SiPM readouts, showing the full spectra (FIG. 6B) as well as the spectra focused on the 81 keV 133Ba gamma ray peak (FIG. 6C).

FIG. 8A is a top view and FIG. 8B is a side view of a fabricated controlled PSC growth system prepared in accordance with the present disclosure.

FIG. 9 shows an illustration of a solution-based surface passivation process to form a smooth perovskite surface layer over a bulk region comprising a single crystal perovskite material (PSC) according to certain aspects of the present disclosure.

Figure 10A:
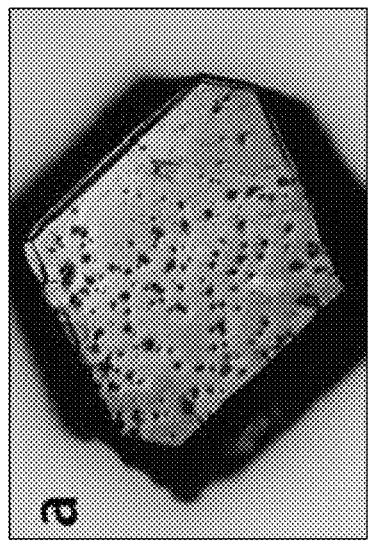
Figure 10B:
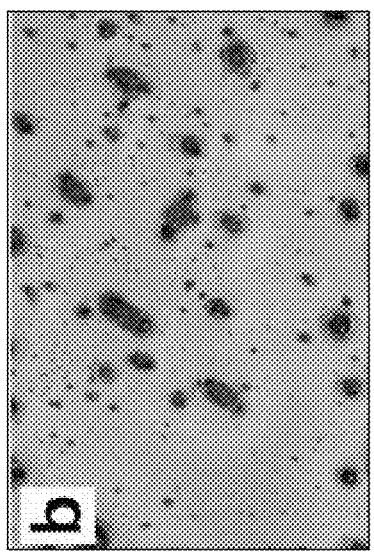
Figure 10C:
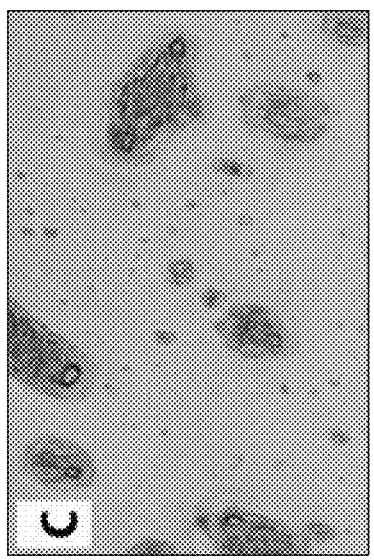
Figure 10D:
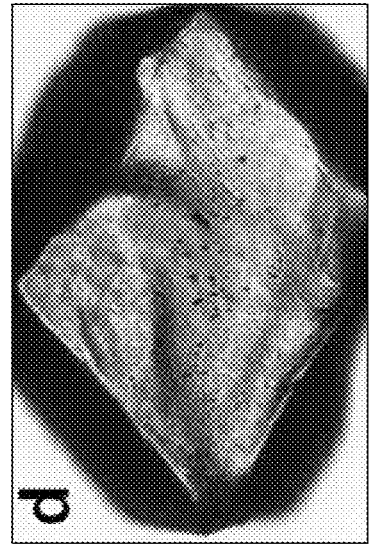
Figure 10E:
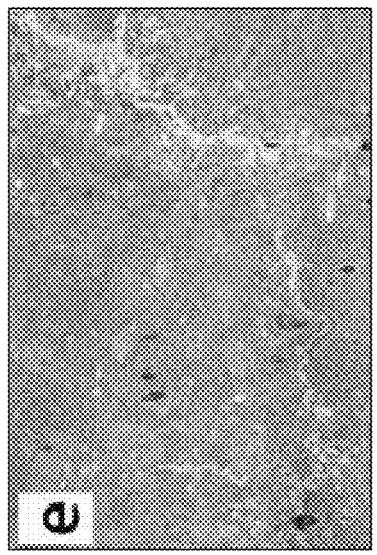
Figure 10F:
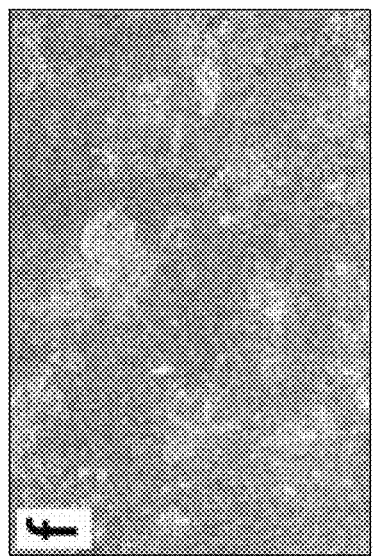

FIGS. 10A-10F show comparative microscope images of top face of PSCs with and without solution-based surface passivation (SBSP) surface treatment in accordance with certain aspects of the present disclosure. FIGS. 10A-10C have no passivation surface treatment. FIGS. 10D-10F have a passivation layer formed via a solution-based surface passivation (SBSP) process in accordance with certain aspects of the present disclosure. Images of the PSCs are shown at magnifications of 5× (FIGS. 10A, 10D), 20× (FIGS. 10B, 10E) and 50× (FIGS. 10C, 10F).

FIGS. 11A-11L show top and side-angle SEM Images of PSCs with and without surface treatment. FIGS. 11A-11F are untreated surfaces of perovskite single crystals (PSC), while FIGS. 11G-11L are PSCs having a perovskite surface passivation layer formed by a solution-based surface passivation (SBSP) process in accordance with certain aspects of the present disclosure. FIGS. 11A-11C show top view SEM images of untreated PSCs, while FIGS. 11D-11E show side-view images, focusing on the secondary-growth microcrystals. FIG. 11F shows a side view of a flat-surface region. FIGS. 11G-11J show top views of surface-treated PSCs, while FIGS. 11K-11L show side-view images of surface-treated PSCs.

FIGS. 12A-12C are comparative reflection and transmission-mode FTIR spectroscopy of untreated surfaces of perovskite single crystals (PSC) and treated-PSCs having a perovskite surface passivation layer formed by a solution-based surface passivation (SBSP) process in accordance with certain aspects of the present disclosure. FTIR transmittance spectra for octylamine (FIG. 12A) (provided from Chemical Book.com, "Octylamine(111-86-4)IR2," (2017)), with a horizontal axis value corresponding to the wavenumber of the IR radiation in units of $cm^{-1}$. FTIR Absorption spectra in reflection-mode (FIG. 12B) and transmission-mode (FIG. 12C) for surface-treated (blue) and untreated (orange) PSCs. Valleys in (FIG. 12A) correspond to peaks in (FIGS. 12B-12C), because the literature FTIR spectrum for octylamine was taken with the instrument in transmission mode while the spectra for the PSCs is taken with the instrument in absorption mode.

FIG. 13 shows a PXRD plot of powdered, untreated perovskite single crystal (PSCs). A plot of PXRD measurements taken from PSCs from the same batch is used for microscopy and SEM characterization, using a Rigaku SmartLab XRD tool. Peaks are labeled to correspond to PXRD data for $MAPbI_3$ (methylammonium lead iodide) perovskite, matching the data from literature nearly perfectly.

Figure 14A:
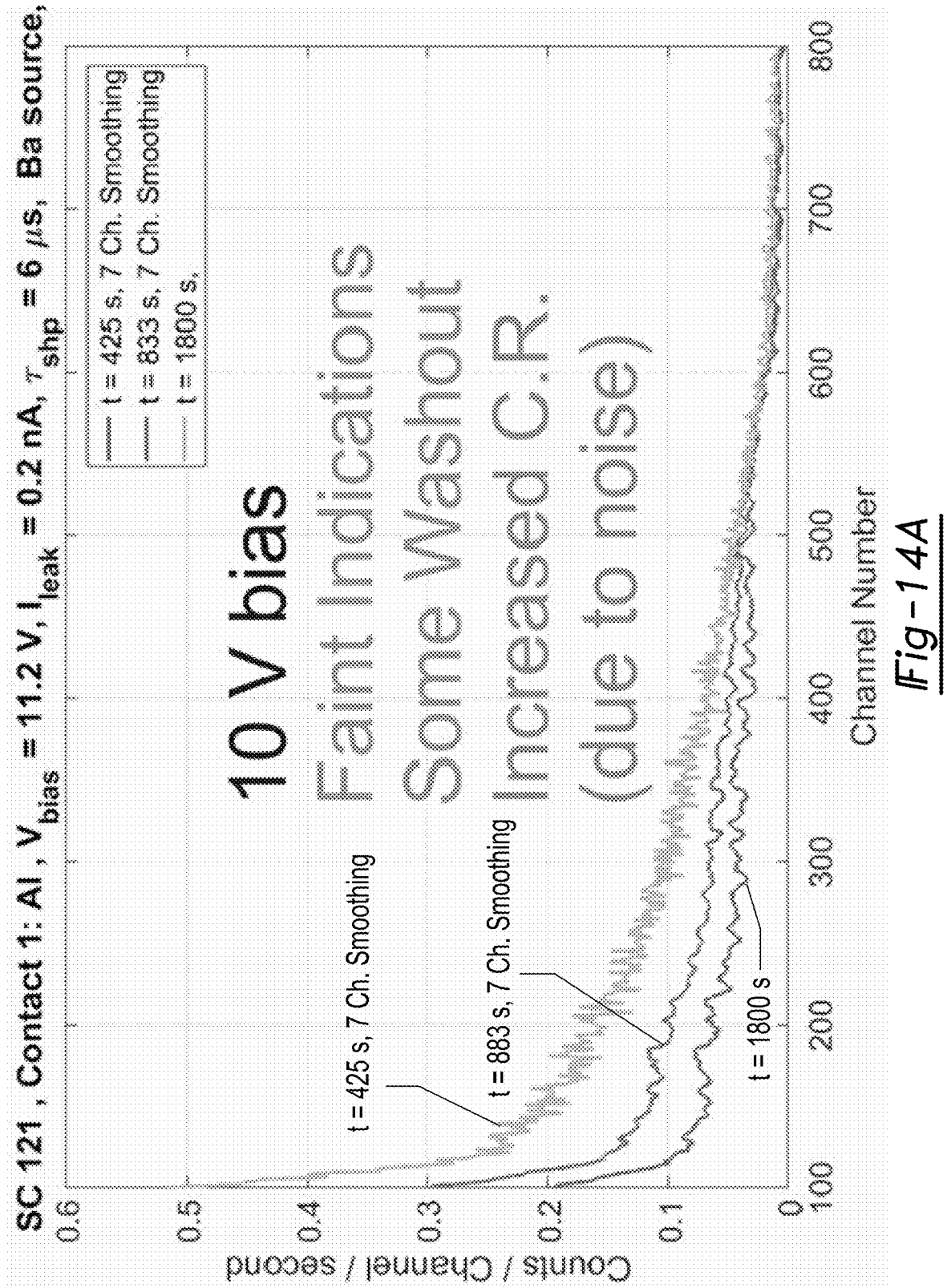
Figure 14B:
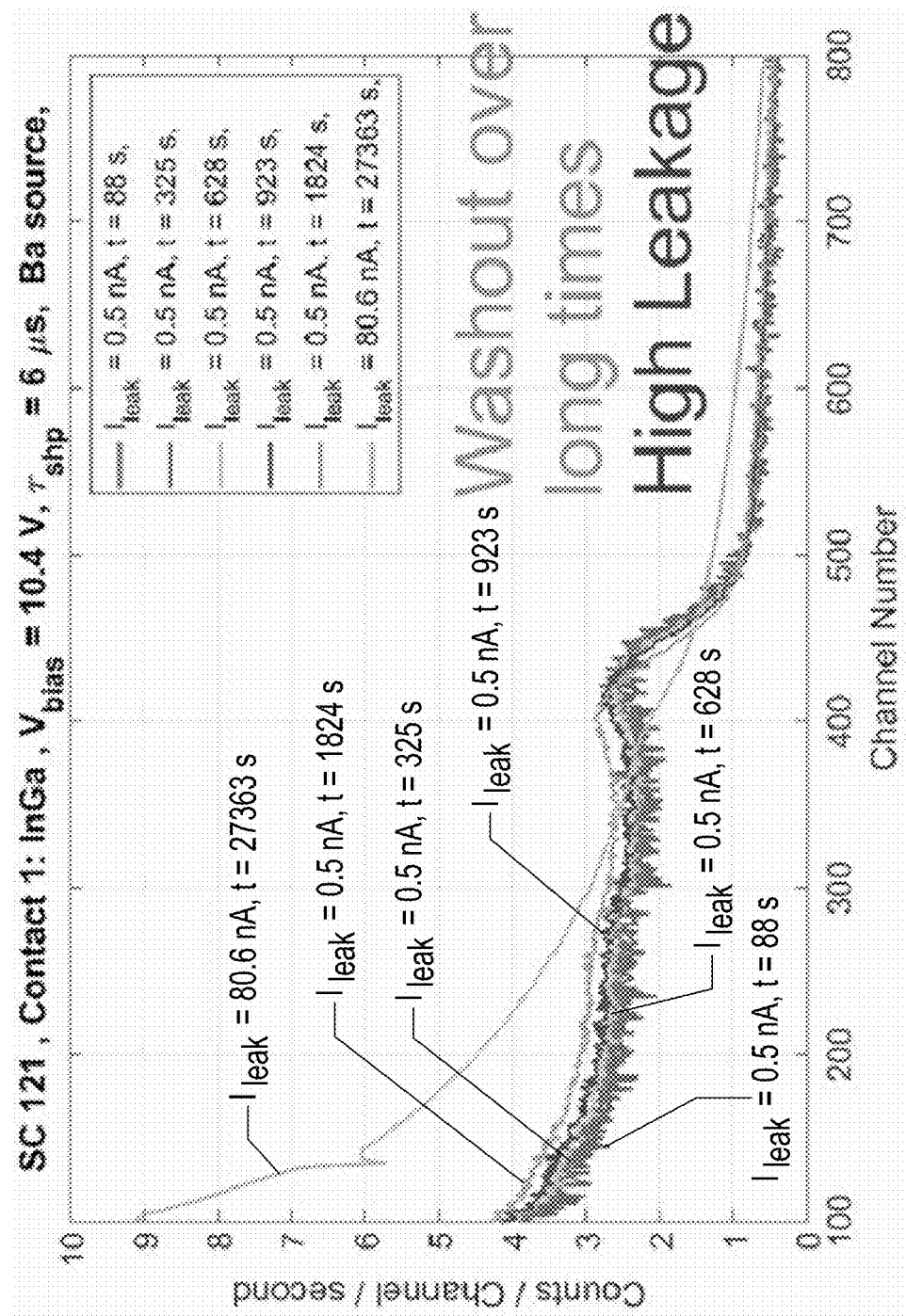
Figure 14C:
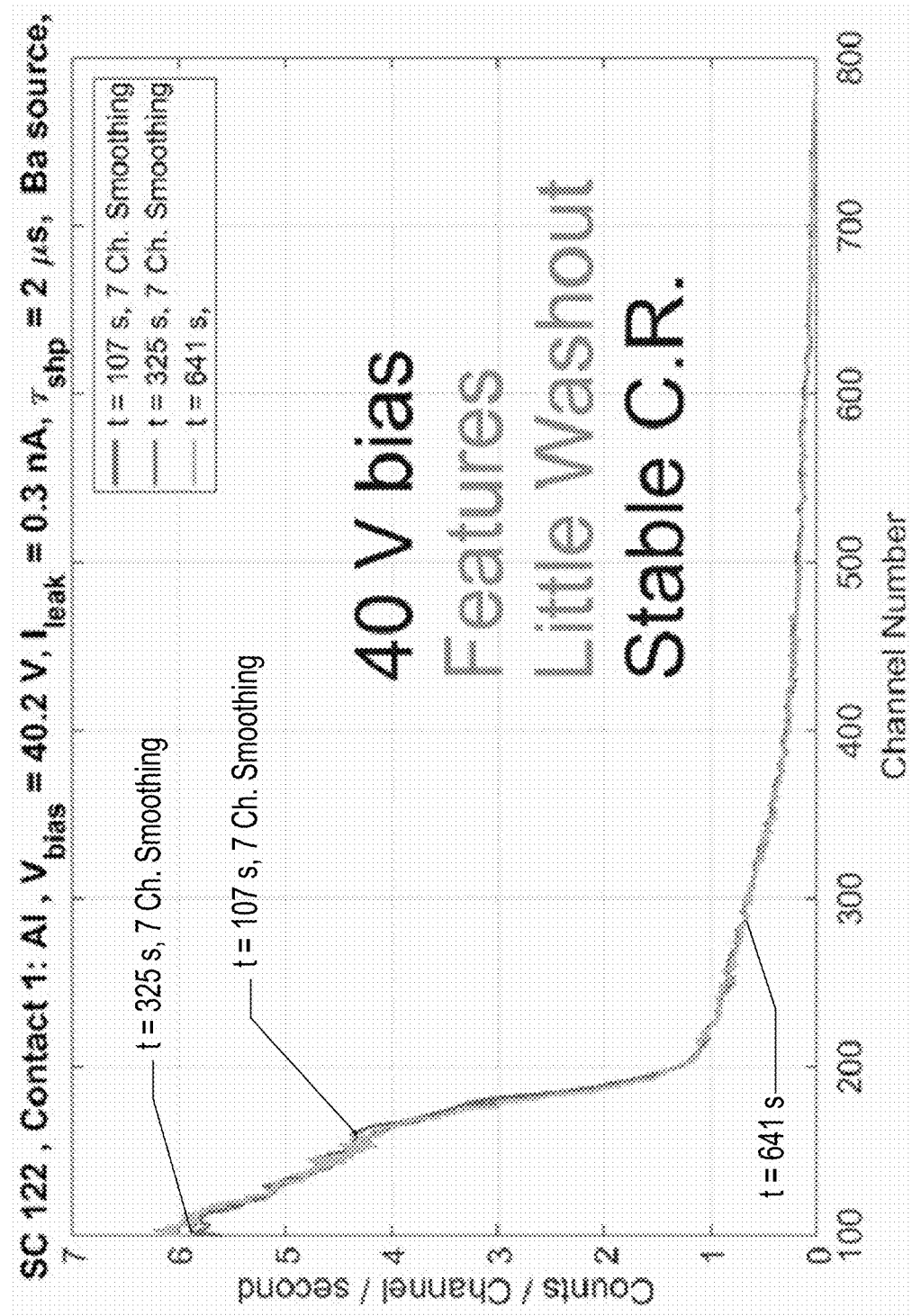
Figure 14D:
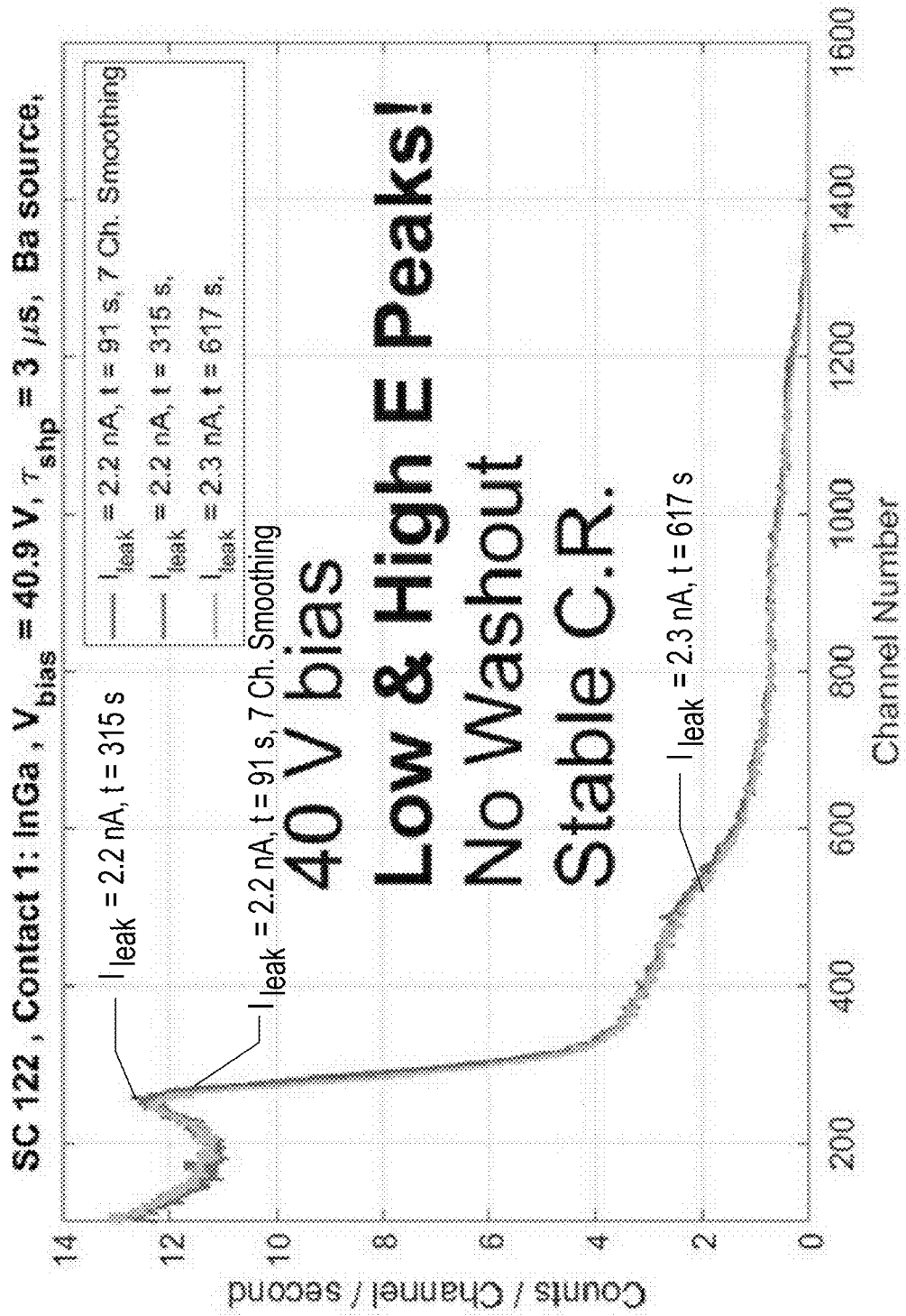

FIGS. 14A-14D show a comparison of 133Ba spectra measured using untreated perovskite single crystals (PSCs) (FIGS. 14A-14B "SC 121") and surface-treated PSCs prepared in accordance with certain aspects of the present disclosure (FIGS. 14C-14D "SC 122"), measured using point contact (FIGS. 14A, 14C) and eutectic contacting (FIGS. 14B, 14D).

Figure 15:
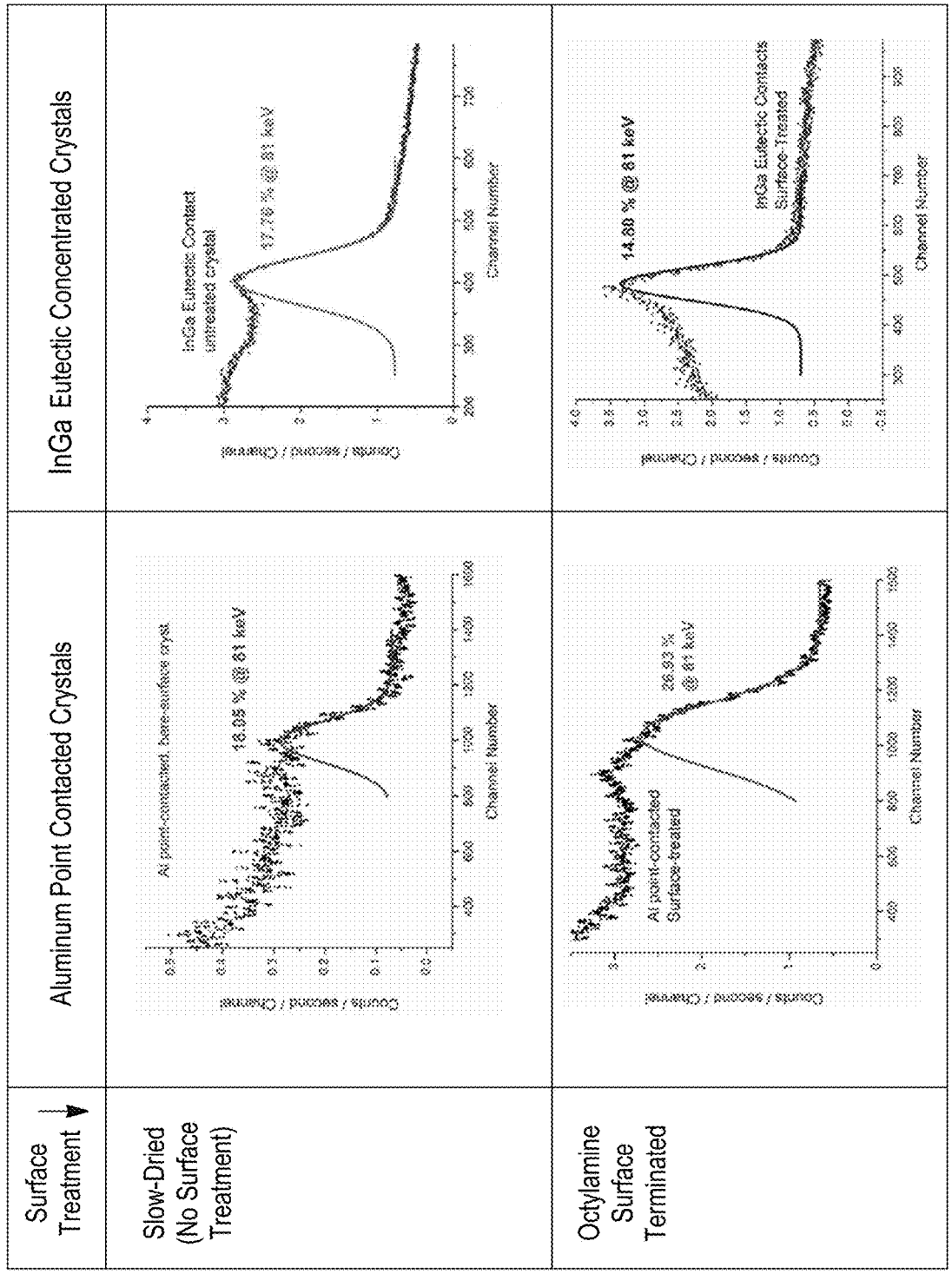

FIG. 15 shows highest-resolution 81 keV fitted peaks from various comparative PSC detectors by surface treatment and contact categories. Peak and edge fits to the 81 keV 133Ba peak as detected by PSC detectors of different categories is shown, with the plots showing the measured data (dots) and peak fits (line) done in OriginLab.

Figure 16:
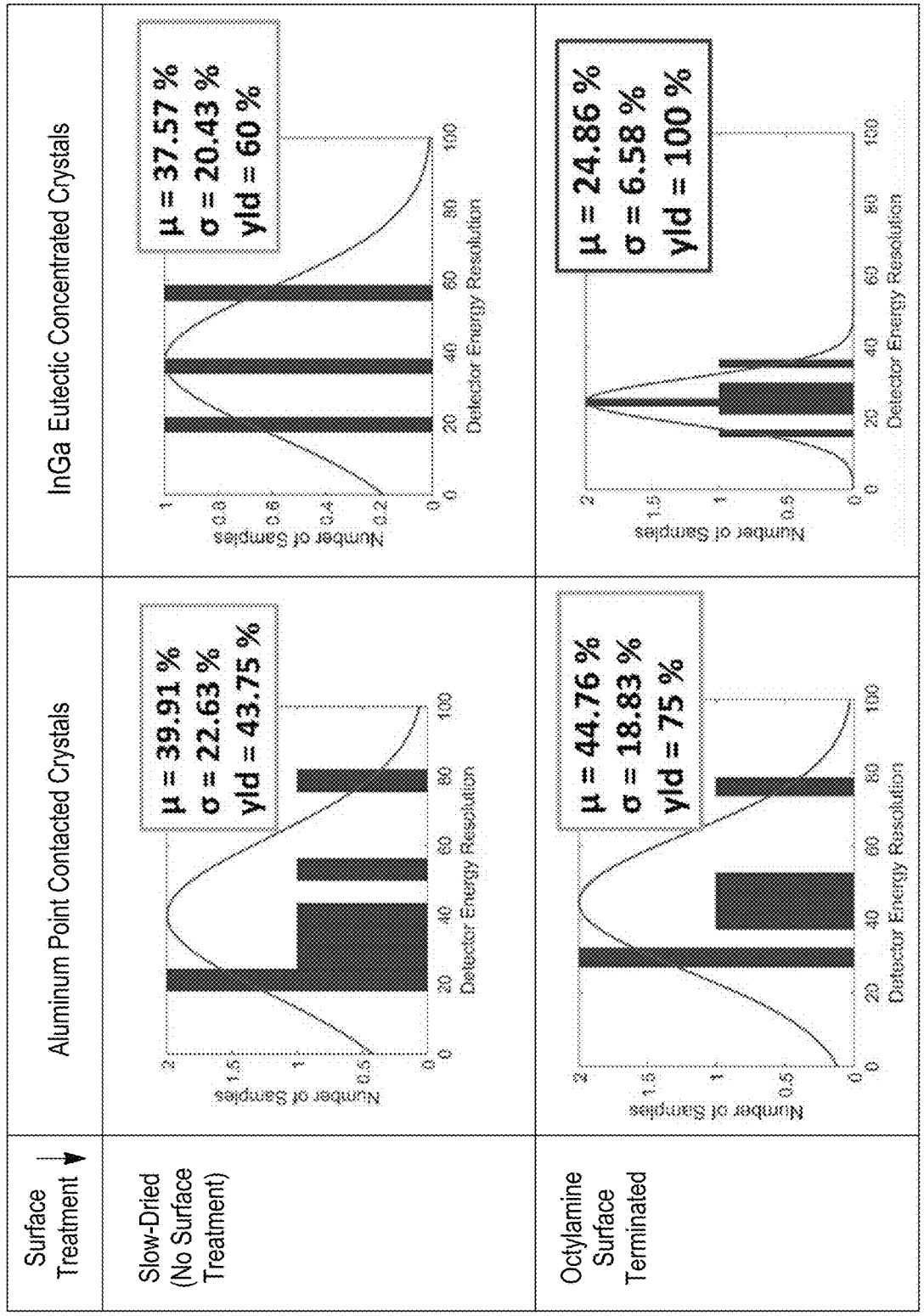

FIG. 16 shows a histogram of 81 keV peak measurement resolution for PSC detectors by surface treatment and contact categories. A highest resolution from each tested PSC detector is used to produce a histogram. If a PSC did not produce a peak, it is not shown in the histogram, but is still used to calculate the yield of the category. The average resolution "μ" and standard deviation of the resolution "σ" are calculated by peak-fitting the histogram, and are recorded for each PSC detector category. Also noted in each category is the percent yield "yld."

Figure 17A:
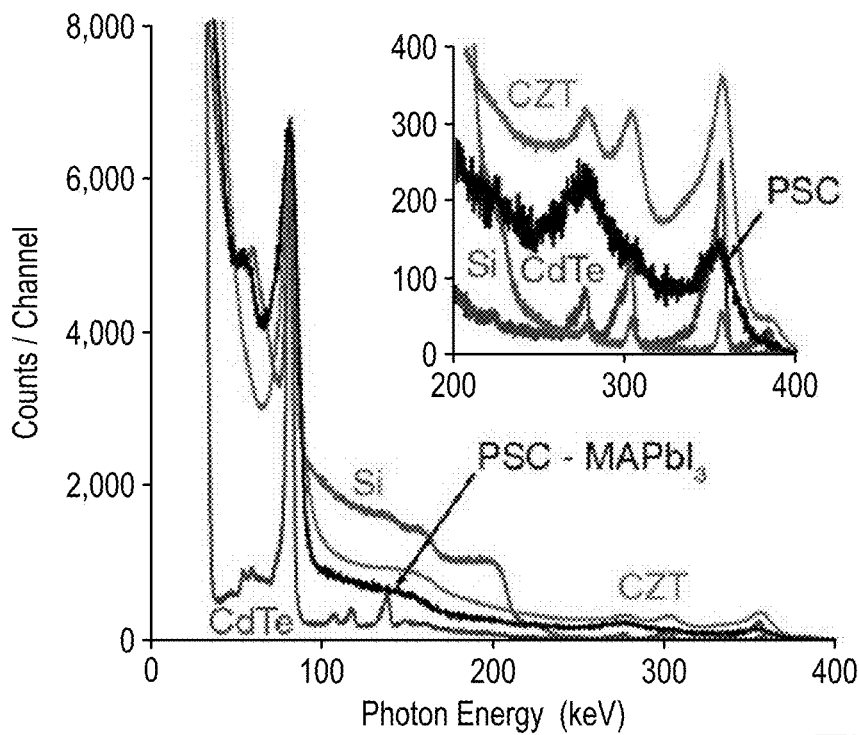
Figure 17B:
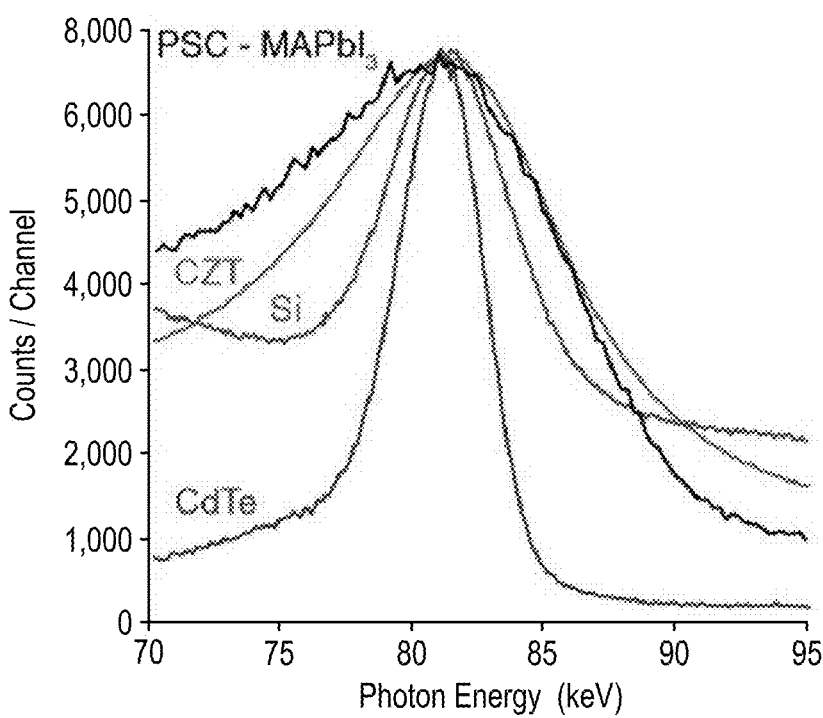
Figure 17C:
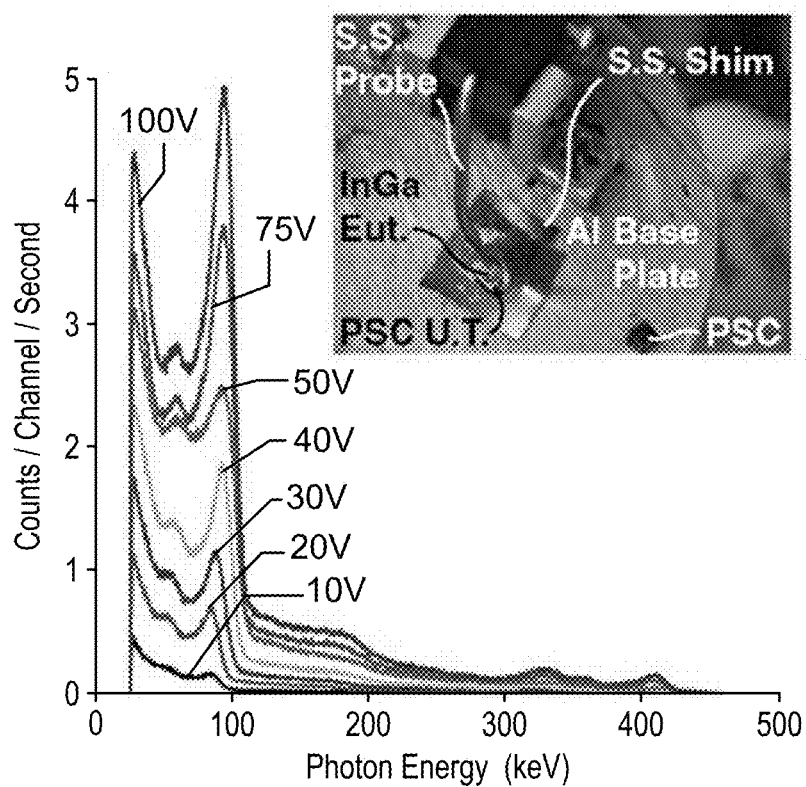
Figure 17D:
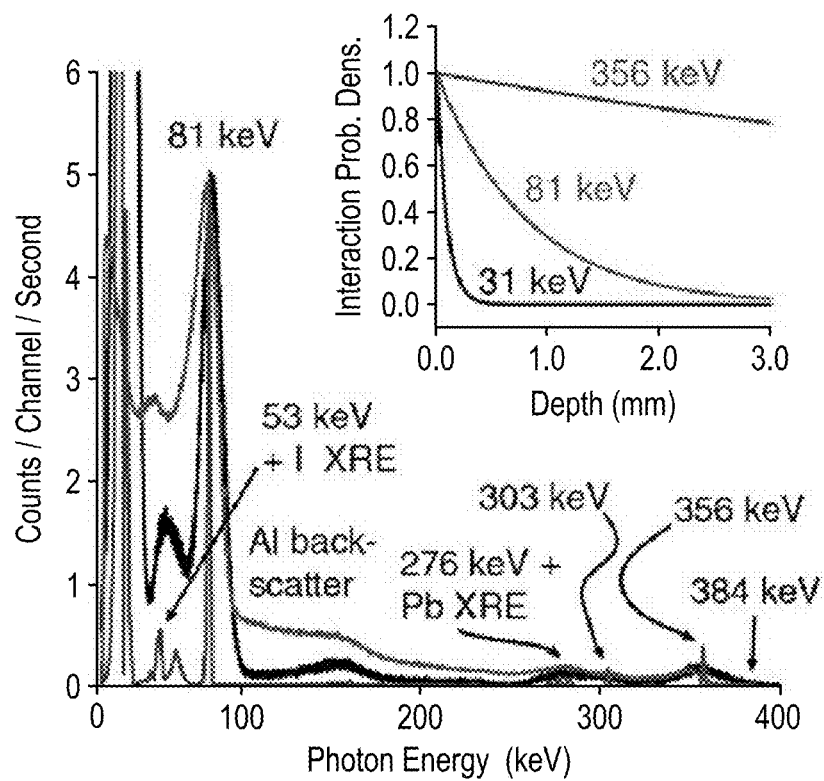
Figure 17E:
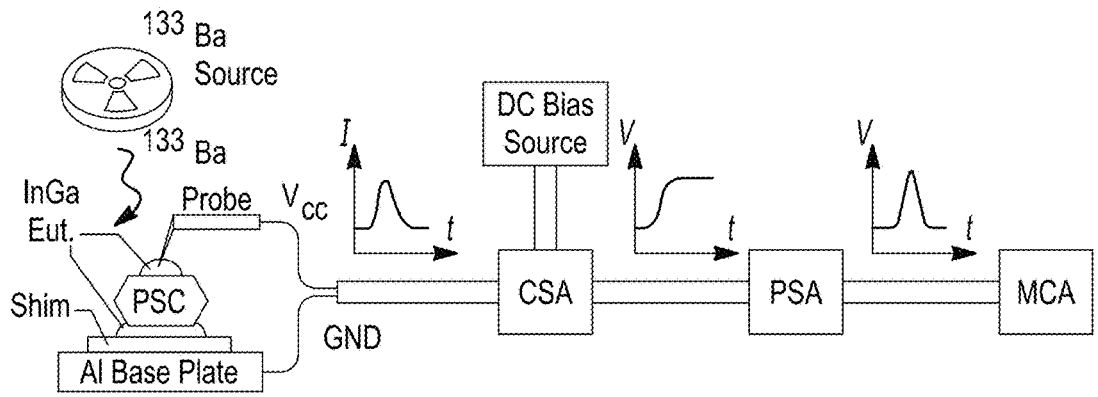

FIGS. 17A-17E. FIG. 17A shows gamma-ray spectra collected from 31.55 MBq $^{133}B$ a for four different semiconductor detectors: CdZnTe "CZT" (teal), CdTe (blue), Si (fabricated using methods from literature, red), and a 2.2× 1.7×0.85 mm $MAPbI_3$ PSC using point contacts (black). The inset shows the detail of the higher energy peaks. FIG. 17B shows gamma-ray spectra of FIG. 17A, focusing on the 81 keV peak. FIG. 17C shows gamma-ray spectra collected from the above point-contacted PSC at varying biases, indicated in the legend except in the case of the highest bias of 100 V (navy blue), using the linear energy calibration from the 40 V bias curve to gauge peak shifting at varying applied biases. The inset shows an image of a PSC in the radiation measurement test setup, showing components illustrated in FIG. 17E. FIG. 17D shows gamma-ray spectra simulated and collected (red) from the above point-contacted PSC biased to 100 V. The "unbroadened" spectrum (blue) reflects the energy deposition derived from the MCNP 6 simulation, and the "simulated" distribution (black) includes the effects of energy broadening and charge transport, including photonic backscatter from the Al test chamber and elemental x-ray escape ("XRE") features. The inset in FIG. 17D shows probability density for three photonic energies as a function of the interaction depth. FIG. 17E shows a schematic of test setup used to measure radiation spectra of PSCs, showing the PSC under test, InGa eutectic contacts, stainless steel shim, test chamber Al base plate, stainless steel probe, and readout electronics: a charge-sensitive amplifier "CSA", pulse-shaping amplifier "PSA", and multi-channel analyzer "MCA."

Figure 18A:
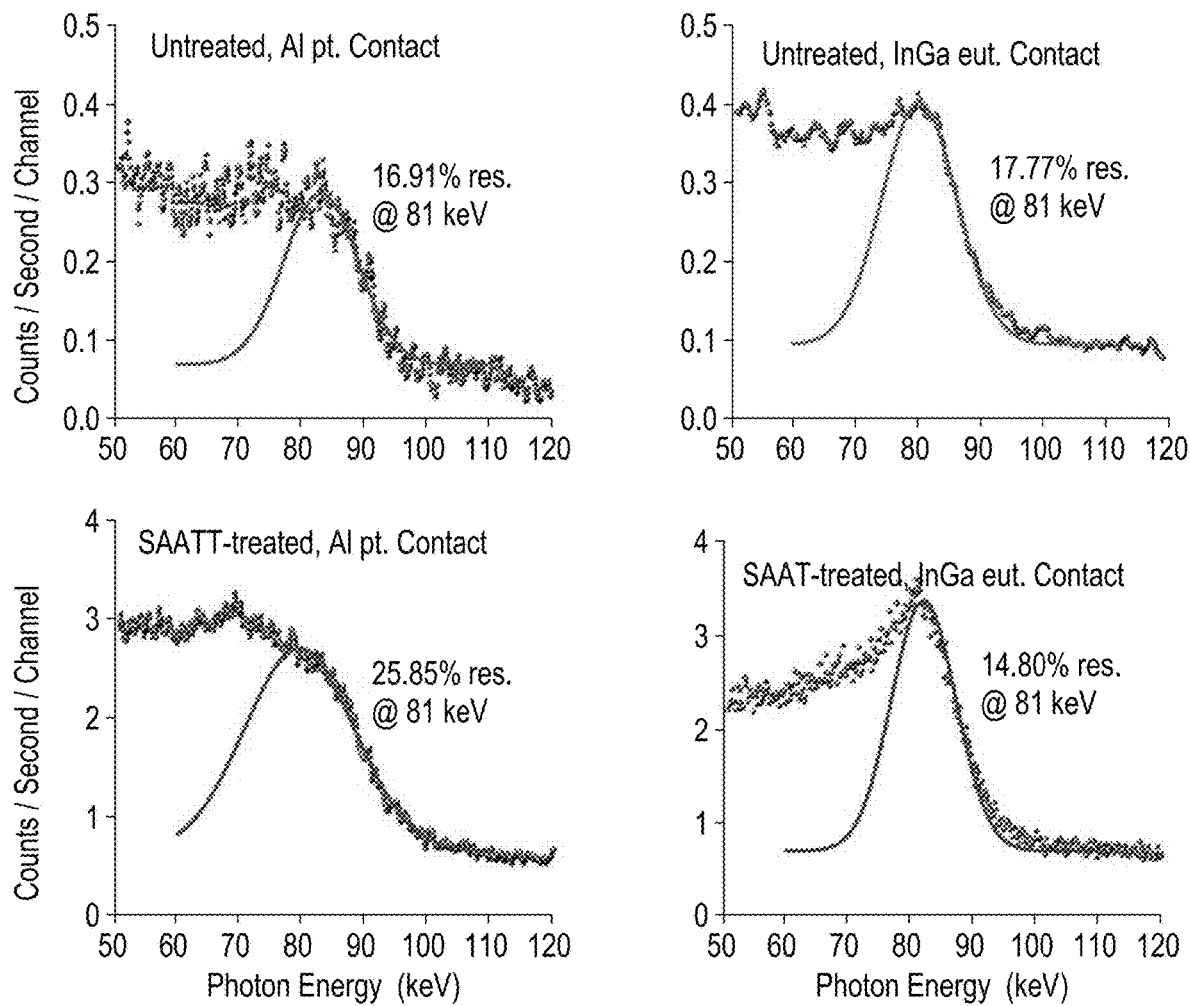
Figure 18B:
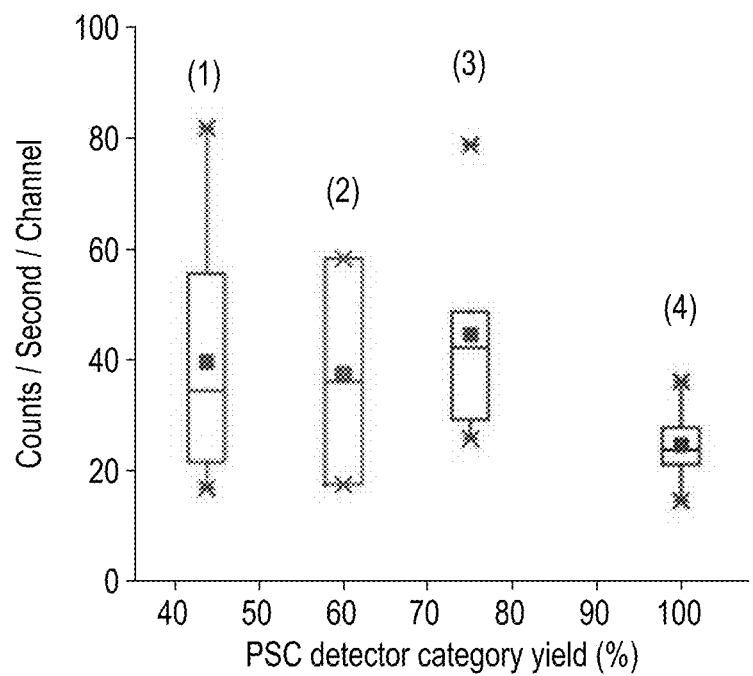
Figure 18C:
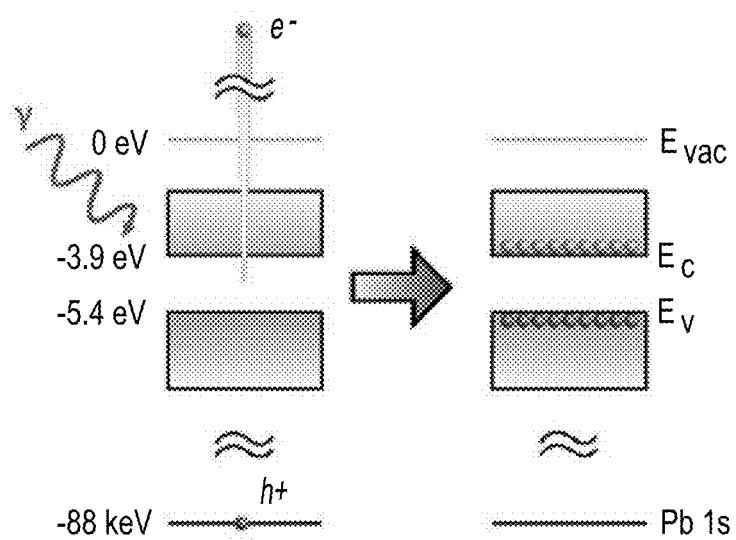
Figure 19A:
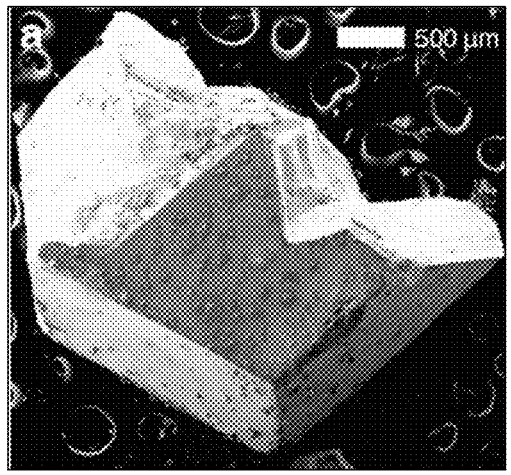
Figure 19B:
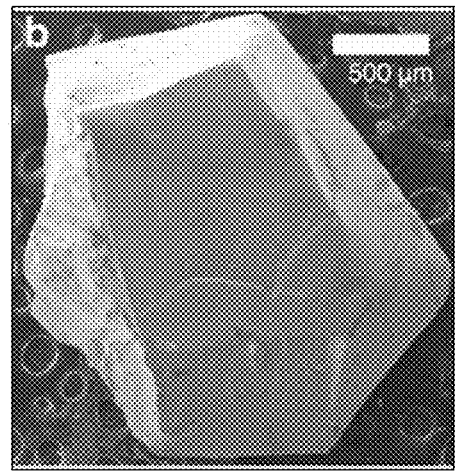
Figure 19C:
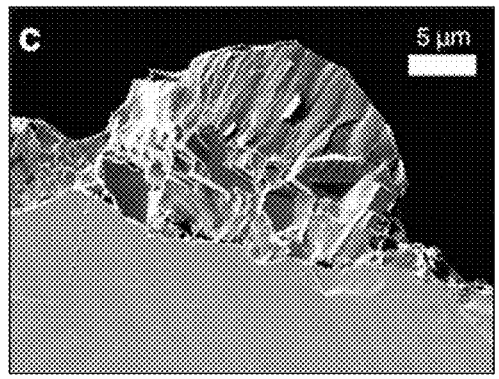
Figure 19D:
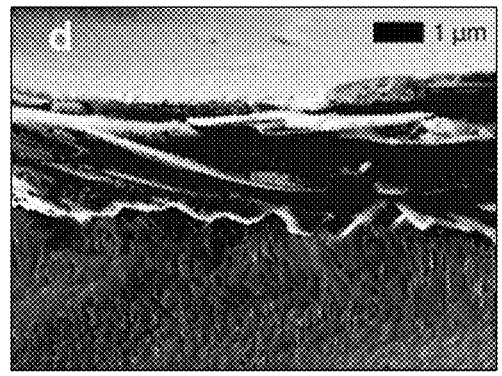

FIGS. 18A-18C. FIG. 18A shows the best energy resolution spectra from 81 keV $^{133}Ba$ peak for PSCs by category of surface treatment and contacting strategy, showing Gaussian fit lines superimposed on the measured data (black dots). FIG. 18B is a box plot of 81 keV $^{133}Ba$ peak energy resolutions by category versus detector yield of an untreated (1,2) and SAAT-treated (3,4) PSC, measured using Al point (1,3) and InGa eutectic (2,4) contacts. The box outlines show the $25^{th}$ (bottom) and $75^{th}$ (top) percentile energy resolution, the middle line shows the median resolution, and the central dot shows the mean resolution, and the crosshairs show the outliers. FIG. 18C shows a schematic of gamma ray absorption in PSCs through the photoelectric effect (left) and carrier relaxation to the PSC band edges (right).

FIGS. 19A-19D. Top-facet SEM images of an untreated (FIG. 19A) and SAAT-treated (FIG. 19B) PSC, showing SSG regions in the former that are lacking in the latter, which has a smooth surface. False-color cross-sectional SEM images of a cleaved untreated (FIG. 19C) and SAAT-treated (FIG. 19D) PSC. A sizeable (~200 μm²) cross-section of secondary growth, with a visible grain boundary and different grain orientation from the bulk, is shown in orange in (FIG. 19C) while the bulk PSC is uncolored. The surface zone in the SAAT-treated PSC, with a platelet-like structure, is shown in green in (FIG. 19D), while the bulk PSC is shown in brown. Scalebars are shown on the images.

FIG. 20A-20D. FIG. 20A shows a single-crystal x-ray diffraction (SC-XRD) pattern comparing untreated (−) and SAAT-Treated (−) PSCs, showing characteristic bulk MAPbI3 peaks (200), (224), and (400) at 2θ≈19.9°, 40.4°, and 40.6°, respectively. FIG. 20B shows a background-subtracted SC-XRD showing the presence of R—P hybrid perovskite materials (n=2), along with their characteristic peaks (020), (040), and (060) at 4.75°, 9.44°, and 12.75° respectively, in SAAT-treated PSCs, as well as their absence in untreated PSCs. FIG. 20C shows reflection-mode FTIR measurements of an untreated and SAAT-treated PSC. FIG.

20D shows a comparison between the photoluminescence of untreated (—, red circle) and SAAT-treated (—, blue circle) PSCs, using a measurement step size of 5 nm (red circle, blue circle) across the entire wavelength range (400-850 nm) as well as a finer step (-,-) in their specific regions of interest.

Figure 21A:
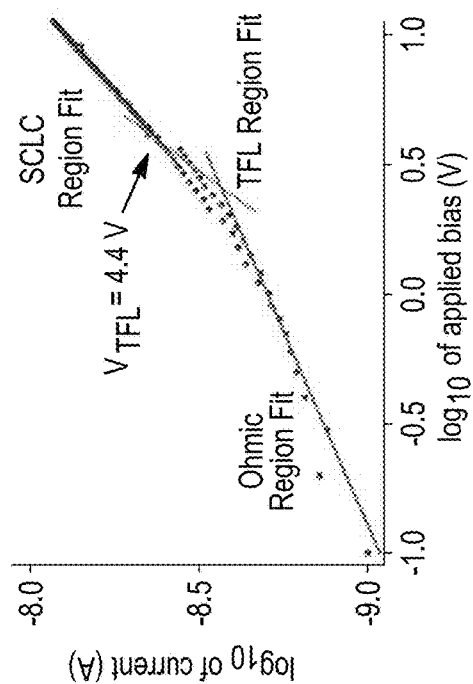
Figure 21B:
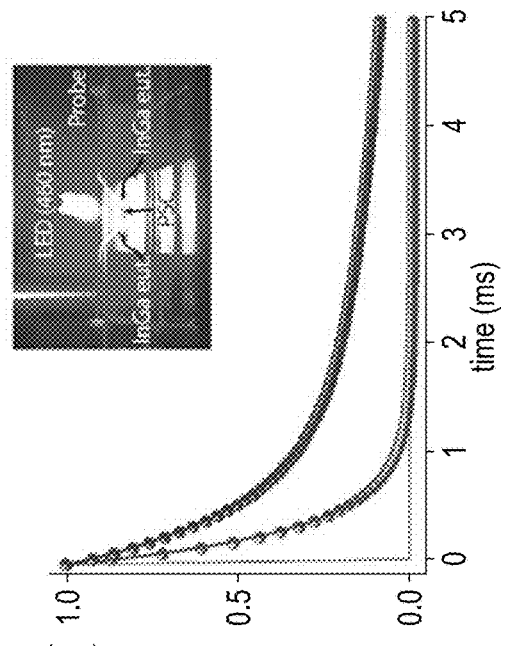
Figure 21C:
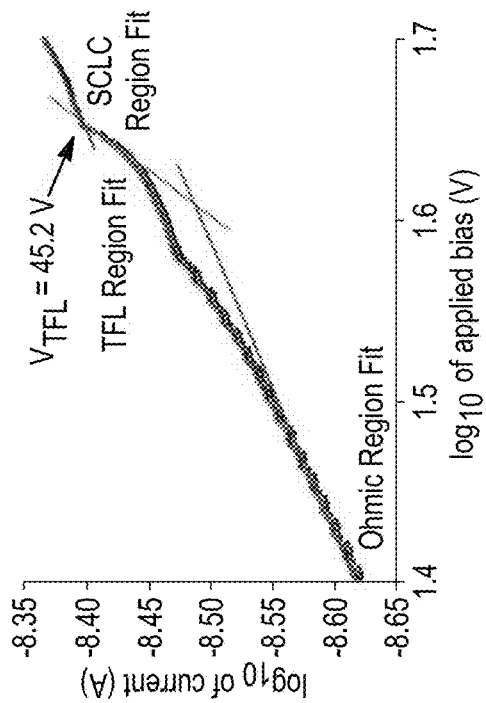
Figure 21D:
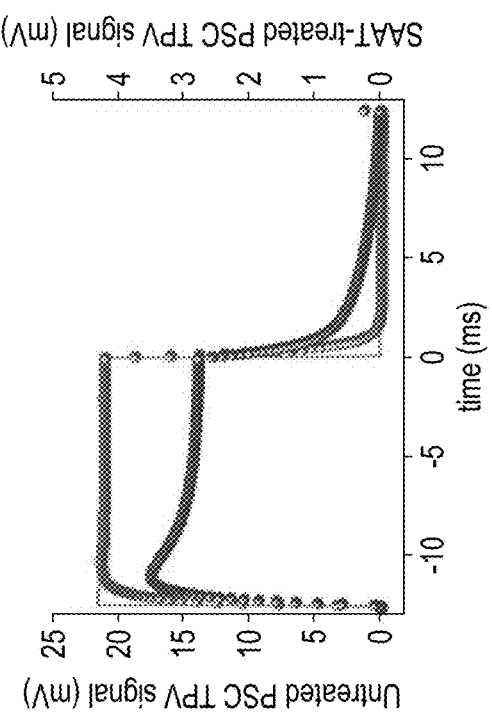

FIGS. 21A-21D. Mott-Gurney analysis of the I-V data (black circle) (after moving-average smoothing with a width of 7) curves for the untreated (FIG. 21A) and SAAT-treated (FIG. 21B) PSC showed characteristics of the three regimes of charge transport, as well as threshold biases between them. FIG. 21C shows transient photovoltage (TPV) signal of an untreated (red circle, left scalebar) and SAAT-treated (blue circle, right scalebar) PSC in response to a light pulse signal (-, normalized), used to calculate carrier lifetime. FIG. 21D shows normalized excess carrier concentration vs. time of an untreated (red circle) and SAAT-treated (blue circle) PSC, along with their corresponding exponential decay fits (-,-) used to calculate carrier lifetimes, shown with the normalized light pulse signal (-). The inset in FIG. 21D shows an image of a setup for measuring the TPV signal of a PSC, shown with a 460 nm LED, probes, and an InGa-contacted PSC.

FIGS. 22A-22C show comparative bulk heterojunctions. FIG. 22A is a conventional bulk perovskite single crystal with no surface treatment or passivation. FIG. 22B is a bulk perovskite single crystal having surface treatment or passivation, but without band alignment where no current flows. FIG. 22C shows a bulk perovskite single crystal having surface treatment or passivation with band alignment, where current does flow, prepared in accordance with certain aspects of the present disclosure.

FIG. 23 shows a schematic representing an example of a bulk perovskite crystal structure having a superlattice morphology.

Corresponding reference numerals indicate corresponding parts throughout the several views of the drawings.

DETAILED DESCRIPTION

Example embodiments are provided so that this disclosure will be thorough, and will fully convey the scope to those who are skilled in the art. Numerous specific details are set forth such as examples of specific compositions, components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, elements, compositions, steps, integers, operations, and/or components, but do not preclude the presence or addition of one or more other features, integers, steps, operations, elements, components, and/or groups thereof. Although the open-ended term "comprising," is to be understood as a non-restrictive term used to describe and claim various embodiments set forth herein, in certain aspects, the term may alternatively be understood to instead be a more limiting and restrictive term, such as "consisting of" or "consisting essentially of." Thus, for any given embodiment reciting compositions, materials, components, elements, features, integers, operations, and/or process steps, the present disclosure also specifically includes embodiments consisting of, or consisting essentially of, such recited compositions, materials, components, elements, features, integers, operations, and/or process steps. In the case of "consisting of," the alternative embodiment excludes any additional compositions, materials, components, elements, features, integers, operations, and/or process steps, while in the case of "consisting essentially of," any additional compositions, materials, components, elements, features, integers, operations, and/or process steps that materially affect the basic and novel characteristics are excluded from such an embodiment, but any compositions, materials, components, elements, features, integers, operations, and/or process steps that do not materially affect the basic and novel characteristics can be included in the embodiment.

Any method steps, processes, and operations described herein are not to be construed as necessarily requiring their performance in the particular order discussed or illustrated, unless specifically identified as an order of performance. It is also to be understood that additional or alternative steps may be employed, unless otherwise indicated.

When a component, element, or layer is referred to as being "on," "engaged to," "connected to," or "coupled to" another element or layer, it may be directly on, engaged, connected or coupled to the other component, element, or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various steps, elements, components, regions, layers and/or sections, these steps, elements, components, regions, layers and/or sections should not be limited by these terms, unless otherwise indicated. These terms may be only used to distinguish one step, element, component, region, layer or section from another step, element, component, region, layer or section. Terms such as "first," "second," and other numerical terms when used herein do not imply a sequence or order unless clearly indicated by the context. Thus, a first step, element, component, region, layer or section discussed below could be termed a second step, element, component, region, layer or section without departing from the teachings of the example embodiments.

Spatially or temporally relative terms, such as "before," "after," "inner," "outer," "beneath," "below," "lower," "above," "upper," and the like, may be used herein for ease of description to describe one element or feature's relationship to another element(s) or feature(s) as illustrated in the figures. Spatially or temporally relative terms may be intended to encompass different orientations of the device or system in use or operation in addition to the orientation depicted in the figures.

Throughout this disclosure, the numerical values represent approximate measures or limits to ranges to encompass minor deviations from the given values and embodiments having about the value mentioned as well as those having exactly the value mentioned. Other than in the working examples provided at the end of the detailed description, all numerical values of parameters (e.g., of quantities or conditions) in this specification, including the appended claims, are to be understood as being modified in all instances by the term "about" whether or not "about" actually appears before the numerical value. "About" indicates that the stated numerical value allows some slight imprecision (with some approach to exactness in the value; approximately or reasonably close to the value; nearly). If the imprecision provided by "about" is not otherwise understood in the art with this ordinary meaning, then "about" as used herein indicates at least variations that may arise from ordinary methods of measuring and using such parameters. For example, "about" may comprise a variation of less than or equal to 5%, optionally less than or equal to 4%, optionally less than or equal to 3%, optionally less than or equal to 2%, optionally less than or equal to 1%, optionally less than or equal to 0.5%, and in certain aspects, optionally less than or equal to 0.1%.

In addition, disclosure of ranges includes disclosure of all values and further divided ranges within the entire range, including endpoints and sub-ranges given for the ranges.

As used herein, the terms "composition" and "material" are used interchangeably to refer broadly to a substance containing at least the preferred chemical constituents, elements, or compounds, but which may also comprise additional elements, compounds, or substances, including trace amounts of impurities, unless otherwise indicated.

As referred to herein, the word "substantially," when applied to a characteristic of a composition or method of this disclosure, indicates that there may be variation in the characteristic without having a substantial effect on the chemical or physical attributes of the composition or method.

Example embodiments will now be described more fully with reference to the accompanying drawings.

Figure 1:
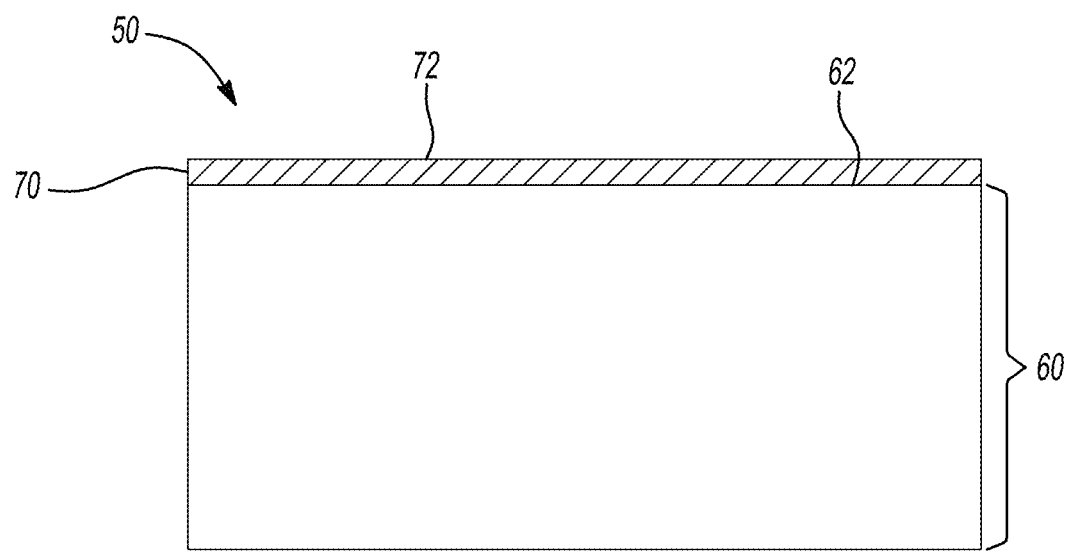

In certain aspects, as shown in FIG. 1, the present disclosure provides a stable hybrid perovskite material 50 that includes a bulk region 60 on which a smooth perovskite layer 70 is formed. A boundary 62 is defined between the bulk region 50 and the smooth perovskite layer 70. The smooth perovskite layer 70 defines an exposed surface 72 of the stable hybrid perovskite 50 material. The bulk region 60 and smooth perovskite layer 70 each comprise crystals having a perovskite structure, as recognized by those of skill in the art. However, the bulk region 60 and the smooth perovskite layer 70 may differ from one another, for example, in composition and/or crystallinity. In certain aspects, the bulk region 60 comprises a single crystal perovskite. The bulk region 60 can thus form a bulk perovskite absorber (BPA). A single crystal perovskite material having a composition represented by formula $ABX_3$. In various aspects, A represents one or more cations. The cations may be formed of one or more atoms. The cations may have +1 or +2 charge. In certain variations, A is at least one organic or metallic cation having a +1 or +2 charge. In certain variations, A may be selected from the group consisting of: methylammonium ($CH_3NH_3^+$), ethylammonium ($C_2H_8N^+$), formamidinium ($NH_2CHNH_2^+$), and combinations thereof. In other variations, A may comprise boron, for example, being boron or a boron-containing cation.

B also represents one or more cations. The cations may comprise one or more atoms and each cation has a +2 or +4 charge. In certain variations, B is at least one inorganic cation having a +2 or +4 charge. In certain variations, B comprises lead (II) ($Pb^{2+}$).

X represents one or more anions. Each anion may comprise one or more atoms. Each anion may have a −1 or −2 charge. In certain variations, X is an anion selected from the group consisting of: chloride ($Cl^−$), iodide ($I^−$), bromine (Br—), and combinations thereof.

In certain variations, a largest monocrystalline component of the perovskite single crystal material in the bulk region 60 has a volume of greater than or equal to about 0.02 μL and in certain aspects, optionally greater than or equal to about 0.05 μL.

The material forming the bulk region 60, for example, the single crystal perovskite material, has a first bandgap or energy difference between the material's valence band and conduction band (e.g., an energy level where no electron states exist for the material). Furthermore, the material in the bulk region 60 may have a density of trap states of less than or equal to about $10^{13}$ $cm^{-3}$, optionally less than or equal to about $10^{12}$ $cm^{-3}$, optionally less than or equal to about $10^{11}$ $cm^{-3}$, and in certain variations, optionally less than or equal to about $10^{10}$ $cm^{-3}$.

In certain aspects, the single crystal perovskite material that forms the bulk region 60 in accordance with certain aspects of the present disclosure has a relatively low surface roughness, although the relatively diminished surface roughness may be too high to avoid the disadvantages associated with typical single crystal perovskite materials, thus requiring the presence of the smooth perovskite layer 70.

The single crystal perovskite material may have a surface roughness measured by a root mean squared (RMS) surface roughness (e.g., from peaks to valleys) is less than or equal to about 20% of a total thickness of the single crystal perovskite material in the bulk region 60, optionally less than or equal to about 15% of the total layer thickness, optionally less than or equal to about 10% of the total layer thickness, optionally less than or equal to about 5% of the total layer thickness, optionally less than or equal to about 1% of the total layer thickness, optionally less than or equal to about 0.5% of the total layer thickness, and in certain aspects, optionally less than or equal to about 0.1% of the total layer thickness.

In certain variations, a thickness of the bulk region 60 is greater than or equal to about 1 mm, optionally greater than or equal to about 1.5 mm, and in certain variations, optionally greater than or equal to about 2 mm. The single crystal perovskite in the bulk region 60 may have a surface roughness of less than or equal to about 10 micrometers (μm) root mean squared (RMS), where an overall thickness of the film is at least about 1 mm. In other variations, a surface of the single crystal perovskite in the bulk region 60 may be less than or equal to about 5 μm root mean squared (RMS), where an overall thickness of the film is at least about 1 mm.

In various aspects, the bulk region 60 has the smooth perovskite layer 70 disposed thereon to form the stable hybrid perovskite material 50. The smooth perovskite layer 70 has a second bandgap that is greater than the first bandgap of the bulk region 60. As appreciated by those of skill in the art, with different chemistries in the respective materials, the bandgap properties may change. In certain variations, a first bandgap of the bulk region 60 may be less than or equal to about 3.5 eV, optionally less than or equal to about 3 eV, optionally less than or equal to about 2.5 eV, optionally less than or equal to about 2 eV, optionally less than or equal to about 1.75 eV, and in certain variations, less than or equal to about 1.6 eV.

In certain other variations, a second bandgap of the smooth perovskite layer 70 may be less than or equal to about 6.5 eV, optionally less than or equal to about 6 eV, optionally less than or equal to about 5.5 eV, optionally less than or equal to about 5 eV, optionally less than or equal to about 4.5 eV, optionally less than or equal to about 4 eV, optionally less than or equal to about 3.5 eV, optionally less than or equal to about 3 eV, and in certain variations, less than or equal to about 2.5 eV.

Thus, in certain variations, a difference between the first bandgap of the bulk region 60 and the second bandgap of the smooth perovskite layer 70 is greater than or equal to about 0.6 eV, optionally greater than or equal to about 0.7 eV, optionally greater than or equal to about 0.8 eV, and in certain variations, optionally greater than or equal to about 0.9 eV.

In one variation, the first bandgap of the bulk region 60 is about 1.5 to about 1.6 eV, while the second bandgap of the smooth perovskite layer 70 is around 2.4 eV. Thus, a difference between the first bandgap of the bulk region 60 and the second bandgap of the smooth perovskite layer 70 is greater than or equal to about 0.8 eV to about 0.9 eV.

In certain aspects, the smooth perovskite layer 70 has a smooth surface, in contrast to traditional bulk perovskite materials, such as single crystal organohalide perovskites, suffer from a relatively rough surface, as well as inferior quality and electronic properties. For example, a density of bulk trap states in the smooth perovskite layer 70 prepared in accordance with certain aspects of the present disclosure that is unshielded may be less than or equal to about $10^{16}$ cm$^{-3}$, optionally less than or equal to about $10^{15}$ cm$^{-3}$, optionally less than or equal to about $10^{14}$ cm$^{-3}$, and in certain variations, optionally less than or equal to about $10^{13}$ cm$^{-3}$.

A difference between a density of trap states in the material forming the bulk region 60 and a material forming the smooth perovskite layer 70 may be a proportionality constant of less than or equal to about $10^7$, optionally less than or equal to about $10^6$, optionally less than or equal to about $10^5$, optionally less than or equal to about $10^4$, and in certain aspects, optionally less than or equal to about $10^3$. In this manner, the phenomenon of band-bending observed at boundary 62 is diminished or eliminated, which reduces current leakage, increases bulk field strength and can stabilize and reduce chemical degradation of the bulk region 60 perovskite material.

In contrast to prior perovskite structures, including those with conventionally passivated surfaces, the perovskite layer 70 is smooth and provides high electrical conductivity and low loss. By a "smooth" surface, it is meant that a root mean squared (RMS) of measured surface roughness (e.g., from peaks to valleys) is less than or equal to about 20% of a total thickness of the perovskite layer 70, optionally less than or equal to about 15% of the total layer thickness, optionally less than or equal to about 14% of the total layer thickness, optionally less than or equal to about 13% of the total layer thickness, optionally less than or equal to about 12% of the total layer thickness, optionally less than or equal to about 11% of the total layer thickness, optionally less than or equal to about 10% of the total layer thickness, optionally less than or equal to about 9% of the total layer thickness, optionally less than or equal to about 8% of the total layer thickness, optionally less than or equal to about 7% of the total layer thickness, optionally less than or equal to about 6% of the total layer thickness, and in certain variations, optionally less than or equal to about 5% of the total layer thickness.

In certain variations, a thickness of the perovskite surface layer 70 is greater than or equal to about 10 nm to less than or equal to about 50 micrometers, optionally greater than or equal to about 25 nanometers to less than or equal to about 50 micrometers, optionally greater than or equal to about 50 nanometers to less than or equal to about 50 micrometers, optionally greater than or equal to about 100 nanometers to less than or equal to about 25 micrometers, optionally greater than or equal to about 250 nanometers to less than or equal to about 25 micrometers, optionally greater than or equal to about 500 nanometers to less than or equal to about 25 micrometers, optionally greater than or equal to about 750 nanometers to less than or equal to about 25 micrometers, optionally greater than or equal to about 1 micrometer to less than or equal to about 25 micrometers, optionally greater than or equal to about 2 micrometers and less than or equal to about 25 micrometers, optionally greater than or equal to about 2 micrometers and less than or equal to about 10 micrometers, and in certain aspects, optionally greater than or equal to about 2 micrometers and less than or equal to about 5 micrometers. In certain variations, the thickness of the perovskite surface layer 70 is greater than or equal to about 500 nm (0.5 μm) to less than or equal to about 10 micrometers.

As appreciated by those of skill in the art, ascertaining smoothness of a film is relative and depends on an overall thickness of the film or layer, where greater amounts of root mean squared (RMS) surface roughness can still considered to be smooth if a film is thicker. In certain variations, a smooth surface of the smooth perovskite layer 70 has a surface roughness of less than or equal to about 2.5 nm root mean squared (RMS), where an overall thickness of the film is at least about 10 nanometers. In other variations, a smooth surface is one where a surface roughness of less than or equal to about 50 nm root mean squared (RMS), where an overall thickness of the film is at least about 1 micrometer (μm).

As noted above, the material forming the smooth perovskite layer 70 may have a perovskite crystal structure. In certain variations, the smooth perovskite surface layer 70 comprises a Ruddlesden-Popper perovskite. Ruddlesden-Popper perovskites generally include two-dimensional perovskite-like planar structures that have cations disposed therebetween. Such a Ruddlesden-Popper perovskite may be represented by the formula $A^1_k A^2_{n+1} B^1_n X^1_{3n+1}$. In various aspects, $A^1$ and $A^2$ each represent one or more cations. The cations may be formed of one or more atoms. The cations may have +1 or +2 charge. In certain variations, $A^1$ and $A^2$ are each at least one cation having a +1 or +2 charge. In certain variations, $A^1$ and $A^2$ are each at least one organic cation having a +1 or +2 charge.

By way of non-limiting example, $A^1$ may be an organoamine compound, such as methylammonium ($CH_3NH_3^+$), formamidinium ($NH_2CHNH_2^+$), or longer-chain organoamine compounds, such as octylamine, dodecylamine, octyldiamine, and dodecyldiamine, or a phenolic and other branched chain organoamine variant. Likewise, by way of non-limiting example, $A^2$ may be an organoamine compound, such as methylammonium ($CH_3NH_3^+$), dimethylammonium ($C_2H_8N^+$), ethylammonium ($C_2H_8N^+$), diethylammonium ($C_4H_{12}N^+$), or formamidinium ($NH_2CHNH_2^+$), cesium ($Cs^+$), rubidium ($Rb^+$), guanidinium, imidazolium, piperidinium, and any combinations thereof.

In certain variations, $A^1$ or $A^2$ may be independently selected from the group consisting of: methylammonium ($CH_3NH_3^+$), ethylammonium ($C_2H_8N^+$), formamidinium ($NH_2CHNH_2^+$), and combinations thereof.

$B^1$ also represents one or more cations. The cations may comprise one or more atoms and each cation has a +2 or +4 charge. In certain variations, $B^1$ is at least one inorganic cation having a +2 or +4 charge. In certain variations, $B^1$ comprises lead (II) ($Pb^{2+}$). $B^1$ may be the same as B in the single crystal perovskite of the bulk region 60.

$X^1$ represents one or more anions. Each anion may comprise one or more atoms. Each anion may have a −1 or −2 charge. In certain variations, $X^1$ is an anion selected from the group consisting of: chloride ($Cl^-$), iodide ($I^-$), bromine (Br—), and combinations thereof. $X^1$ may be the same as X in the single crystal perovskite of the bulk region 60.

"n" may be an integer and in certain aspects, represents a number of layer of octahedra in a perovskite-like stack in the Ruddlesden-Popper structure. "k" ranges from greater than or equal to 1 to less than or equal to 2. k is generally either 1 or 2; however, a blend of k=1 and k=2 chemistries are also contemplated, such that k may range from greater than or equal to 1 to less than or equal to 2, depending on the blend of different compositions included in the smooth perovskite layer 70.

In certain aspects, $A^1$ is selected to be a cation of appropriately large size, such that it inhibits or prevents formation of a $B^1X^1_3$ superlattice, where the superlattice has a cubic, orthorhombic, or tetragonal crystal structure. In one example shown in FIG. 23, a bulk perovskite crystal structure 200 is shown for a generic formula $ABX_3$. The bulk perovskite crystal structure 200 includes: X anions 210, B cations 220, as well as A cation(s) 240. As shown, a superlattice 242 refers to the corner points of the cube, which are formed by the octahedra defined by the dots representing X anions 210 and inner dot representing B cations 220). The large cationic species A (A cation 240) resides in a center of the superlattice 242. Each octahedra, by themselves, has a formula $BX_6^{4-}$. In the bulk perovskite crystal structure 200, all corner X atoms 210 are shared with their nearest neighbors, leading to a bulk formula of $ABX_3$. However, if the A cation 240 is large enough, it can prevent the octahedra from being close enough to share the X anions 210, so the $BX_3$ cubic superlattice is separated into $BX_4$ planes or $BX_5$ rods.

As will be appreciated by those of skill in the art, the lattice is mainly identified by the crystal structure, as there are thousands of potential specific chemistries for both the bulk and R—P perovskites. The type and order of these materials can be identified by crystallographic analysis techniques (e.g., by XRD, SAXS) to categorize different crystalline morphologies. In certain aspects, there may be advantages associated with avoiding a three-dimensional (3-D) superlattice like superlattice 242 in the bulk perovskite crystal structure 200 shown in FIG. 23. In certain aspects, the bandgap of the crystal material is higher due to the increased average distance between the B atom/cation and X atom/anion orbitals. Secondly, $A^1$ can be chosen to provide chemical stability and prevent degradation of the overall material, which is difficult to do with the small molecular ions of $A^2$.

Thus, in certain aspects, the smooth perovskite layer 70 in certain regions may be "substantially free" of a $B^1X^1_3$ superlattice, meaning that the crystal structure or species is absent in such regions to the extent that undesirable and/or detrimental effects are negligible or nonexistent. In certain aspects, a region of a layer that is "substantially free" of such superlattice crystal structures comprises less than or equal to about 1% by volume, optionally less than or equal to about 0.5% by volume, optionally less than or equal to about 0.1% by volume, and in certain preferred aspects, 0% by volume of the undesired superlattice crystal species.

In certain aspects, $A^2$ is selected to be a cation of appropriately small size, such that it promotes or enables formation of a $B^1X^1_3$ superlattice, where the superlattice has a cubic, orthorhombic, or tetragonal crystal structure. Thus, in certain aspects, the smooth perovskite layer 70 in select regions may contain a $B^1X^1_3$ superlattice.

In certain variations, the material forming the smooth perovskite layer 70 may have a perovskite crystal structure and may comprise a plurality of nanocrystals or nanoplates or nanoplatelets. In certain aspects, the smooth perovskite layer 70 comprises multiple layers of nano-sized platelets. In certain variations, a thickness of a nanocrystal or nanoplate may be greater than or equal to about 10 nm to less than or equal to about 200 nm, with a lateral dimension being greater than or equal to about 50 nm but less than or equal to about 10 micrometers (μm). The smooth perovskite layer 70 may thus comprise mono or multi-molecular layers of material chemically or ionically bonded to the underlying PSC surface in the bulk region, which reduces the presence of surface dangling bonds and associated carrier trapping states within the PSC bandgap.

In this manner, a stable hybrid perovskite material that includes a bulk region comprising a perovskite and a smooth perovskite surface layer is formed that provides desirable optical, electrical, and electronic properties, as described further below.

The present disclosure also contemplates methods for making such stable hybrid perovskite materials. One suitable method is known an inverse-temperature crystallization process that forms single crystal perovskites. For example, in certain variations, optimized crystallization of perovskite single crystals (PSCs) from solution occurs via such an inverse-temperature crystallization process. In other aspects, the present disclosure provides devices for controlled crystallization of perovskite single crystals (PSCs). Finally, the present disclosure also contemplates processes for surface passivation of solution-grown perovskite single crystals (PSCs) to form the smooth perovskite containing surface layer.

In certain aspects, a precursor solution is prepared that comprises a perovskite precursor and at least one solvent. A precursor solution may include one or more salts or other compounds that form a perovskite precursor. The perovskite crystal may be a single crystal perovskite as described above in the context of a suitable material for the bulk region of the stable hybrid perovskite material, for example, having the formula $ABX_3$. After mixing the precursor components together in solvent, the perovskite precursor may be represented by formula $RBX_3$, where B and X are as defined above. R may be an organoamine cation or an alkali ion, a portion of which may form A in the perovskite formula. Thus, R may contain at least one organic group and a nitrogen in certain aspects. In certain variations, B is lead (Pb), so that the precursor comprises $RPbX_3$. In such a variation, the precursor solution comprises an organoamine halide (e.g., R—HX) salt, lead halide ($PbX_2$) salt, and solvent.

The solvent may be a polar solvent. In certain aspects, an appropriate solvent is capable of dissolving at least three of the elements provided in the precursor compounds and/or salts to a concentration of at least about 0.2 M at 60° C. In certain variations, the polar solvent may be dimethylformamide (DMF), gamma-butyrolactone (GBL, GBA, or GABA), dimethylsulfoxide (DMSO), combinations thereof and the like.

The precursor salts and solvents may be mixed at a concentration of greater than or equal to about 0.7 and 1.4 M for X=I, greater than or equal to about 0.3 to less than or equal to about 0.9 M for X=Br, and greater than or equal to about 0.2 to less than or equal to about 1.2 M for X=Cl. The precursor solution may be continuously stirred for 8 to 12 hours at a temperature of greater than or equal to about 45° C. to less than or equal to about 85° C.

Inverse temperature crystallization processes for perovskite single crystals for forming the bulk region of the stable hybrid perovskite material according to certain aspects of the present disclosure are shown in FIGS. 2A-2B. In FIG. 2A, a first process according to certain aspects of the present disclosure is shown. A crystallization dish that can be incorporated into a reaction chamber of a reactor vessel has an octadecyltrichlorosilane (OTS)-coated glass substrate and sidewalls formed of a polymeric material, such as polydimethylsiloxane (PDMS). In certain aspects, the crystallization vessel comprises a flat bottom substrate with a surface roughness under 100 nm. Further, in certain aspects, the flat bottom may have a modified surface energy such that the contact angle of the precursor solution to the vessel is greater than 90 degrees, when measured between the interface between a droplet of the solution and the flat bottom and the outer surface of the droplet adjacent to the aforementioned interface.

In the first step shown at (1), the precursor solution is introduced into the crystallization dish where it is in a prenucleation or pre-seed state. The precursor solution is heated to a prenucleation temperature for a first duration of time. Next in step (2), the temperature of the precursor solution is raised to a nucleation temperature to facilitate crystal seeding. Next at step (3), the precursor solution is maintained at a crystal growth temperature that facilitates growth of a perovskite crystal, here, a single crystal perovskite. Finally, at step (4), the remaining precursor solution, including solvent, is removed and the crystal(s) formed are dried, where they can subsequently be removed.

Figure 3A:
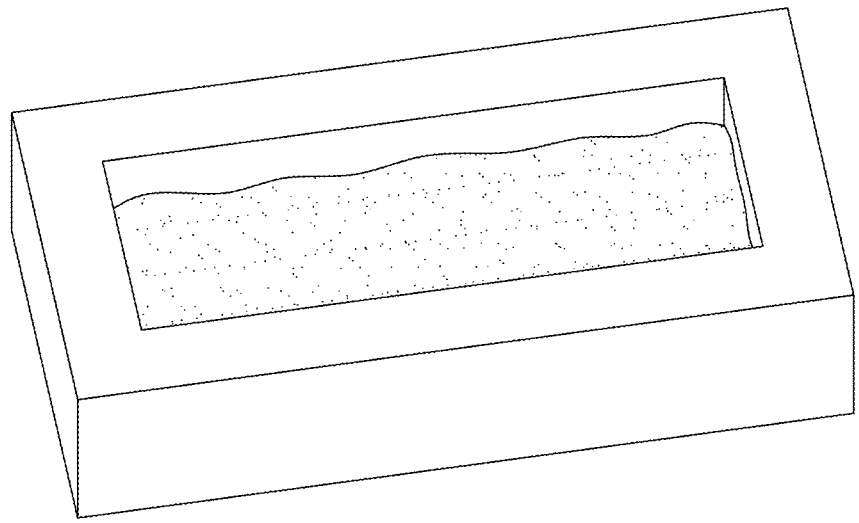
Figure 3B:
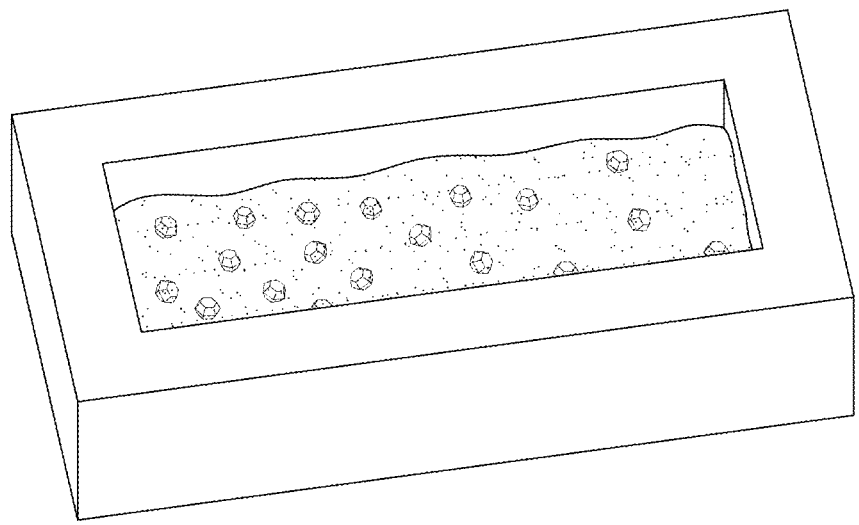
Figure 3C:
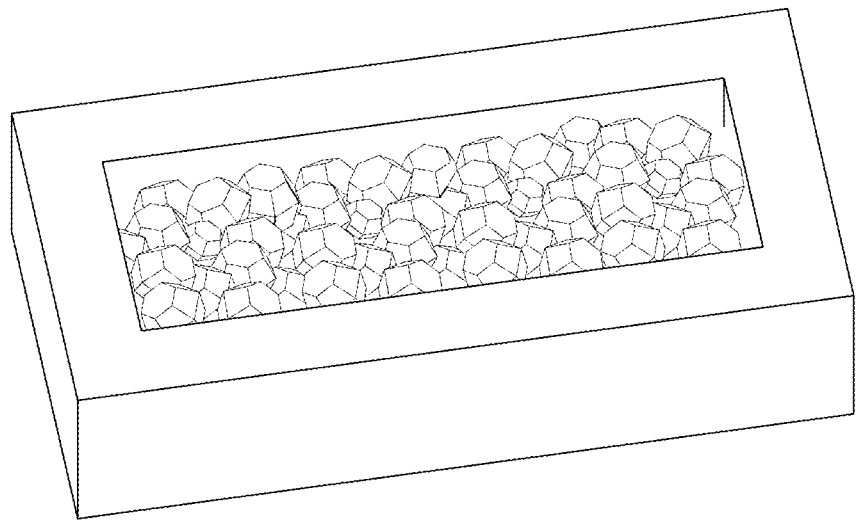

FIGS. 3A-3C show images of a flat crystallization dish during an inverse temperature crystallization process that forms perovskite single crystals (PSCs). FIG. 3A shows a nucleation phase, FIG. 3B shows crystallization and growth of PSCs, while FIG. 3C shows a drying of the PSC.

In FIG. 2B, a second process according to certain aspects of the present disclosure is conducted in a crystallization dish like that described in the context of FIG. 2A (e.g., having an OTS-coated glass substrate and PDMS sidewalls). The inverse crystallization process in FIG. 2A may have somewhat limited perovskite single crystal growth due to a limited amount of solvent available from the precursor for volatilization/evaporation. In FIG. 2B, additional solvent (or alternatively, additional precursor solution) is added during the inverse crystallization process and therefore permits the formation of significantly larger single crystal perovskite structures. In the first step shown at (1), the precursor solution is introduced into the crystallization dish where it is in a prenucleation or pre-seed state. The precursor solution is heated to a prenucleation temperature for a first duration of time. Next in step (2), the temperature of the precursor solution is raised to a nucleation temperature to facilitate crystal seeding. Next at step (3), the precursor solution is maintained at a crystal growth temperature that facilitates growth of a perovskite crystal, here, a single crystal perovskite. In step (4), additional solvent is added to the crystallization dish during the growth phase to maintain a level of the precursor solution. The added solvent may be preheated to the growth temperature prior to introduction into the crystallization dish to avoid temperature fluctuations. The growth period continues for a second time duration as shown in step (5). At step (6), the remaining precursor solution, including solvent, is removed and the crystal(s) formed are dried, where they can subsequently be removed. In this manner, the alternative inverse temperature process described in the context of FIG. 2B allows the formation of significantly larger perovskite single crystals (PSCs).

Thus, in certain aspects, the precursor solution is introduced into a growth chamber of a vessel where the inverse-temperature crystallization will occur. Such a vessel may be a specialized crystallization device, as briefly described above and as will be described further below. The growth chamber in the vessel may be sealable. In certain variations, the growth chamber within the vessel may be a flat-bottomed crystallization dish. The crystallization dish may have a depth of between about 0.5 and about 1 cm. For example, approximately 5 mL of precursor solution may be added to a crystallization dish having a total volume of about 12 mL. The vessel can include a heating mechanism associated with a controller to heat the growth chamber and/or precursor therein to a specific temperature, corresponding to specific crystallization stages and/or setpoints. In certain variations, the heating mechanism may be a hotplate or other heating element. The precursor solution may be introduced into the vessel, for example, by pouring or pumping. A temperature of the precursor solution is then optionally adjusted to the following crystallization setpoints: a pre-nucleation temperature, a nucleation temperature, and a crystal growth temperature.

In certain aspects, a pre-nucleation temperature may be greater than or equal to about 75° C. to less than or equal to about 90° C., optionally at greater than or equal to about 80° C. to less than or equal to about 84° C. The crystallization dish in the growth chamber may be maintained at the pre-nucleation temperature for greater than or equal to about 1 hour to less than or equal to about 5 hours, for example, in certain aspects, about 2 hours or until spontaneous nucleation is observed. In certain aspects, the pre-nucleation temperature corresponds or relates to a temperature, a concentration, or both a temperature and a concentration of the precursor solution so that the precursor solution is at or slightly above a saturation point, but below a spontaneous nucleation point, which corresponds to a crystal growth regime.

Nucleation of the precursor solution is then initiated. Nucleation can thus be induced by increasing a temperature of the crystallization dish in the growth chamber/precursor solution by greater than or equal to about 2° C. to less than or equal to about 8° C. above the pre-nucleation temperature, optionally at greater than or equal to about 2° C. to less than or equal to about 5° C. In certain aspects, the nucleation temperature corresponds to a temperature, a concentration, or both a temperature and a concentration of the precursor solution so that the precursor solution is at or above a point of onset of spontaneous nucleation where nucleation occurs and seed crystals begin to form (for example, for a specific solution concentration, a temperature up to 20% higher than the supersaturation point or for a specific temperature, a concentration up to 20% higher than the supersaturation point).

After a plurality of seed crystals are formed, for example, in certain variations greater than or equal to about 5 to less than or equal to about 30 spaced apart seed crystals, for example, greater than or equal to about 3 mm apart from adjacent seed crystals, the temperature may be reduced to a crystal growth temperature. The crystal growth temperature may be about 2° C. to about 5° C. less than the nucleation temperature, optionally about 2 to about 3° C. less than the nucleation temperature to enable growth of the existing seeds, while inhibiting further spontaneous nucleation of new seed crystals. During the process of growing the single crystal perovskite material, greater than or equal to about 10% by volume of the precursor solution in the vessel is between (i) a saturation temperature and a spontaneous nucleation temperature, (ii) a saturation concentration and a spontaneous nucleation concentration, or both (i) and (ii). In certain aspects, the method may further comprise adding additional solvent or adding additional precursor solution into the crystallization chamber of the reactor vessel during the growing the single crystal perovskite material to maintain greater than or equal to about 10% by volume of the precursor solution in the vessel between (i) a saturation temperature and a spontaneous nucleation temperature, (ii) a saturation concentration and a spontaneous nucleation concentration, or both (i) and (ii). The crystal growth temperature may be adjusted while the crystals grow, based on the seed crystal size (increased with increasing size) or solution concentration (observed from the color and darkness of the solution, decreased with increasing concentration) to maintain this regime of controlled crystal growth. Crystal growth continues at the crystal growth temperature. In one variation, like that described in the context of FIG. 2B, a level of the solution in the crystallization dish is maintained during the growth stage, by adding solvent to the crystallization dish, and adjusting the temperature accordingly to maintain growth.

The growth can be stopped after perovskite single crystals in the vessel have reached a predetermined size. For example, after perovskite single crystals reach an appropriate size, for example, greater than or equal to about 2 mm in length or having a volume of greater than or equal to about 1 mm$^3$, growth can be discontinued. Growth of the crystal will cease after remaining precursor material, including solvent, in the growth chamber is removed, by way of example. Alternatively, after solvent evaporation had exposed the top facets of the perovskite single crystals (PSCs), the crystals may be removed. In certain aspects, a plurality of perovskite single crystals may be formed in a single batch, for example, about 20 single crystals. Stopping the crystallization involves either physically removing the crystals from the crystallization vessel or draining the precursor solution from the vessel. After the solution is drained, the crystals can be left to dry in the vessel, generally at a lower temperature than that promoting growth, but higher than ambient or room temperature conditions. Usually, this is around or slightly lower than the pre-nucleation temperature. In certain aspects, excess solution can be drained from the crystallization dish and the PSCs removed from the solution. The vessel may be cooled to a temperature below the nucleation temperature.

In certain aspects, the method includes ceasing the growth of the single crystal perovskite material by one or more of the following: (i) removing the single crystal perovskite material from the crystallization chamber or dish; (ii) removing greater than or equal to about 40% of precursor solution from the crystallization dish; and (iii) drying the single crystal perovskite material in the crystallization dish at a temperature of greater than or equal to about 55° C.

PSCs can be dried, by way of non-limiting example, on the crystallization dish for approximately 8 to 12 hours at a temperature of greater than or equal to about 80° C. to less than or equal to about 100° C., in one example. In such inverse-temperature crystallization methods, cationic metal halide perovskite single crystals are formed for incorporation into bulk regions of stable hybrid perovskite materials in accordance with certain aspects of the present disclosure.

Figure 4B:
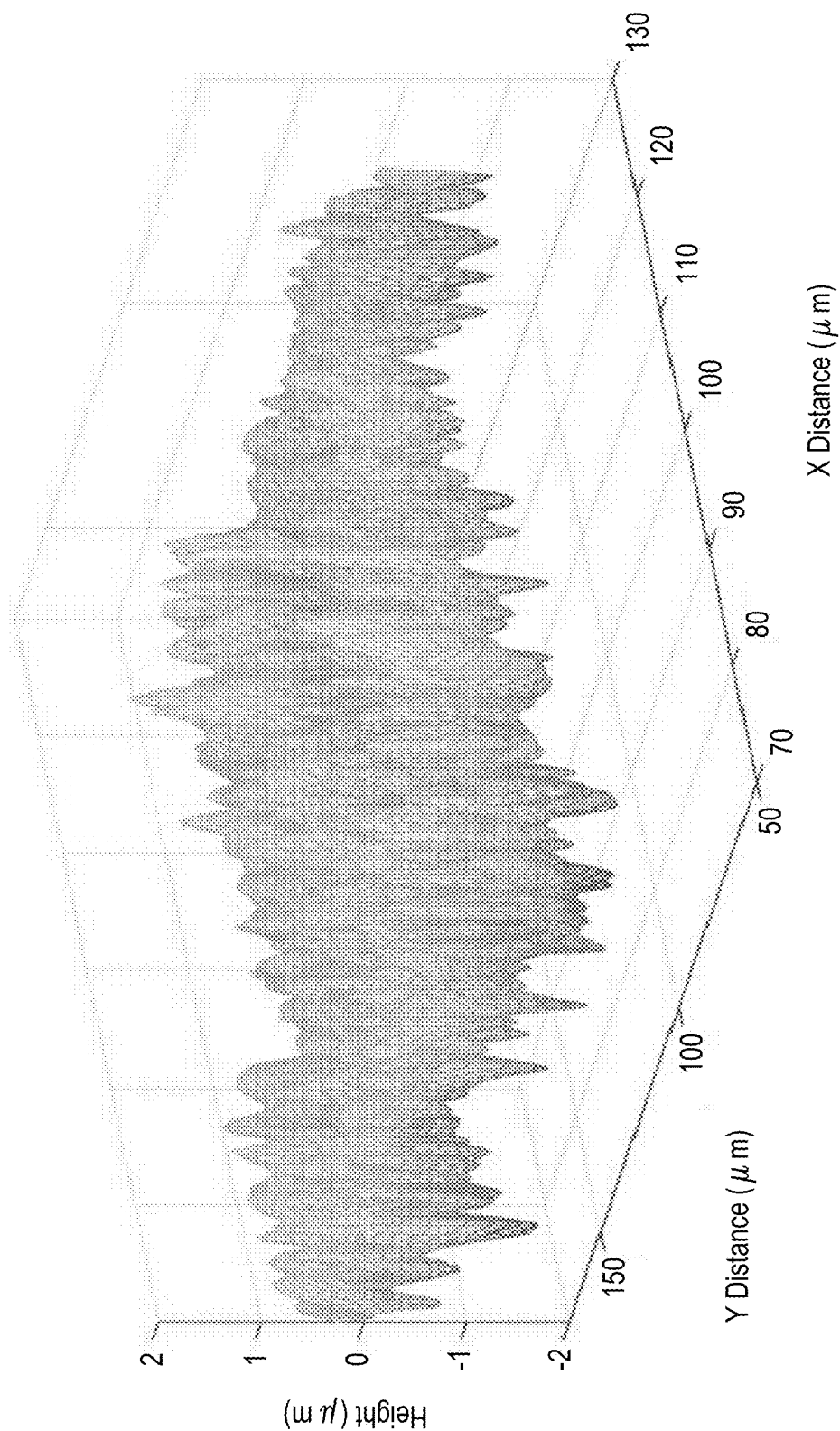

In certain aspects, the inverse temperature crystallization processes for perovskite single crystals provided by the present disclosure are optimized and result in a reduced surface roughness for the perovskite single crystals (PSCs) formed, as shown through comparative optical interferometry measurements in FIGS. 4A-4B.

Figure 4C:
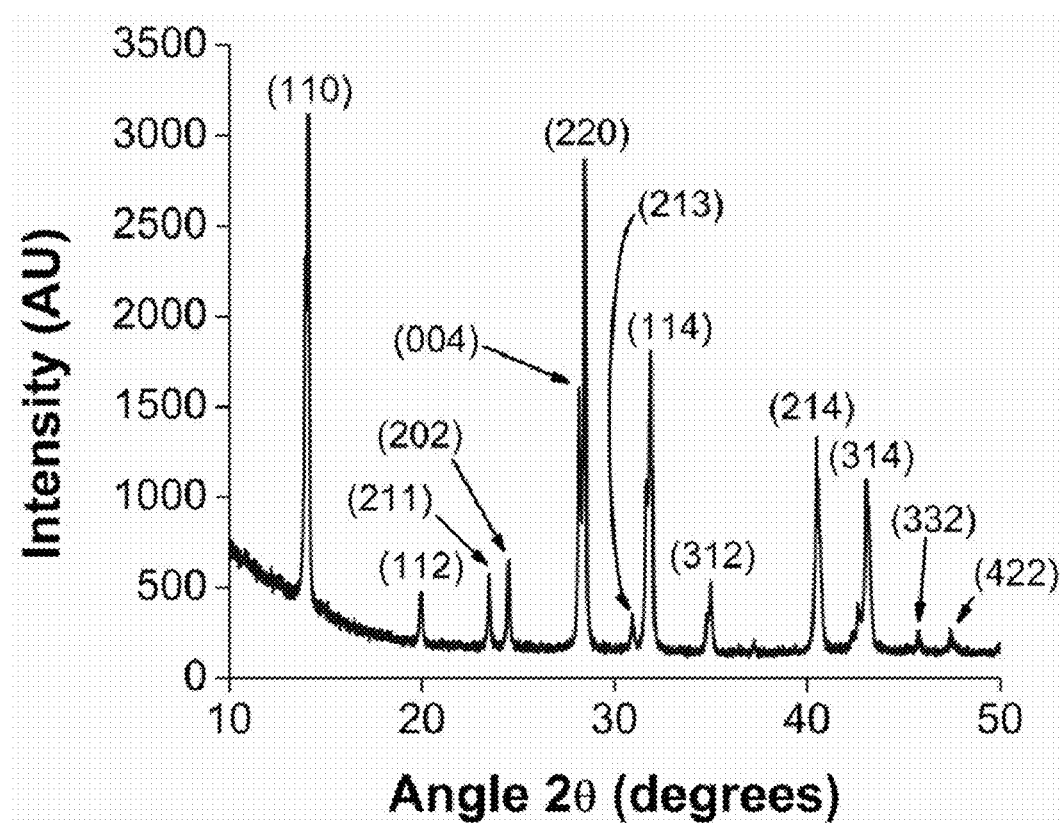

FIG. 4A shows analysis of a perovskite single crystal (PSC) formed via conventional inverse crystallization process described in both Liu, Y. et al., "Two-Inch-Sized Perovskite $CH_3NH_3PbX_3$(X=Cl, Br, I) Crystals: Growth and Characterization," Advanced Materials, 27 (35), 5176-5183 (2015); and Saidaminov, M. I. et al, "High-quality hybrid perovskite single crystals within minutes by inverse temperature crystallization," Nature Communications, 6, 7586 (2015) the relevant portions of which are incorporated herein by reference. FIG. 4B shows analysis of a perovskite single crystal (PSCs) prepared in accordance with the inverse temperature crystallization processes provided by the present teachings. FIG. 4C shows that both conventional PSCs and optimized crystallization process PSCs conducted in accordance certain aspects of the present disclosure form pure PSCs with minimal impurities, especially when PXRD plots are compared to literature. The PSC surface roughnesses are measured through LEXT optical profilometry. The differences between conventional and optimized crystallization conditions according to certain aspects of the present disclosure could not explain the perceived reduction in electric field uniformity or other performance loss mechanisms between the two. Specifically, characterizing the difference between short-range (less than or equal to about 100 nm) and long-range (greater than or equal to about 1 µm) surface roughness was of key importance, because the latter could greatly influence electric field distribution and slow down charge transport, reducing detection resolution.

Figure 5A:
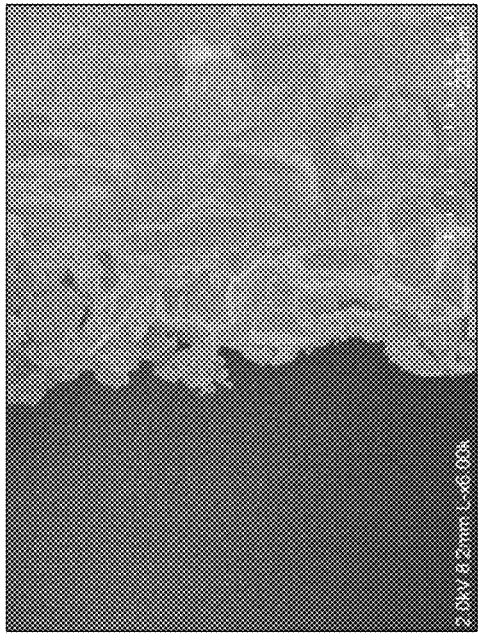
Figure 5B:
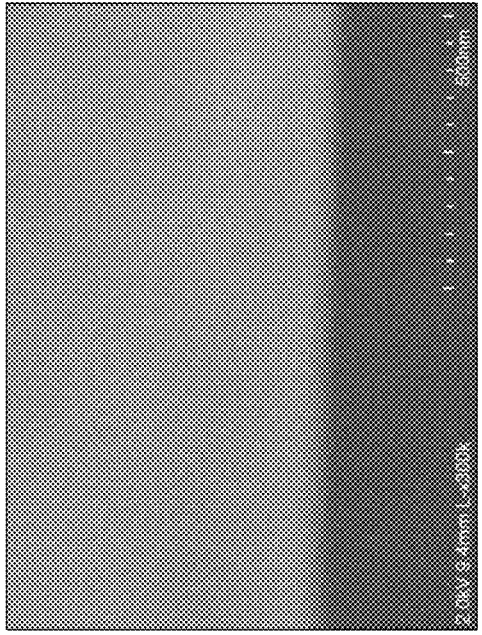
Figure 5C:
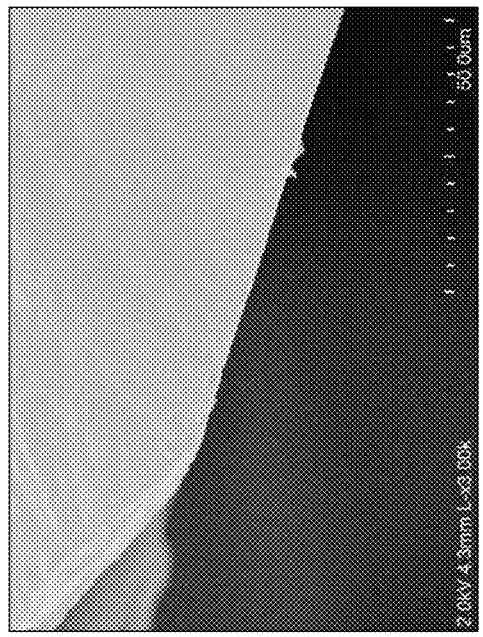
Figure 5D:
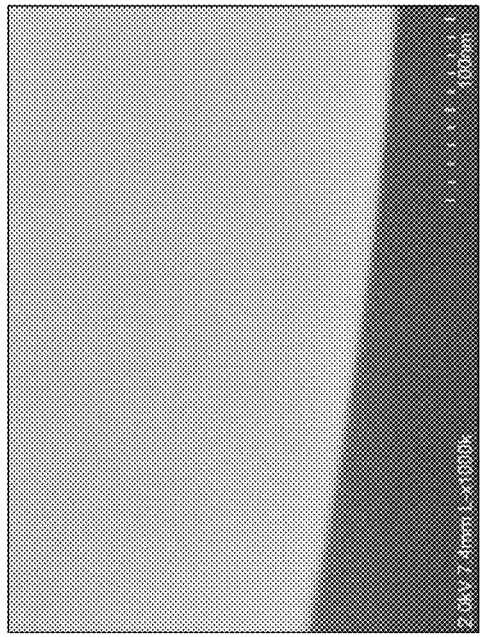

Cross-sectional scanning electron microscope (SEM) images, shown in FIGS. 5A-5D are able to resolve the differences between short and long-order surface roughness. FIGS. 5A-5B show conventional inverse temperature crystallization process PSCs at low magnification (FIG. 5A) and high magnification (FIG. 5B). FIGS. 5C-5D show PSCs prepared in accordance with optimized inverse temperature crystallization processes according to certain aspects of the present disclosure at low magnification (FIG. 5C) and high magnification (FIG. 5D). While both PSCs lack significant short-range roughness, from the above SEM images, long-range roughness appears as a key difference between conventional PSCs and PSCs formed in accordance with certain aspects of the present teachings. From FIG. 5A, it appears that after bulk crystallization, perovskite microcrystals are deposited on top of the original perovskite single crystal (PSC) surface, causing this long-range roughness. The presence of microcrystals on PSCs prepared in accordance with certain aspects of the present disclosure was greatly reduced (FIG. 5C) compared to that in FIG. 5A.

Figure 6A:
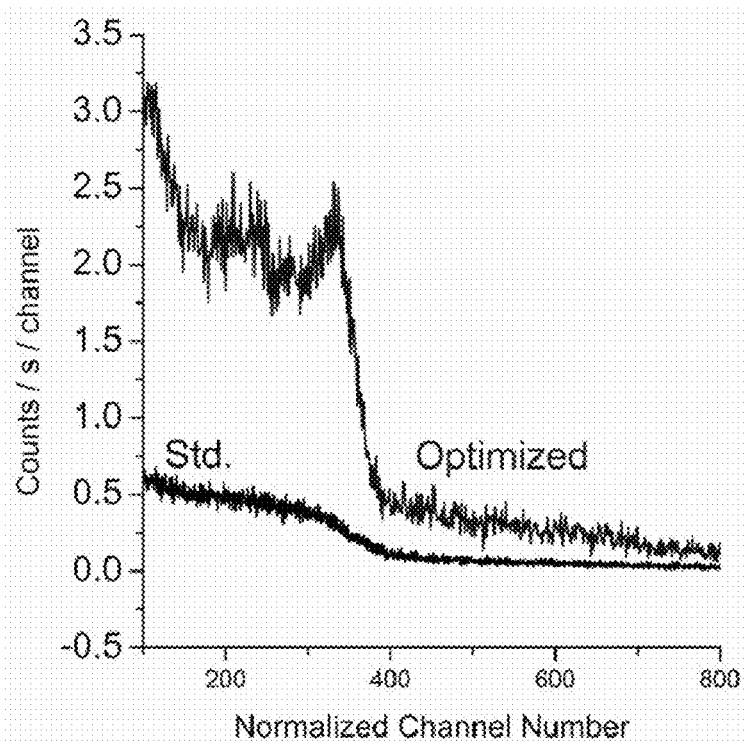
Figure 6B:
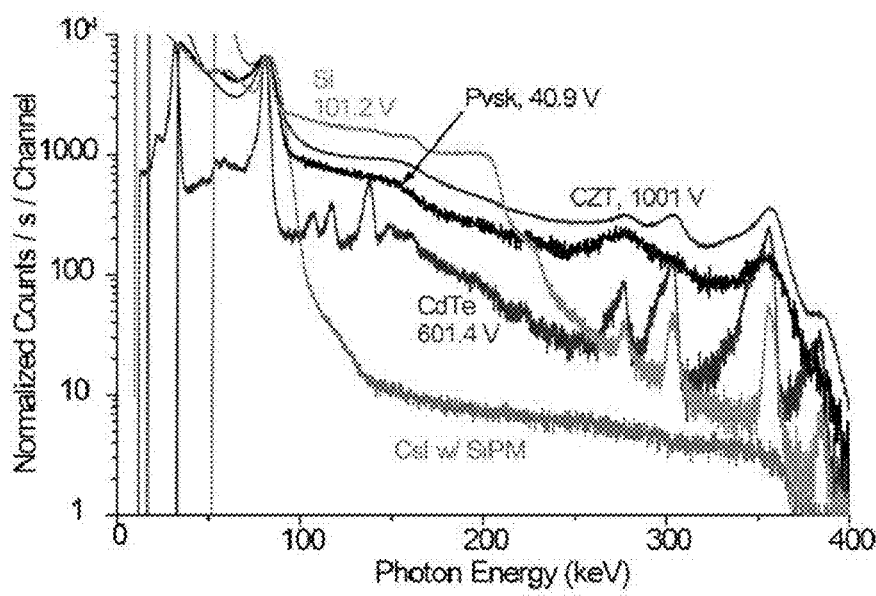
Figure 6C:
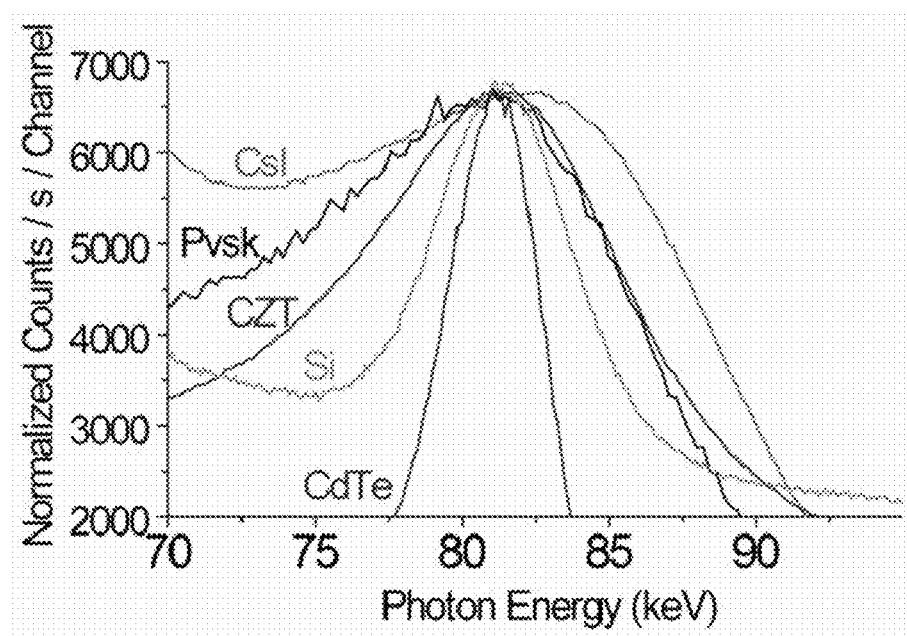

In terms of detection performance, optimization of the PSC crystallization procedure in accordance with certain aspects of the present disclosure results in greatly improved detector resolution and count rate. Certain PSCs formed in accordance with the present disclosure show comparable performance to state-of-the-art commercial semiconductor detectors and exceed the resolution of scintillator/silicon photomultiplier (SiPM) detection systems. The radiation spectra of PSCs formed via conventional inverse temperature crystallization processes versus those formed in the optimized inverse temperature crystallization processes provided by the present disclosure are compared in FIGS. 6A-6C compared to commercially-available semiconductor detectors. FIG. 6A shows a comparison of 133Ba radiation spectra between PSCs formed via a conventional inverse temperature crystallization process versus PSCs formed via an optimized inverse temperature crystallization process in accordance with certain aspects of the present disclosure. A comparison of size-normalized radiation spectra between PSCs "Pvsk" and commercial detection systems, including silicon drift detectors "Si," cadmium zinc telluride "CZT" bare crystals, surface-optimized cadmium telluride "CdTe" detectors, and cesium iodide "CsI" scintillators with SiPM readouts, show the full spectra (FIG. 6B) as well as the spectra focused on the 81 keV $^{133}$Ba gamma ray peak (FIG. 6C).

In another aspect, the present disclosure provides a device that enables controlled growth of perovskite single crystals (PSCs) seed crystals. To grow larger PSCs with flat surfaces, it is desirable to control the growth of the crystals, while also providing axial flow of precursor solution. A controlled crystallization chamber is provided in a reactor vessel for inverse temperature crystallization growth of PSC seed crystals. This system allows for superior automated growth of PSC seed crystals to a controlled geometry.

Figure 7:
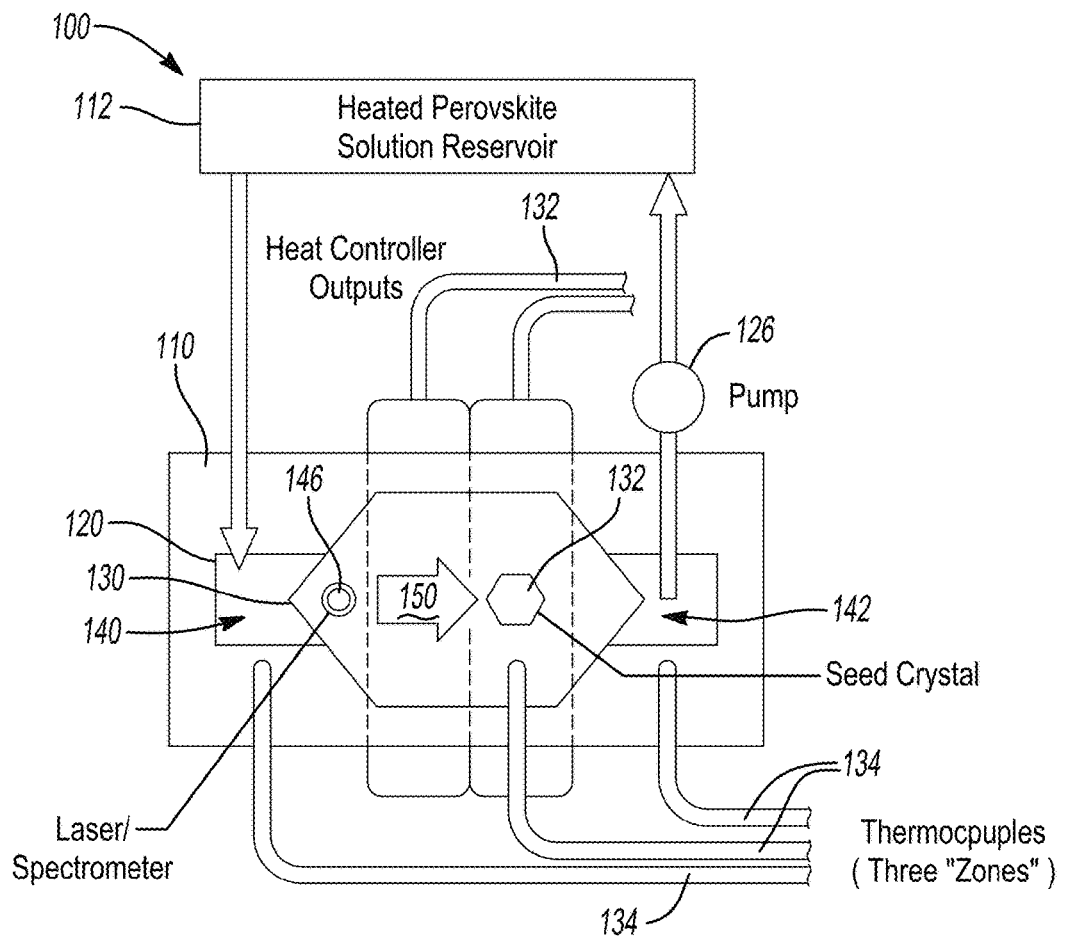
FIG. 7 shows a schematic of a system with a crystallization chamber prepared in accordance with certain aspects of the present disclosure for controlled PSC growth.

A crystallization chamber in the reactor vessel has a size that is reduced to the predetermined geometry of the PSC desired to allow for careful control and improved PSC growth. In this system 100, shown in FIG. 7, a reactor vessel 110 includes a reservoir 112 that contains a perovskite single crystal (PSC) precursor solution. A seed crystal 132 is placed or formed inside a crystallization chamber 130, which is then sealed before a pre-heated PSC precursor solution is pumped through. In alternative variations, the seed crystal 132 may be formed in the crystallization chamber 130. The reservoir 112 is heated by one or more heaters 120. The heater 120 is in communication with a controller (not shown) via one of more heat controller outputs 122. The controller controls the heaters 120 so that a temperature of the precursor solution ensures full solubility of the components therein, which in certain variations, may be greater than or equal to about 60° C. to less than or equal to about 80° C. This precursor solution is pumped via a pump 126 into a crystallization chamber 130 having that is customized to have a shape and size corresponding to the desired PSC shape and dimensions. For example, the crystallization chamber 130 may define a polygonal shape, such as a hexagon. The hexagonal shape provides desirably fluid dynamics of the solution during growth. Generally, it is advantageous to minimize turbulent flow of the precursor solution (and to promote laminar flow) within the chamber. Turbulent flow can promote localized fluctuations in precursor solution temperatures. The chamber size is larger than the desired final size of the crystal.

The precursor solution is thus pumped throughout the crystallization chamber 130 at a rate to ensure axial flow (indicated by arrow 150) across the intended PSC seed crystal 132 in the crystallization chamber 130 and prevent the formation of additional seed crystals. As noted above, the precursor solution is desirably pumped at a flow rate within the predetermined shape of the chamber to minimize turbulent flow. The growth or crystallization chamber 130 is heated by the heaters 120 mounted to the bottom of the chamber 130, with the temperature monitored throughout the crystallization chamber 130 by a plurality of temperature sensors 134 in the form of thermocouples having three distinct zones for the purposes of controlling the crystallization chamber 130. Temperature sensors 134 may be placed near an inlet 140, near the seed crystal 132, and an outflow 142 connection of the chamber 130.

Additionally, the concentration of the precursor solution can be monitored optically, based on its optical absorption. In system 100, an optical monitoring system 146 includes a laser light source and photodiode or a ultraviolet/visible (UV-Vis) spectrometer can be used for optical monitoring of the precursor solution in the crystallization chamber 130. A camera (not shown) can be mounted above the crystallization chamber 130 to monitor the crystal size, which also affects the optimal crystallization conditions. In certain aspects, crystal growth can be video records and analyzed to optimize PSC growth parameters.

The temperature and flow rate of precursor solution in the crystallization chamber 130 will be controlled using inputs from the temperature sensor(s) 134, optical absorption from the optical monitoring system 146, and camera data. A programmable controller (e.g., Arduino, Raspberry Pi) is used, possibly in conjunction with a computing device, to process sensor inputs and determine the optimal growth setpoint values.

Figure 8A:
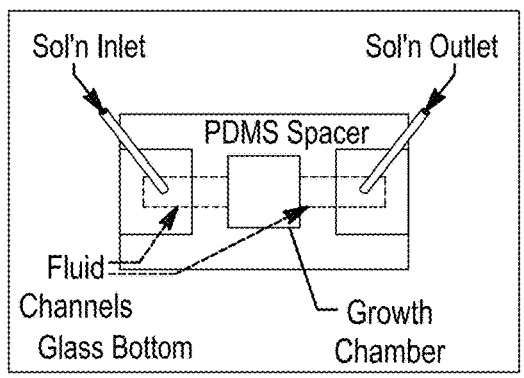
FIGS. 8A-8B show images of a part of a single crystal perovskite material (PSC) growth or crystallization chamber.
Figure 8B:
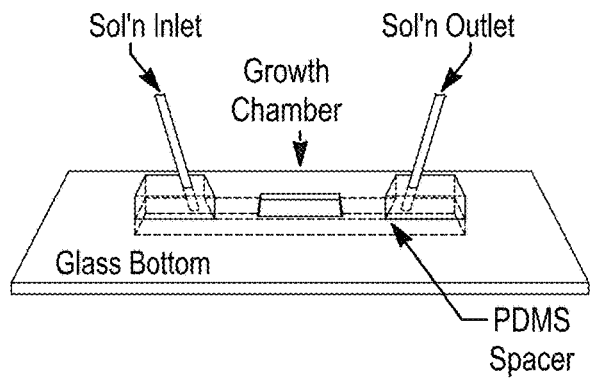

One specific embodiment of the PSC crystallization growth chamber is shown in FIGS. 8A-8B. A polydimethylsiloxane (PDMS) spacer is bonded to a glass slide bottom, below which three-zone heating elements are attached (now shown). Above the PDMS spacer, an additional glass piece (surface-treated to be hydrophobic) is clamped to the top, in order to prevent leakage of the PSC solution. A picture of the glass slide base, PDMS spacer, and inlet/outlet ports are shown in FIGS. 8A-8B. From an inlet, the PSC precursor solution flows through the PDMS fluid channels to the growth or crystallization chamber, in which the PSC seed is to be located, before flowing through another fluid channel to the outlet. Not shown in these images are the cover glass slide, clamp, heating elements, temperature sensors, PSC precursor solution reservoir, peristaltic pump, tubing, and electronic power/control systems.

Accordingly, the present disclosure provides an apparatus for controlled inverse-temperature crystal growth of perovskite single crystals. The apparatus may comprise a sealed growth or crystallization chamber. The sealed growth or crystallization chamber may comprise two parallel plates separated by a spacer to define an internal volume therebetween. As will be appreciated by those of skill in the art, the specific dimensions of the chamber and spacing between the two parallel plates can vary depending on the desired final crystal size. A volume of the crystallization chamber may be generally on the order of greater than or equal to about 1 mL to less than or equal to about 2 mL, by can be greater than or equal to about 10 mL for larger crystals, by way of non-limiting example. An area of the crystallization chamber defined by a major surface of the plate(s) may in certain variations, greater than or equal to about 1 cm$^2$ to less than or equal to about 2 cm$^2$. A height of the spacer may be greater than or equal to about 4 mm to less than or equal to about 6 mm, although larger spacer heights are also contemplated. The parallel plates may be attached to the spacer by pressure, adhesion, or bonding.

The internal volume is in fluid communication with an inlet and an outlet. The apparatus may comprise one or more fluid channels and/or conduits, like tubes, connected to the growth chamber to allow precursor solution to flow in via the inlet and out of the outlet of the growth chamber. A perovskite seed crystal may be placed within or formed within the internal volume between the parallel plates of the crystallization chamber. Fluid inlet and outlet ports connected to the inlet and outlet of the internal volume permit precursor fluid to flow through the growth chamber. A reservoir containing precursor solution is in fluid communication with the internal volume of the growth chamber via at least the inlet port and inlet. A heating mechanism and heater can be used to change and/or control a temperature of the reservoir as well as the precursor solution contained in the reservoir. A pump conveys the precursor solution between the reservoir and growth chamber via one or more fluid conduits.

Further, an optical monitoring device and/or camera can be used to monitor and/or record a size and/or volume of the perovskite crystal as it grows. The optical monitoring device or other apparatus can be used to monitor a concentration of the precursor solution within the growth chamber. Further, an apparatus can be used to monitor a temperature of a precursor solution within the growth or crystallization chamber. Further, the system may include an electronic system comprising analog and/or digital control or feedback elements to control the perovskite crystal growth conditions.

In certain variations, the pump is used to convey precursor solution through the growth chamber allowing axial flow (show at arrow 150 in FIG. 7) of the precursor solution across the perovskite crystal as it grows. If the system includes an electronic control system, the sensor inputs are used to compare a temperature versus concentration region to adjust the temperature of the growth chamber and/or precursor solution within the growth chamber to promote growth of the perovskite crystal, while avoiding additional spontaneous nucleation.

In certain other variations, if the system includes an apparatus to monitor the crystal growth, a PSC size and/or surface area may be measured directly or indirectly or inferred. These measurements are used to further adjust the optimal temperature setpoints.

In another aspect, if the system includes an apparatus to monitor precursor solution concentration, such a concentration is measured either chemically or optically.

In yet another aspect, the pump is used to flow precursor solution through the growth chamber for at least 1 second every 24 hours of growth.

In yet another aspects, the present disclosure provides methods of making a smooth perovskite surface layer over a bulk region comprising a single crystal perovskite material that provides desirable optical, electrical, and electronic properties to the surface region. Generally, the present disclosure contemplates processes for improved surface passivation of solution-grown perovskite single crystals (PSCs) that can form the smooth perovskite containing surface layer.

Surface passivation is an important technique used to prevent chemical degradation of PSCs, which is especially common when hygroscopic organic cations are used in the PSC chemistry. In addition to preventing degradation, surface passivation can reduce or eliminate dangling bonds, which are responsible for increasing surface conductivity and current leakage, as well as causing trap states near the PSC surface which result in poor charge collection and increased output signal variability.

In accordance with certain aspects of the present disclosure, a solution-based surface passivation (SBSP) process can terminate the PSC surface in the bulk region and alter its wettability, thus helping to inhibit or prevent adhesion of any secondary seed crystals that would otherwise be responsible for surface roughness and corresponding reductions in device performance. It was also discovered that after optimizing the PSC crystallization process to reduce surface roughness caused by microcrystals as described above, that by further conducting a solution-based surface passivation over that bulk PSC crystal, when such stable hybrid perovskite materials are incorporated into devices, the device performance exceeds that of even smooth-surfaced "bare" PSCs.

Generally, the process for surface passivation in accordance with certain aspects of the present disclosure comprises adjusting a surface tension/wettability of a surface of the bulk region comprising a single crystal perovskite material (PSC), forming a passivating layer coating thereon, and an optional post-treatment process. Specifically, in certain variations, solution-based surface passivation (SBSP) processes for SBSP of single crystal perovskite (PSC) in the bulk region comprise the following. After PSCs are grown as described previously above and have reached a desired predetermined size, excess precursor solution is drained from the flat-bottomed crystallization dish. In certain variations, the largest constituent crystal of the PSC has a volume of greater than or equal to about 0.02 µL, optionally greater than or equal to about 0.05 µL. The PSCs are removed from the crystallization dish and contacted with a coating solution comprising a passivating medium. The passivating medium may comprise a capping ligand or direct precursor of it. The passivating medium is intended to form ionic bonds with the PSC surface.

In certain aspects, the passivation medium may comprise a functionalized organic compound or monomer with chemical formula $R-G_n$, or a salt thereof that serves as a capping ligand. R may be an organic group, monomer or oligomer group capable of polymerization under conditions that would not significantly degrade the underlying perovskite. Examples of R groups include acrylics, imides, styrenes, alkylenes, like propylene, or derivatives thereof. G is a functional group having a charge equivalent to A, B, or X within the bulk perovskite chemistry, for the purpose of bonding the passivating layer to the underlying perovskite. or a salt thereof that serves as a capping ligand. In certain aspects, the functionalized organic compound, monomer, or salt comprises from at least about 8 to about 150 atoms, where at least two atoms of which are carbon, where n ranges from 1 to 25.

The solvent is capable of dissolving the functionalized organic compound, monomer, or salt thereof. Examples of suitable solvents include isopropanol, dimethylformamide (DMF), dimethyl sulfoxide (DMSO), gamma-butyrolactone (GBL), n-methyl-2-pyrrolidone (NMP), and combinations thereof. In certain variations, the solvent may be isopropanol. In certain aspects, at least one liquid component of the passivating medium is soluble and/or miscible with a solvent in the perovskite precursor solution.

In certain aspects, the functionalized organic compound, monomer, or salt reacts with at least one component of the perovskite precursor solution (that may remain on the surface of the bulk PSC) to form a perovskite compound having a second higher bandgap than a first bandgap in the bulk region comprising a perovskite single crystal material (PSC).

Examples of passivating mediums include octylamine (liquid), a solution comprising an octylammonium iodide in isopropanol (IPA) (under 0.8 M concentration), a solution of 4 (para)-aminobenzoic acid (PABA)/IPA (under 0.8 M), or an amino-silane compound, such as hexamethyldisilazane (HMDS) or a derivative thereof, and any combinations thereof. In certain variations, the contacting may be rinsing or dipping the PSC in the passivating medium. In one variation, a duration for dipping was greater than or equal to about 10 seconds to less than or equal to about 120 seconds (2 minutes).

After contact with the passivating medium, for example, by immersion or rinsing in the passivating medium solution, the PSCs are immersed in and then rinsed in a cleaning solution that may comprise an antisolvent, intended to wash away any remaining unbonded passivating medium molecules, as well as PSC precursor solution, and surface microcrystals. Example of suitable antisolvents include diethyl ether, ethanol, and combinations thereof. In certain aspects, mixing, applying pressurized streams or jets, or mechanical agitation may be used to ensure removal of the passivating medium. The cleaning solution may comprise one or more additional solvents in addition to the antisolvent in certain variations. In one variation, at least one liquid component of the passivating medium is soluble and/or miscible with a solvent in the cleaning solution. In certain variations, the immersion and/or rinsing process may last for up to about 2 minutes.

Following rinsing with an anti-solvent, the materials (PSCs) are dried to form a solid passivating coating that defines a smooth perovskite surface layer. FIG. 9 illustrates such a process. In the process, perovskite single crystals (PSCs) are removed from a crystallization chamber at step (1) and placed into a passivating medium (ligand-containing solution) at (2) for up to 2 minutes, before being transferred to an anti-solvent bath at step (3) for up to 2 minutes. Afterwards, the coated PSCs are rinsed (4) and dried (5) in a moisture-free environment (e.g., bone dry air).

The solution-based surface passivation (SBSP) process surface treatment of the bulk region comprising a perovskite single crystal material (PSC) produces a surface coating on the PSC that may be green and/or yellow. This is confirmed through optical microscopy images in FIGS. 10A-10F. FIGS. 10A-10C are microscopic images having no passivation surface treatment, as where FIGS. 10D-10F show a top surface of bulk region comprising a perovskite single crystal material (PSC) having a smooth perovskite surface layer formed via the solution-based surface passivation (SBSP) process described above. The presence of surface microcrystals is greatly suppressed when the PSCs undergo surface treatment in accordance with the present teachings. The green-colored surface of the crystal is also seen in FIGS. 10D-10F. However, it was surprisingly discovered that instead of a single, continuous film forming over the bulk region comprising a single crystal perovskite material (PSC), the surface of the treated PSC comprises a plurality of small nanocrystals or nano-plates. In certain variations, a thickness of a nanocrystal or nanoplate may be greater than or equal to about 10 nm to less than or equal to about 200 nm, with a lateral dimension being greater than or equal to about 50 nm but less than or equal to about 10 micrometers (μm). In order to characterize this surface, SEM imaging is conducted as shown in FIGS. 11A-11L. FIGS. 11A-11F show untreated PSCs, while FIGS. 11G-11L show PSCs having a passivated surface with a perovskite layer formed via a solution-based surface passivation (SBSP) process.

As seen in FIGS. 11A-11L, the surface properties of untreated and surface-treated PSCs are significantly different. In the case of untreated PSCs, the crystal facets contain a significant surface areas of protrusions (FIGS. 11A-11B), which the side-angle images (FIGS. 11D-11E) suggest is secondary growth of perovskite crystals on top of the original bulk PSC. These features are greatly reduced or absent in surface-treated PSCs. Instead, the treated PSC surface is composed of a layer of micro-platelet structures deposited on top of the PSC facets (FIGS. 11G-11H). Side-angle SEM confirms that this secondary layer, hundreds of nanometers to a couple microns thick, has a different crystal orientation and structure than the underlying PSC. Even the surface protrusion in FIG. 11K has different crystal grains than is observed for the bulk PSC or for secondary-growth perovskite surface microcrystals or the surface micro-platelet layer, suggesting that this is a foreign object extraneous to the crystallization or the surface-treatment process.

To probe the surface micro-platelet layer's composition, Fourier-Transform infrared (FTIR) spectroscopy is performed in both reflection and transmission mode. The peaks of the FTIR can probe the molecular chemistry of the PSC, while the difference between reflection and transmission modes can differentiate whether a certain molecule is evenly distributed in the bulk of the PSC or is predominantly located near the PSC surface. FIGS. 12A-12C compare the FTIR spectra of octylamine with reflection and transmission-mode FTIR measurements collected from surface-treated and untreated PSCs.

As seen in FIGS. 12A-12C, the −2840 $cm^{-1}$ and ~2910 $cm^{-1}$ FTIR absorption peaks for octylamine are clearly seen in the reflection-mode FTIR spectrum of a surface-treated PSC, while being absent in the untreated PSC, showing the presence of octylamine or octylammonium halide in the surface-treated PSC. In FIG. 12C, the characteristic peaks of octylamine are negligible or absent in both the surface-treated and untreated PSCs, suggesting that the octylamine-based ions are incorporated primarily near the surface of the PSC and are not significantly distributed throughout the bulk of the PSC.

To further confirm the composition and purity of the PSC, powder-mode x-ray diffraction (PXRD), using a Rigaku SmartLab instrument, is performed on PSCs crystallized in the same batch, which are then ground into powder. The powder is then placed in the sample holder to measure the PXRD curve, shown in FIG. 13.

The PXRD data of the PSCs very closely matches PXRD data for this material from literature, so close in fact that all peaks from literature are seen (including the small peak around 37°, which is also shown in the reference PXRD plot). The lack of other peaks confirms the high purity of the PSCs. Along with the cross-sectional SEM images shown in FIGS. 11D-11F, 11K, 11L, these measurements confirm that the bulk PSC is monocrystalline. The low-angle baseline PXRD counts are determined to be background counts from the sample holder through a subsequent measurement.

In certain aspects, a stable hybrid perovskite material that includes a bulk region on which a passivation layer of a smooth perovskite is disposed in accordance with certain aspects of the present disclosure can be used in a variety of applications and incorporated into various devices, including for electromagnetic wave and elementary particle detection, such as x-ray and gamma ray radiation detectors, perovskite-based photovoltaic (PV) devices, photodetectors, as well as in various other security, medical, and astronomy applications, by way of non-limiting example.

In certain aspects, a stable hybrid perovskite material prepared in accordance with certain aspects of the present disclosure is incorporated into a detector, as will be described in greater detail below. Untreated PSC performance is measured by placing them in a vacuum chamber and contacting them by placing them on an aluminum base and contacting the top with an Al probe, a strategy referred to as point-contacting. With optimization of the crystallization process, using the flat-bottomed dish and adjusting the precursor solution to maintain the growth regime (for concentration versus temperature described above), detector performance is improved, reaching an energy resolution of under 15% for an 81 keV 133Ba gamma ray (See FIG. 6A-6C).

Despite such a high performance for an untreated PSC using point contacts, the main problem is repeatability, both between PSCs from the same crystallization run and PSCs from different runs. The repeatability was very poor, with the majority of PSCs failing to produce peaks. Initially, this was suspected to be caused by poor electric field uniformity throughout the PSC when tested under bias. The surface roughness of PSCs, inferred visually from how shiny the PSC appeared, was quantified using LEXT, and the morphology of the surface roughness was investigated using side-angle SEM imaging. The SEM imaging confirmed the presence of secondary growth on the PSC surface (see FIGS. 5A-5D).

Two strategies are employed to improve the electric field uniformity throughout the PSC. Surface-treatment as described above greatly reduces the presence of secondary microcrystalline growth, and also significantly improves surface resistivity (reducing leakage current) as well as the long-term stability of the PSC when tested under bias.

The second strategy is to replace the point-contact with an InGa liquid metal eutectic contact. In one variation, a radiation detection device is shown in FIG. 17E that employs this strategy employing stable hybrid perovskite materials prepared in accordance with certain aspects of the present disclosure. The PSC is placed on top of a drop of InGa eutectic (itself placed on top of a stainless steel shim to prevent reaction with the aluminum test chamber) and then a drop of InGa is placed on top of the PSC, which is then contacted to a molybdenum probe tip. For both treated and untreated PSCs, performance improved with using eutectic versus point contacts, but the performance of both contacting strategies is improved when using treated versus untreated PSCs.

Thus, the present disclosure contemplates a device for detection of light or elementary particles or energy conversion. The device may comprise a stable hybrid perovskite material like those described above that comprises a bulk absorber region comprising a single crystal perovskite material having a composition represented by formula $ABX_3$. A is at least one cation, which may have a +1 or +2 charge. A may be boron or boron-containing cation. For example, where the device is a radiation detector that is capable of detecting alpha and beta particles, as well as energetic neutrons (and possibly thermal neutrons), at least one atom with a high neutron absorption cross-section, such as Boron-10, can be incorporated as a large cation ("A"). B is at least one inorganic cation having a +2 or +4 charge, and X is at least one anion having a −1 or −2 charge, wherein the single crystal perovskite material has a first bandgap. As described above, the stable hybrid perovskite material may further comprise a smooth perovskite surface layer having a second bandgap that is greater than the first bandgap and having a smooth surface with a surface roughness of less than or equal to about 20% of an overall thickness of the perovskite surface layer. Energy from at least one of photons or elementary particles is converted into an electron/hole pair in the bulk absorber region. The device also includes a first electrical contact in electrical communication with the stable hybrid perovskite material and a second electrical contact in electrical communication with the stable hybrid perovskite material.

In one aspect, the device further comprises at least one charge transport layer. In one aspect, the charge transport layer comprises an electron selective transport material, a hole selective transport material, or both an electron selective transport material and a hole selective transport material. In one aspect, the device further comprises at least one charge transport barrier layer. In one aspect, the bulk absorber region has a largest constituent crystal volume of greater than or equal to about 0.05 µL. In one aspect, the device is a radiation detector.

FIGS. 14A-14B show a comparison of 133Ba spectra measured using untreated perovskite single crystals (PSCs), while FIGS. 14C-14D ("SC 122") show spectra measured using surface-treated PSCs prepared in accordance with certain aspects of the present disclosure. In FIGS. 14A, 14C, the spectra are measured using point contacts, while in FIGS. 14B, 14D, the spectra are measured using eutectic contacts.

As seen in FIGS. 14A-14D, the detection performance of both the untreated (SC 121) and surface-treated (SC 122) PSCs is improved by changing from a point-contact to an InGa eutectic contact, when testing each crystal under similar bias conditions for both contacting strategies. However, the measured spectrum for the surface-treated crystal detector prepared in accordance with certain aspects of the present disclosure is much more stable over time. For the untreated PSC, the 81 keV 133Ba peak shows noticeable drift even after approximately 600 seconds, and the leakage current steadily increases, to over 80 nA after 7.6 hours, leading to a nearly-complete washout of the spectrum. Peak drifting is indicative of electric field reduction throughout the bulk of the PSC and is usually caused by ion migration within the PSC, suggesting a chemical reaction between the PSC and contact material. While not shown in FIG. 14D, the leakage current from the surface-treated PSC detector remains stable over several hours. Additionally, there is little noticeable shifting of the 81 keV peak after testing the PSC under bias for 10 minutes, further suggesting the improved stability of the surface-treated PSC.

The spectral comparison between surface-treated and untreated PSCs suggests that device performance is improved, but the repeatability of PSC detector performance between different PSCs from different crystallization runs is also of importance to demonstrate the viability of this technology. In order to characterize repeatability, each PSC (either surface-treated or not), is tested at different biases and measurement times. The best spectra from each PSC with the sharpest 81 keV peak (with a specific contacting strategy) is then peak-fitted manually using OriginLab software to find the peak width. The peak width is divided by the peak center position to calculate the resolution. The resolutions of many devices are recorded and sorted by category. FIG. 15 shows the best peak for each PSC detector category.

As seen above in FIG. 15, a surface-treated "octylamine surface terminated" PSC detector with InGa eutectic contacts shows the highest energy resolution of 14.80%, very close to the performance of an untreated, point-contacted PSC, with the radiation detection performance shown in FIG. 17A-D and morphological properties shown in FIGS. 4 and 5.

In order to characterize and quantify the repeatability and consistency of the four categories of PSC detectors, many different PSC detectors from different crystallization batches are compared. The highest 81 keV peak resolution of each was recorded, and used to produce a histogram of energy resolutions for each category. Furthermore, the yield of each category is recorded. It is calculated by comparing the number of PSC detectors in a category that produce a peak versus the total number of PSC detectors tested in that category. The consistency results of the four categories of PSC detectors is shown in FIG. 16.

After measuring 36 different PSC detectors, separating them by category, and analyzing their spectral resolutions, the advantages of using surface-treated PSC detectors prepared in accordance with the present disclosure are demonstrated. One thing to note about yield is that it only factors in tested PSCs. If a PSC, after placement and contacting in the test chamber, has a very high leakage current (over 2-3 nA), it is discarded and no spectrum taken. These PSCs are not factored into the yield, and many untreated PSCs with InGa eutectic contacts exhibit these problems. The actual yield for PSCs in these categories is much lower than the recorded value of 60%. None of the surface-treated PSCs with InGa contacts had to be discarded, and all of them produced spectra.

Other surface treatment chemistries and contact materials are tested for PSC detectors. Alternate solution-based coating methods include direct coating of octylammonium iodide (in IPA), octadecyl trichlorosilane (OTS, in toluene), and 4-aminobenzoic acid (PABA, in IPA) onto perovskite single crystals. For the contact material, graphite paste is also tested. PSCs using these contact materials show spectral improvement over untreated PSCs.

In certain further aspects, the present disclosure provides methods for solution-based surface passivation/modification of solution-grown perovskite single crystals to form a stable hybrid perovskite material. In one variation, a method for surface treatment and coating of a bulk perovskite absorber (BPA), meaning treating a bulk region comprising a perovskite single crystal material (PSC) as described previously above, comprises contacting the BPA with a coating solution, for example, by immersion, dripping, and/or coating with a passivation medium described above. In certain aspects, the method may optionally comprise first pre-conditioning the BPA after inverse-temperature crystallization or growth, prior to the contacting. The pre-conditioning may comprise one or more of the following: at least partial drying of the BPA, optionally fully drying the BPA, initial wetting of the BPA by contacting it (e.g., via immersing, dipping, and/or coating) with a perovskite precursor solution or at least one of the precursor solution's components, and/or gas surface-treatment of the BPA using ozone or a plasma. In certain aspects, the BPA may be dried in a vacuum oven or by exposing it to a supercritical fluid, by way of non-limiting example. One suitable supercritical fluid may comprise carbon dioxide ($CO_2$).

The method may further comprise a post-treatment process of the coated BPA structure. In certain variations, the post-treatment method on the stable hybrid perovskite material that includes a bulk region on which a passivation layer of a smooth perovskite is disposed optionally comprises one or more of the following: partial or full drying of the structure, ultrasonication of the structure in a cleaning solution, and/or curing the structure by applying energy and/or via thermal, chemical, or irradiation methods. In certain aspects, the structure may be dried in a vacuum oven or by exposing it to a supercritical fluid, by way of non-limiting example.

As noted above, a stable hybrid perovskite material that includes a bulk region on which a passivation surface layer of a smooth perovskite formed in accordance with certain aspects of the present disclosure can be used in various devices, including detection or energy conversion devices. In one variation, an apparatus for absorption of energy from energetic photons and/or elementary particles is provided. In such a device, at least a trace amount of this energy is converted into generated electron/hole pairs.

In certain aspects, such a device comprises a stable hybrid perovskite material comprising a bulk absorber region comprising a single crystal perovskite material having a composition represented by formula $ABX_3$, where A is at least one organic cation having a +1 or +2 charge, B is at least one inorganic cation having a +2 or +4 charge, and X is at least one anion having a −1 or −2 charge, wherein the single crystal perovskite material has a first bandgap. The stable hybrid perovskite material further comprises a smooth perovskite surface layer having a second bandgap that is greater than the first bandgap. A first electrical contact in electrical communication with the stable hybrid perovskite material. A second electrical contact in electrical communication with the stable hybrid perovskite material. In certain aspects, the first electrical contact may serve as a first electrode and the second electrical contact may serve as a second electrode having an opposite polarity to the first electrode. The electrical contacts may be formed of an electrically conductive material and in certain variations, may be formed of a liquid, such as eutectic indium/gallium material. The device may further comprise one or more charge transport layers adjacent to one or more sides of the stable hybrid perovskite material.

The charge transport layer(s) may be chosen to facilitate charge injection or transfer at the electrodes. In certain aspects, the charge transport layer is an organic charge transport layer or an inorganic charge transport layer. For example, a first charge transport layer may be disposed between the stable hybrid perovskite material and a negative electrode, which may serve as a hole transport layer (to transport holes between the anode and stable hybrid perovskite material). The device may also include a second charge transport layer disposed between the stable hybrid perovskite material and the positive electrode, which serves as an electron transport layer (to transport electrons between the stable hybrid perovskite material and the cathode). The anode and cathode thus sandwich the assembly include the stable hybrid perovskite material and optional charge transport layers (or charge transport barriers).

In certain variations, the first charge (hole) transport layer may comprise a metal oxide and the second charge (electron) transport layer may comprise an organic material. By way of example, the first charge (hole) transport layer may include a metal oxide material selected from the group consisting of: vanadium oxide ($VO_x$), molybdenum oxide ($MoO_x$), nickel oxide (NiO), tungsten oxide ($WO_x$), and combinations thereof. By way of example, vanadium oxide ($VO_x$) may include vanadium pentoxide ($V_2O_5$), molybdenum oxide ($MoO_x$) may be molybdenum trioxide ($MoO_3$), and tungsten oxide ($WO_x$) may be tungsten trioxide ($WO_3$).

The second charge (electron) transport layer may comprise two layers, for example, a first layer comprising zinc oxide (ZnO) nanoparticles or thin film, or tin oxide ($SnO_2$), zinc tin oxide ($ZnSnO_x$), or zirconium oxide ($ZrO_2$) as a nanoparticle or thin film layer and a second layer or interlayer comprising an organic material, such as polyetherimide (PEI). The ZnO nanoparticles may be over-coated with a thin layer of PEI. In another variation, the second charge (electron) transport layer comprises an organic material comprising indene-$C_{60}$ bisadduct (ICBA), which may thus be a thin organic layer that functions as a highly efficient photogenerated electron transport layer. The ICBA may be adjacent to another organic material of bis-adduct fullerene surfactant ($C_{60}$ surfactant), which can reduce the work function of the certain cathode metals. In certain other variations, the second charge (electron) transport layer may include other organic materials known or to be developed in the art for such applications.

Thus, in certain variations, the device may further comprise one or more of the following elements: an electron selective transport material, a hole selective transport material, a charge transport barrier layer, and the at least two electrically conductive contacts. In certain variations, the device comprises select combination of these or alternatively all of these elements. The bulk region defines a bulk perovskite absorbing material. In certain aspects, the largest constituent crystal of the bulk perovskite absorbing material has a volume of greater than or equal to about 0.02 µL, optionally greater than or equal to about 0.05 µL.

In certain aspects, where the hole selective transport material and/or the charge transport barrier layer are present adjacent to the stable hybrid perovskite material, these materials are deposited in processes such that less than or equal to about 20% of the volume of the underlying stable hybrid perovskite material structure is damaged during the deposition process.

In certain variations, the charge transport barrier layer has a band gap of no greater than about 2 eV greater than that of an underlying layer of the stable hybrid perovskite material and further has a thickness of less than or equal to about 100 nm. In certain variations, the passivation surface layer of a smooth perovskite has a thickness of greater than or equal to about 10 nm.

In other variations, an electron selective transport layer has a conduction band or lowest unoccupied molecular orbital (LUMO) energy level of no greater than about 0.5 eV above and no less than about 1.5 eV below that of an underlying layer. Further, the electron selective transport layer may have a thickness of greater than or equal to about 10 nm to less than or equal to about 5 µm.

In yet other variations, a hole selective transport layer has a conduction band or highest unoccupied molecular orbital (HUMO) energy level of no less than about 0.5 eV above and no greater than about 1.5 eV above that of an underlying layer. Further, the hold selective transport layer may have a thickness of greater than or equal to about 10 nm to less than or equal to about 5 µm.

In certain further variations, the coatings defining the electron selective layer and the hole selective layer share no more than about 60% of their surface area in common. In yet other aspects, the different conductive contacts are not internally connected.

FIGS. 22A-22C show schematics of three different scenarios of devices having two metal electrical contacts serving as electrodes. In FIG. 22A, an untreated bulk single crystal perovskite MAPbI$_3$ having a bandgap (E g) of 1.5 eV is shown in contact with two distinct electrodes designated "M." Holes (h$^+$) flow in both directions, although a majority of holes flow towards the right electrode. Electrons (e) flow towards the opposite left electrode, although some electrons also flow towards the right electrode. Thus, a majority of current flows to the regular electrodes, but some leakage occurs near the electrical contacts on the untreated PSC surface, which reduces current flow and detector performance.

In FIG. 22B, a surface treated heterojunction is shown; however, this device does not have band alignment. Thus, a bulk single crystal perovskite MAPbI$_3$ has a bandgap (E$_g$) of 1.5 eV. The surfaces have a surface layer comprising (OA)$_2$MAPb$_2$I$_7$ having a bandgap E$_g$ of 2.4 eV. The surface layers are shown in contact with two distinct electrodes designated "M." As can be seen, neither the holes (11±) nor the electrons (e–) flow towards the metal electrodes. Thus, all current flow is blocked due to poor band alignment.

In FIG. 22C, another embodiment having a surface treated heterojunction is shown prepared in accordance with certain aspects of the present disclosure; however, this device has band alignment unlike in FIG. 22B. While not limiting to any particular theory, it is believed that the stable hybrid materials prepared in accordance with certain aspects of the present disclosure provide a graded junction, with higher-order R—P perovskite layers below the measured n=2 surface layer. This is believed to provide a smoother transition than the barriers shown in FIG. 22B. A bulk single crystal perovskite MAPbI$_3$ has a bandgap (E$_g$) of 1.5 eV. The surfaces have a surface layer comprising (OA)$_2$MAPb$_2$I$_7$ having a bandgap E$_g$ of 2.4 eV. The surface layers are shown in contact with two distinct electrodes designated "M." As can be seen, holes (h$^+$) flow toward the right electrode. Electrons (e$^-$) flow towards the opposite left electrode. Thus, current flow in the rightward direction is encouraged due to better band alignment. Leakage of current is negated due to the presence of blocking contacts (depicted by the crossed-out arrows).

Examples

Inverse-Temperature Crystallization of PSCs. MAPbI$_3$ perovskite single crystals are formed using inverse-temperature crystallization derived from literature, namely Saidaminov, M. I. et al. "High-quality Bulk Hybrid Perovskite Single Crystals Within Minutes by Inverse Temperature Crystallization," Nature Communications, 6(1), 7586, 1-6 (2015) and Liu, Y. et al., "Two-Inch-Sized Perovskite CH$_3$NH$_3$PbX$_3$(X=Cl, Br, I) Crystals: Growth and Characterization," Advanced Materials, 27 (35), 5176-5183 (2015), the relevant portions of each of which are incorporated herein by reference. A 1.2 M precursor solution containing PbI$_2$ (Fisher Scientific, 99.9985%), MAI (DyeSol, Inc., unknown purity) of slight (<5%) excess, with 1% mol. ratio PbCl$_2$ (Sigma-Aldrich, 99.99%), in GBL (Sigma-Aldrich, >99%) is mixed overnight at 60-75° C. This solution is poured into a flat-bottomed octadecyltrichlorosilane-treated hydrophobic glass dish and the temperature is raised to a pre-crystallization point lying at 80±5° C. After 1-2 hours, the solution temperature is then increased, typically by 5±1° C., to induce nucleation. Once an appropriate number of observed seed PSCs have formed (surface coverage density of 1-2 cm$^{-2}$), the temperature is reduced by 3±1° C. to stop further nucleation. The temperature is then continually adjusted to maintain PSC growth while preventing additional nucleation, with GBL added periodically to maintain the solution level.

After reaching a length of 2-5 mm, PSCs are either removed from the crystallization dish for surface alkylamine treatment or (SAAT)-treatment or kept in the dish. The remaining solution is drained, and the PSCs are left to dry overnight at 85±5° C.

SAAT Post-Treatment of PSCs. After removal from the crystallization dish, PSCs are dried for approximately 5 min on a hotplate set at 82.5±2.5° C. In this example, solvent post-processing of PSCs in octylamine is chosen for the above-detailed experiments due to process compatibility considerations, although other capping ligands are contemplated. First, octylamine is a liquid at the SAAT processing temperature and it is miscible with γ-butyrolactone. Second, the PSC precursor solutes either dissolve completely or form rapidly-diffusing nano-colloidal suspensions in octylamine, minimizing rough precipitate deposition on PSCs as well as preventing the formation of secondary microcrystals compared to other post-treatment solutions investigated, including alkylammonium iodide solutions dissolved in isopropanol and toluene. Finally, the octylamine is a precursor to the surface-coated zone, reacting with the PSC precursor solutes to form a Ruddlesden-Popper hybrid perovskite surface zone.

The dried PSCs are immersed first in octylamine (Sigma-Aldrich, 99%) for 20 seconds then in diethyl ether (Sigma-Aldrich, 99%) for 60 seconds under agitation. Following immersion, the PSCs are further rinsed with diethyl ether. The SAAT-treated PSCs are then left to dry on a hotplate at 82.5±2.5° C. overnight.

Radiation Spectroscopy Measurement: A PSC is contacted on the top and bottom facets either directly with Al probes or using InGa eutectic (Sigma-Aldrich, 99.99%) drops and placed in a vacuum chamber, for example similar to the device configuration shown in FIG. 17E. A 31.55 MBq $^{133}$Ba source is placed 2 cm above the PSC, and the chamber is closed and evacuated. The probes connect to a charge-sensitive amplifier (CSA, ev550 from Kromek, USA, Inc.), itself connected to a pulse-shaping amplifier (PSA, Ortec Model 572A) and DC power supply (ISEG SHQ 224M). The PSA output connected to a multi-channel analyzer (MCA, Ortec EasyMCA), with the measured spectrum as well as measurement conditions being recorded.

Material Characterization: Both powder-mode and single-crystal XRD is performed using a Rigaku SmartLab 150 tool using a Cu K-α source (λ=1.5406 Å) at a bias of 44 kV and current of 40 mA, 5 mm slit width, Bragg-Brentano goniometry, and D/teX Ultra 250 Si detector. Photoluminescence of PSCs is measured using a 325 nm helium-cadmium (He—Cd) source laser and detection system comprising a monochromater (0.5 m SPEX 500 m), photomultiplier tube (Hamamatsu R928), and lock-in amplifier (Stanford Research Systems SR850). The Fourier transform IR (FTIR) response of PSCs is measured using an Agilent uFTIR Microscope (Cary 620) and Bench (Cary 670).

Electric and Optoelectronic Characterization: Current-voltage (I-V) measurements are performed on PSCs by contacting the top and bottom facets with InGa eutectic drops, with probes connected to a Keithley 4200 Semiconductor Analyzer system contacting the drops, applying a sweeping bias and measuring the current. For transient photovoltage (TPV) measurement, a PSC is connected on opposite side facets with InGa drops, contacted to probes feeding into an oscilloscope (Agilent DS07054A). A function generator (HP 3314A) provides a square wave signal to a 660 nm LED and the oscilloscope.

Response to Gamma Ray Impingement

The intrinsic response of the MAPbI$_3$ PSC can be gauged, irrespective of non-uniformities in the surface structure, by point-contacting the solid along one of the smooth surface regions. The resulting gamma-ray spectrum following the impingement by Ba gamma-rays is shown in comparison with spectra derived from the standard semiconductor detectors composed of silicon, cadmium telluride (CdTe) and CZT in FIGS. 17A-17B. The comparison between the MAPbI$_3$ and CZT is the closest, because both are simply contacted without surface passivation, guard-rings, or single-polarity sensing schemes such as using a Frisch Collar or co-planar grid, while the CdTe and Si have heavily engineered surfaces that minimize the surface leakage and utilize Schottky barriers to reduce the bulk leakage current. These crystals are all biased to full depletion and the signal is optimized.

A relatively large MAPbI$_3$ feature near 276 keV (inset in FIG. 17A-focused on the region near the 356 keV photopeak), is due to the confluence of the Ba 276.4 keV gamma ray as well as x-ray escape peaks from lead and iodine. The prominence of the feature is due to the fact that high-energy x-rays can readily escape the mm-scale depth of the PSC, shown in the interaction probability versus depth plot of the inset of FIG. 17D. In contrast to CdTe and CZT which require high bias (>700 V) in order to reveal clear spectral features, PSCs can show strong spectral response at low bias, reflecting the excellent material purity and higher mobility-lifetime (μτ) product of MAPbI$_3$ compared to the cadmium chalcogenide materials.

Modeling of a PSC's spectral response using gamma-ray interaction locations (using Monte-Carlo N-Particle Code (MCNP 6.1)) and subsequent charge transport (from the Shockley-Ramo Theory) agrees with the measured PSC spectrum, especially when x-ray escape is accounted for, as shown in FIG. 17D. However, the slight shifting peak position versus applied bias (FIG. 17C), where the PSC is irradiated and held under bias at each potential for one hour or longer (including 12 hours at 50 V bias), exhibits the spectral degradation due to potential ion motion and space-charge accumulation within the solid under bias and irradiation. Though small, this polarization effect provides motivation to prevent surface diffusion and the subsequent formation of a concentration gradient in the bulk.

Whether un-treated or surface-treated, degradation in the spectral features can occur if a high electric field strength or a reactive contact is utilized. The crystals themselves can be stored in dry air for at least two years without performance degradation, as revealed by un-compromised spectra taken from two-year old untreated PSCs. If the electric field is uniformly low, then stable device performance can be realized; however, if a bias beyond approximately 100 V/mm is applied, then rapid degradation in the leakage current can occur. It is thus desirable to eliminate high electric field gradients through an electrode and guard ring design that maximizes the uniformity of the field throughout the bulk region.

For the sake of evaluating the effect of passivation on the charge-transport properties in the material and to further improve the performance uniformity of the devices, SAAT post-processing and larger-area contacts (using liquid InGa eutectic) are employed. In order to quantify the effects of these strategies on device performance, the responses from 36 PSCs are evaluated. The 36 crystals are derived from six separate batches of precursor solutions for use in seven separate crystallization runs. The details are enumerated in Table 2.

TABLE 2

| Sample # | Spectrum # | Peak Type | Peak Res. (%) |
|---|---|---|---|
| Untreated, Point-Contacted PSCs | | | |
| 1 | 4 | Peak | 81.955 |
| 2 | 6 | Peak | 55.753 |
| 3 | 4 | Edge | 41.983 |
| 4 | 4 | Peak | 34.574 |
| 5 | 2 | Edge | 25.426 |
| 6 | 5 | Edge | 21.608 |
| 7 | 8 | Edge | 18.054 |
| 8 | | No Peak | |
| 9 | | No Peak | |
| 10 | | No Peak | |
| 11 | | No Peak | |
| 12 | | No Peak | |
| 13 | | No Peak | |
| 14 | | No Peak | |
| 15 | | No Peak | |
| 16 | | No Peak | |
| Yield: | 43.75% | Best Res.: | 18.054% |
| | | Avg. Res.: | 39.907% |
| | | Std Dev.: | 20.956% |

TABLE 2-continued

| Sample # | Spectrum # | Peak Type | Peak Res. (%) |
|---|---|---|---|
| SAAT-Treated, Point-Contacted PSCs | | | |
| 17 | 40 | Edge | 78.842 |
| 18 | 11 | Peak | 48.813 |
| 19 | 6 | Edge | 45.892 |
| 20 | 37 | Edge | 37.767 |
| 21 | 8 | Edge | 29.277 |
| 22 | 20 | Edge | 26.932 |
| 23 | | No Peak | |
| 24 | | No Peak | |
| Yield: | 75.00% | Best Res.: | 26.932% |
| | | Avg. Res.: | 44.754% |
| | | Std Dev.: | 17.189% |
| Untreated, Eutectic-Contacted PSCs | | | |
| 25 | 8 | Edge | 58.563% |
| 26 | 4 | Peak | 36.380% |
| 27 | 25 | Peak | 17.758% |
| 28 | | No Peak | |
| 29 | | No Peak | |
| Yield: | 60.00% | Best Res.: | 17.758% |
| | | Avg. Res.: | 37.567% |
| | | Std Dev.: | 16.679% |
| SAAT-Treated, Eutectic-Contacted PSCs | | | |
| 30 | 2 | Edge | 25.852 |
| 31 | 13 | Peak | 21.408 |
| 32 | 52a | Peak | 23.591 |
| 33 | 30 | Peak | 28.034 |
| 34 | 6 | Peak | 23.953 |
| 35 | 4 | Peak | 36.395 |
| 36 | 12 | Peak | 14.796 |
| Yield: | 100.00% | Best Res.: | 14.796% |
| | | Avg. Res.: | 24.861% |
| | | Std Dev.: | 6.092% |
| #of PSCs: | 36 | | |

The crystals, categorized by surface treatment (either untreated or SAAT-treated) and contact type (Al point contact or InGa eutectic contact), are compared according to the best energy resolution peak from each PSC, which is itself dependent on measurement conditions and charge-sensitive/pulse-shaping amplifier (CSA/PSA) settings.

The measured Ba spectrum of the highest-performing PSC in each category is shown in FIG. 18A. The percent yield is calculated as the number of PSCs that produce a visible peak or peak edge divided by the total number of measurable PSCs (with initial leakage current <5 nA) in the category. The distribution of the peak resolution of PSCs is reflected in the error bars of the FIG. 18B box plot—the box edges corresponding to the $15^{th}$ and $75^{th}$ percentiles, with the detector yield for each category being shown on the abscissa. FIG. 18C shows a schematic of gamma ray absorption in PSCs through the photoelectric effect (left) and carrier relaxation to the PSC band edges (right). However, the schematic is not representative of the number of carriers produced per photon absorption event, which number in the thousands depending on the photon energy.

The yield is significantly improved by using the SAAT-treatment (FIG. 18B), especially in combination with an InGa contact, resulting in a 100% yield in this category. While the improvement in the highest energy resolution for each category is minimal (14.80% for SAAT-treated, eutectic-contacted PSCs versus 16.91% for untreated, point-contacted PSCs), SAAT-treatment resulted in a much higher yield (100%), average resolution (24.9%) and repeatability (standard deviation of 6.58%) compared to untreated, point-contacted PSCs (43.8% yield, 39.9% average resolution, and 22.6% standard deviation), as shown in FIG. 18B. Optimization of the crystallization and post-treatment process leads to an increased performance and consistency of PSC detectors, with optical and electronic characterization studies indicating improved carrier lifetimes and reduced surface trapping of SAAT-treated PSCs compared to untreated PSCs.

Material Characterization

To gain insight on why SAAT post-processing substantially improves device performance uniformity bulk and surface material characterization of PSCs is performed using optical and scanning electron microscopy (SEM) (FIGS. 19A-19D), x-ray diffraction (XRD), and Fourier-transform infrared (FTIR) spectroscopy (FIGS. 20A-20D). The bandgap of the bulk PSC and SAAT surface coating is determined through photoluminescence (PL) to be approximately 1.6 eV and 2.4 eV, respectively (FIG. 20D).

The surface regions of the PSCs, in both their morphology and electronic behavior, are markedly impacted by the SAAT post-growth treatment. From a morphological perspective, untreated, as-grown PSCs exhibit secondary growth during drying after the bulk PSC is formed, as evinced by decreasing specular reflection (surface dulling) of the PSC facet within minutes of removal from the growth solution. Compared with the smooth surface for the SAAT-treated PSC (FIG. 19B), the facet-view SEM micrographs of the untreated PSC (FIG. 19A) indicate that a surface secondary growth (SSG) forms from additional nucleation and growth due to the presence of PSC precursor solution on the surface as the high surface-tension solvent evaporated. A cross-sectional SEM micrograph of a cleaved untreated PSC (FIG. 19C) confirms that the SSG includes a central microcrystal surrounded by post-secondary perovskite crystals located within a slight depression of the bulk PSC, as indicated by the dissimilar grain orientations and visible boundary between the bulk and SSG regions. In contrast, untreated PSC regions without the SSG are quite smooth. From the analysis of optical micrographs of untreated PSCs, approximately 10% of the surface area was covered by SSG regions, varying in size but having a characteristic length of approximately 0.1 mm and area of approximately 0.01 $mm^2$.

The surface morphology of PSCs after SAAT post-treatment is drastically different. Most notably, the surface is free of the large-area SSG prevalent on the untreated PSCs. The surface of the treated PSCs also has a different color, suggesting an altered composition at the surface of the crystal. An optical micrograph shows that the surface morphology includes regions of less than about 10 μm in length, which is confirmed by an SEM micrograph, as having a plate-like structure at the surface region. A cross-sectional SEM micrograph (FIG. 19D) of the surface shows that the surface material comprises multiple layers of platelets, with a total thickness of about 2 to about 3 μm.

The powder XRD (PXRD) pattern and single-crystal x-ray diffraction pattern (FIG. 20A) both confirm the monocrystalline nature of the bulk PSCs and show their high purity. The PXRD data contain all the peaks corresponding to the $MAPbI_3$ perovskite structure while lacking common impurity peaks. The monocrystallinity of the bulk PSC is discerned from analysis of the single crystal XRD (SC-XRD) plot, which shows only two tall and narrow (FWHM <0.04°) peaks corresponding to the (110) and (220) lattice planes, confirming the ability of ITC methods to produce mesoscopic single crystals.

However, the coloration, morphology, and crystal planes of the surface region indicate the formation of a different material at the surface. Reflection-mode Fourier-transform IR (FTIR) measurements (FIG. 20C), reveal the different surface chemistry between SAAT-treated and untreated PSCs, with the former showing peaks characteristic of the octylamine precursor at approximately 2840, 2920, and 3020 cm$^{-1}$ that correspond to the —CH$_2$ symmetric, —CH$_2$ asymmetric, and —CH$_3$ symmetric vibrational modes. The absence of these peaks in transmission-mode FTIR showed that the presence of the octylamine-derived material was located primarily at the surface rather than in the bulk of the PSC.

The PL spectra (FIG. 20D) reveal that for the untreated sample, the emission peak of the solid, at 760 nm, resides close to the band-gap of the bulk material (1.55 eV) as expected. However, the surface layer caps the solid from this underlying emission resulting in a photoluminescent emission that peaks at 510 nm, an emission consistent with the formation of a hybrid two-dimensional Ruddlesden-Popper (RP) halide perovskite having a characteristic chemical formula of $(RA)_2(CH_3NH_3)_{n-1}Pb_nI_{3n+1}$, with RA representing the long-chain ammonium cation and n representing the number of interconnected PbI$_4$ layers.

Specifically, the presence of three low-angle single crystal XRD peaks (FIG. 20B) correspond to the (020), (040), and (060) lattice planes of an n=2 RP halide perovskite, with a chemical formula of $(C_8H_{17}NH_3)_2CH_3NH_3Pb_2I_7$. Initial (unrelaxed) modeling of this material's crystal structure, based on the expanded-lattice and RA-substituted model for $(C_4H_9NH_3)_2CH_3NH_3Pb_2I_7$ show these same low-angle powder XRD peaks when simulated using VESTA. The simulated peak positions agree with the single crystal XRD measured peak positions (FIG. 4b) of 2θ=4.75°, 9.44°, and 12.75° for the (020), (040), and (060) lattice planes, respectively, to within one degree, confirming the crystal structure. The measured Bragg's Law (020) lattice plane spacing of 18.65 Å is close to the modeled value, with better agreement for this and the peak positions expected after relaxation of the initial model. A comparison of expected and measured material characterization parameters is shown in Table 3. Expected values for single-crystal XRD peaks are determined by simulating the crystal model (.cif file) in VESTA, using literature data for MAPbI$_3$ peaks.

TABLE 3

| Measurement | Material Property | Expected Value | Measured Value |
|---|---|---|---|
| Photoluminescence (PL) peak | Bulk MAPbI$_3$ Band Gap | 820 nm (E$_g$ = 1.5 eV) | 760 nm (E$_g$ = 1.6 eV) [a] |
| | Surface R-P Band Gap | 570 nm (E$_g$ = 2.2 eV) | 510 nm (E$_g$ = 2.4 eV) |
| Reflection-Mode FTIR peaks | Octylamine —CH2 symm. | 2858 cm$^{-1}$ | 2850.3 cm$^{-1}$ |
| | Octylamine —CH2 asymm. | 2927 cm$^{-1}$ | 2921.6 cm$^{-1}$ |
| | —CH3 symm. | 2958 cm$^{-1}$ | 2949.6 cm$^{-1}$ |
| Single-Crystal XRD | MAPbI$_3$ (200) peaks (2θ) | 19.9731° | 19.94° |
| | | 20.022° | 20.04° |
| | MAPbI$_3$ (400) peaks (2θ) | 40.5876° | 40.58° |
| | | 40.6902°[53] | 40.69° |
| | R-P (n = 2) (020) peak (2θ) | 4.488° [b] | 4.75° |
| | R-P (n = 2) (040) peak (2θ) | 8.983° [b] | 9.44° |
| | R-P (n = 2) (060) peak (2θ) | 13.491°[b] | 12.75° |
| | R-P (n = 2) (020) lattice soaring | 19.67 Å [c] | 18.65 Å |

[a] The measured MAPbI$_3$ PL peak deviates by over 60 nm (0.1 eV) from the expected value due to declining PMT sensitivity in the measurement setup at wavelengths longer than 700 nm;
[b] determined by simulating the octylamine-substituted R-P (n = 2) crystal model (.cif) file derived from the butylamine (n = 2) .cif file[31];
[c] found from expected (020) peak and Bragg's Law.

Electric and Optoelectronic Characterization

Electrical and optoelectronic testing of pre- and post-SAAT PSCs show that post-treatment causes an increased surface resistivity and reduced surface trapping, resulting in reduced leakage current and improved detector performance. Current-voltage (I-V) measurements of InGa-contacted PSCs show the increased bulk resistivity of SAAT-treated PSCs versus untreated PSCs, revealing the impact of the surface layer on the total resistance. The bulk resistivity (measured from the Ohmic-region IV-curves) increases from 463±116 MΩ-cm to 497±199 MΩ-cm with SAAT post-treatment.

Using Mott-Gurney (M-G) analysis (FIGS. 21A-21B), I-V measurements are used to estimate the carrier mobility and bulk trap density of the PSCs. To find the carrier mobility (which is difficult to derive from Hall measurements due to the PSC's small size and rough surface), the M-G power law is fitted to the I-V data in the space charge limited current (SCLC) regime:

$$\mu = \frac{8}{9} \cdot \frac{J}{V_{bias}^2} \cdot \frac{1}{\varepsilon_r \varepsilon_0} \tag{1}$$

where $\varepsilon_r$ and $\varepsilon_0$ are the relative vacuum dielectric constants, respectively. Using εr=26,[3] the mobility is determined to be 39.4 cm$^2$ V$^{-1}$ s$^{-1}$, comparable to literature and values derived from TOF measurements. M-G analysis can also be used to estimate bulk trap density. The reduction in the calculated bulk trap density from untreated to SAAT-treated PSCs (from approximately 1.33×10$^{10}$ cm$^{-3}$ to approximately 2.46×10$^9$ cm$^{-3}$) indicates a reduction in the near-surface trap density in otherwise nearly-identical PSCs.

While M-G analysis reveals the reduction in near-surface trap states causing poor detector resolution, transient photovoltage (TPV) characterization is used to quantify the near-surface carrier lifetime, which is then used to compare the near-surface trap density in the PSC. TPV signals are produced from photogenerated carriers, which decay as these carriers recombine. Due to the high optical absorption of MAPbI$_3$, especially at wavelengths below 800 nm, most photogenerated carriers are located within 1 μm of the perovskite surface. The relation between excess carrier concentration and TPV for an intrinsic material can be derived from semiconductor physics resulting in a single-term or double-term exponential decay for the untreated PSCs or SAAT-treated PSCs, respectively:

$$\Delta n_{UT}(t) = (\Delta n_s|_{t=0}) \cdot e^{-\frac{t}{\tau}} \quad (2)$$

$$\Delta n_{SAAT}(t) = (\Delta n_s|_{t=0}) \cdot e^{-\frac{t}{\tau}} + A \cdot e^{-\frac{t}{\tau_2}} \quad (3)$$

where $\Delta n_s$ is the near-surface MAPbI$_3$ excess carrier concentrations due to photogeneration and tis the carrier lifetime. The second term of the two-term exponential fit in Equation 3 is generic, with a magnitude A and decay constant 22. Upon fitting Equations 2 and 3 to the excess carrier concentration (FIG. 21D) derived from the TPV signals (FIG. 21C) for SAAT-treated and untreated PSCs, the near-surface carrier lifetime of 488.3 µs for the SAAT-treated PSC is significantly higher than the 322.2 µs for the untreated PSC, using a 660 nm LED source (for which the R—P layer is transparent). The second decay constant of $\tau_2$=3.639 ms for the double-term exponential fit for the SAAT-treated PSC is due to the RC time constant of the R—P surface layer itself.

The measured and bulk carrier lifetimes can be used to calculate the surface recombination velocity, assuming it is low:

$$\frac{1}{\tau_{\mathit{eff}}} = \frac{1}{\tau_B} + \frac{2s_r}{d} \quad (4)$$

where $\tau_{\mathit{eff}}$ and $\tau_B$ are the measured and bulk carrier lifetime, respectively, s r is the surface recombination velocity (SRV), and d is the distance between contacts. Reported values for TB are heavily dependent on the measurement technique and PSC quality, ranging from the sub-microsecond range for time-resolved photoluminescence characterization to 2.6 s using TPV-derived techniques. Using the higher value due to similar techniques and PSC surface quality, the SRV for a SAAT-treated PSC is 307 cm s$^{-1}$, less than half that of the untreated PSC's SRV of 620 cm s$^{-1}$, agreeing with SRV values for PSCs and showing the significant improvement of PSC surface transport properties after SAAT post-processing, accounting for the improved performance and reliability of SAAT-treated PSC based radiation detectors compared to those using untreated PSCs.

A surface alkylamine treatment of inverse temperature crystallization-grown perovskite single crystals (PSCs) greatly improves their performance and repeatability in spectroscopic gamma-ray detection. A facile, repeatable, and scalable process is provided in certain embodiments for the solution-based surface alkylamine treatment of solution-grown methylammonium lead halide perovskite single crystals to significantly reduce their surface and overall bulk trap density. The simulations of gamma ray detection by MAPbI$_3$ agree well with measured results, confirming the viability of this material for radiation detection. This surface treatment strategy results in one of the best energy resolutions for 81 keV $^{133}$Ba gamma ray detection by a low-temperature solution-processed PSC.

Furthermore, SAAT post-treatment greatly improves the consistency and repeatability of PSC detectors, thus enabling low-cost, high-resolution PSC-based detection and imaging systems. Additionally, the demonstration of a facile, solution-based fabrication of smooth, high-quality surface coatings of Ruddlesden-Popper hybrid perovskites, a class of 2-D materials, provides stable hybrid perovskite materials with numerous applications, including independently or as bulk MAPbI$_3$-coated 2-D electronic and optoelectronic devices.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A stable hybrid perovskite material structure comprising:
   a bulk region comprising a single crystal perovskite material having a composition represented by formula ABX$_3$, wherein A is at least one organic or metallic cation having a +1 or +2 charge, B is at least one inorganic cation having a +2 or +4 charge, and X is at least one anion having a −1 or −2 charge, wherein the single crystal perovskite material has a first bandgap; and
   a perovskite surface layer having a second bandgap that is greater than the first bandgap and having a surface with a surface roughness of less than or equal to about 20% of an overall thickness of the perovskite surface layer.

2. The stable hybrid perovskite material structure of claim 1, wherein a first thickness of the bulk region is greater than or equal to about 1 mm and has a root mean squared (RMS) surface roughness of less than or equal to about 5 micrometers and a thickness of the perovskite surface layer is greater than or equal to about 1 micrometer and the surface has a root mean squared (RMS) surface roughness that is less than or equal to about 100 nm.

3. The stable hybrid perovskite material structure of claim 1, wherein a thickness of the perovskite surface layer is greater than or equal to about 0.5 micrometers and less than or equal to about 10 micrometers.

4. The stable hybrid perovskite material structure of claim 1, wherein the single crystal perovskite material is represented by a formula ABX$_3$, wherein A is selected from the group consisting of: methylammonium (CH$_3$NH$_3^+$), ethylammonium (C$_2$H$_8$N$^+$), formamidinium (NH$_2$CHNH$_2^+$), and combinations thereof, B comprises lead (II) (Pb$^{2+}$), and X is an anion selected from the group consisting of: chloride (Cl$^-$), iodide (I$^-$), bromine (Br—), and combinations thereof.

5. The stable hybrid perovskite material structure of claim 1, wherein the perovskite surface layer comprises a Ruddlesden-Popper perovskite represented by A$^1{}_k$A$^2{}_{n+1}$B$^1{}_n$X$^1{}_{3n+1}$, where A$^1$ and A$^2$ are each at least one organic cation having a +1 or +2 charge, B$^1$ is at least one inorganic cation having a +2 or +4 charge, and X$^1$ is at least one anion having a −1 or −2 charge, k ranges from greater than or equal to 1 to less than or equal to 2, and n is an integer.

6. The stable hybrid perovskite material structure of claim 1, wherein the single crystal perovskite material comprises methyl ammonium lead iodide (MAPbI$_3$) wherein the first bandgap is about 1.5 eV and the perovskite surface layer comprises octylamine methylammonium lead iodide ((OA)$_2$MAPb$_2$I$_7$), wherein the second bandgap is about 2.4 eV.

7. An inverse temperature crystallization process for forming a single crystal perovskite, the process comprising:

introducing a precursor solution of a single crystal perovskite material having a composition represented by formula $ABX_3$ into a crystallization chamber, wherein the precursor solution comprises a solvent and one or more compounds comprising atoms that form A, B, and X in the single crystal perovskite material, wherein A is at least one organic cation having a +1 or +2 charge, B is at least one inorganic cation having a +2 or +4 charge, and X is at least one anion having a −1 or −2 charge;

heating the precursor solution to a pre-nucleation temperature;

heating the precursor solution to a nucleation temperature that is at least about 2° C. above the pre-nucleation temperature to form a plurality of seed crystals; and growing the single crystal perovskite material by lowering a temperature of the precursor solution to a crystal growth temperature below the nucleation temperature and introducing additional solvent or additional precursor solution into the crystallization chamber during the growing of the single crystal perovskite material, wherein the single crystal perovskite material has a volume of greater than or equal to about 1 $mm^3$.

8. The inverse temperature crystallization process of claim 7, wherein the crystal growth temperature is at least about 2° C. to about 5° C. less than the nucleation temperature.

9. The inverse temperature crystallization process of claim 7, wherein the pre-nucleation temperature may be greater than or equal to about 75° C. to less than or equal to about 90° C. and the precursor solution is held at the pre-nucleation temperature for greater than or equal to about 1 hour to less than or equal to about 5 hours.

10. The inverse temperature crystallization process of claim 7, wherein the nucleation temperature may be greater than or equal to about 2° C. to less than or equal to about 8° C. above the pre-nucleation temperature.

11. The inverse temperature crystallization process of claim 7, wherein the pre-nucleation temperature corresponds to a temperature, a concentration, or both a temperature and a concentration of the precursor solution so that the precursor solution is at or slightly above a saturation point, but below a spontaneous nucleation point.

12. The inverse temperature crystallization process of claim 7, wherein the nucleation temperature corresponds to a temperature, a concentration, or both a temperature and a concentration of the precursor solution so that the precursor solution is at or slightly above a point of onset of spontaneous nucleation.

13. The inverse temperature crystallization process of claim 7, wherein during the growing the single crystal perovskite material, greater than or equal to about 10% by volume of the precursor solution in the crystallization chamber is between (i) a saturation temperature and a spontaneous nucleation temperature, (ii) a saturation concentration and a spontaneous nucleation concentration, or both (i) and (ii).

14. The inverse temperature crystallization process of claim 7, further comprising removing the single crystal perovskite material from the crystallization chamber.

15. The inverse temperature crystallization process of claim 7, further comprising ceasing growth of the single crystal perovskite material by one or more of the following:
(i) removing the single crystal perovskite material from the crystallization chamber;
(ii) removing greater than or equal to about 40% of precursor solution from the crystallization chamber; and
(iii) drying the single crystal perovskite material in the crystallization chamber at a temperature of greater than or equal to about 55° C.

16. A crystallization chamber for an inverse temperature crystallization process to form a single crystal perovskite, the crystallization chamber comprising:

a first plate and a second plate disposed in parallel to one another, wherein the first plate defines an internal surface near which the single crystal perovskite can grow;

a spacer disposed between the first plate and the second plate that defines a sealed internal volume between the first plate and the second plate that contains at least one seed crystal of the single crystal perovskite;

a reservoir containing a precursor solution of the single crystal perovskite having a composition represented by formula $ABX_3$ into a crystallization chamber, wherein the precursor solution comprises a solvent and one or more compounds comprising atoms that form A, B, and X in the single crystal perovskite, wherein A is at least one organic cation having a +1 or +2 charge, B is at least one inorganic cation having a +2 or +4 charge, and X is at least one anion having a −1 or −2 charge;

an inlet in fluid communication with the internal volume configured to receive the precursor solution from the reservoir;

an outlet in fluid communication with the internal volume through which the precursor solution can flow;

a pump configured to pump the precursor solution from the inlet across the seed crystal in the internal volume to the outlet; and at least one heater for heating the precursor solution to a predetermined temperature for growth of the single crystal perovskite material in the internal volume.

17. The crystallization chamber of claim 16, further comprising at least one temperature detector that monitors a temperature of the precursor solution in the internal volume.

18. The crystallization chamber of claim 16, further comprising an optical monitoring device disposed above the internal volume configured to measure a size or a volume of the single crystal perovskite.

19. The crystallization chamber of claim 18, wherein the optical monitoring device comprises a laser and a spectrometer.

20. The crystallization chamber of claim 18, wherein the optical monitoring device comprises a camera.

* * * * *

UNITED STATES PATENT AND TRADEMARK OFFICE
CERTIFICATE OF CORRECTION

| | |
|---|---|
| PATENT NO. | : 11,952,679 B2 |
| APPLICATION NO. | : 17/006298 |
| DATED | : April 9, 2024 |
| INVENTOR(S) | : Suneel Joglekar et al. |

It is certified that error appears in the above-identified patent and that said Letters Patent is hereby corrected as shown below:

In the Claims

At Column 40, Claim number 4, Line number 49, delete "(Pb 2+)," and insert -- $(Pb^{2+})$, --.

Signed and Sealed this
Twelfth Day of November, 2024

Katherine Kelly Vidal
*Director of the United States Patent and Trademark Office*